United States Patent
Chang

(10) Patent No.: US 12,009,351 B2
(45) Date of Patent: Jun. 11, 2024

(54) PLURALITY OF SEMICONDUCTOR DEVICES BETWEEN STACKED SUBSTRATES

(71) Applicant: Advanced Semiconductor Engineering, Inc., Kaohsiung (TW)

(72) Inventor: Wei-Hao Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 186 days.

(21) Appl. No.: 17/525,833

(22) Filed: Nov. 12, 2021

(65) Prior Publication Data

US 2023/0154905 A1     May 18, 2023

(51) Int. Cl.
| | |
|---|---|
| *H01L 25/16* | (2023.01) |
| *H01L 21/78* | (2006.01) |
| *H01L 21/82* | (2006.01) |
| *H01L 23/00* | (2006.01) |
| *H01L 23/498* | (2006.01) |
| *H01L 23/538* | (2006.01) |
| *H01L 25/065* | (2023.01) |

(Continued)

(52) U.S. Cl.
CPC ........... *H01L 25/162* (2013.01); *H01L 21/78* (2013.01); *H01L 21/82* (2013.01); *H01L 23/49822* (2013.01); *H01L 23/49833* (2013.01); *H01L 23/49838* (2013.01); *H01L 23/5386* (2013.01); *H01L 24/12* (2013.01); *H01L 24/15* (2013.01); *H01L 24/97* (2013.01); *H01L 25/0655* (2013.01); *H01L 25/0657* (2013.01); *H01L 25/072* (2013.01); *H01L 25/074* (2013.01); *H01L 25/165* (2013.01); *H01L 21/6836* (2013.01); *H01L 2225/1058* (2013.01); *H01L 2924/181* (2013.01)

(58) Field of Classification Search
CPC . H01L 25/162; H01L 21/82; H01L 23/49822; H01L 23/49833; H01L 23/49838; H01L 23/3107; H01L 25/165; H01L 2924/181; H01L 25/0657; H01L 21/6836; H01L 21/78; H01L 21/56; H01L 25/074; H01L 25/072; H01L 23/3135; H01L 25/0652; H01L 2225/1058; H01L 25/0655; H01L 23/5386; H01L 24/15; H01L 24/12; H01L 24/97
See application file for complete search history.

(56) References Cited

U.S. PATENT DOCUMENTS

| | | | |
|---|---|---|---|
| 7,687,315 B2 * | 3/2010 | Carson | H01L 25/0657 438/126 |
| 7,749,807 B2 * | 7/2010 | Karnezos | H01L 23/4334 257/784 |

(Continued)

*Primary Examiner* — Alonzo Chambliss
(74) *Attorney, Agent, or Firm* — FOLEY & LARDNER LLP

(57) ABSTRACT

A semiconductor device package and a method for manufacturing the semiconductor device package are provided. The semiconductor device package includes a first substrate, a second substrate disposed over the first substrate and having a first surface facing away from the first substrate and a second surface facing the first substrate, a first component disposed on the first surface of the second substrate, a second component disposed on the second surface of the second substrate; and a support member covering the first component.

8 Claims, 55 Drawing Sheets

(51) Int. Cl.
*H01L 25/07* (2006.01)
*H01L 21/683* (2006.01)

(56) References Cited

U.S. PATENT DOCUMENTS

| | | | |
|---|---|---|---|
| 7,977,780 B2 * | 7/2011 | Tay | H01L 25/105 |
| | | | 438/109 |
| 8,198,735 B2 * | 6/2012 | Chow | H01L 23/3128 |
| | | | 257/777 |
| 8,389,329 B2 * | 3/2013 | Cho | H01L 25/105 |
| | | | 438/109 |
| 8,541,872 B2 | 9/2013 | Cho et al. | |
| 9,831,148 B2 * | 11/2017 | Yu | H01L 24/20 |
| 10,388,637 B2 | 8/2019 | Kim et al. | |
| 10,510,674 B2 * | 12/2019 | Lin | H01L 24/73 |
| 10,985,760 B2 * | 4/2021 | Lee | H03K 19/17724 |
| 11,616,046 B2 * | 3/2023 | Lin | H01L 23/5226 |
| | | | 257/774 |
| 2007/0257348 A1 * | 11/2007 | Yang | H01L 25/03 |
| | | | 257/E21.705 |
| 2008/0157325 A1 * | 7/2008 | Chow | H01L 23/3128 |
| | | | 438/109 |
| 2008/0211084 A1 * | 9/2008 | Chow | H01L 25/105 |
| | | | 257/700 |
| 2009/0102037 A1 * | 4/2009 | Kim | H01L 24/24 |
| | | | 438/109 |
| 2009/0166835 A1 * | 7/2009 | Yang | H01L 21/565 |
| | | | 438/109 |
| 2010/0320588 A1 * | 12/2010 | Dahilig | H01L 23/562 |
| | | | 257/E23.101 |
| 2012/0146242 A1 * | 6/2012 | Fujishima | H01L 21/561 |
| | | | 257/E23.06 |
| 2013/0214396 A1 * | 8/2013 | Kim | H01L 25/105 |
| | | | 257/659 |
| 2017/0062383 A1 * | 3/2017 | Yee | H01L 23/3675 |
| 2019/0238134 A1 * | 8/2019 | Lee | H03K 19/1776 |
| 2020/0083172 A1 | 3/2020 | Hsieh et al. | |
| 2020/0402897 A1 * | 12/2020 | Yeh | H01L 23/49816 |

* cited by examiner

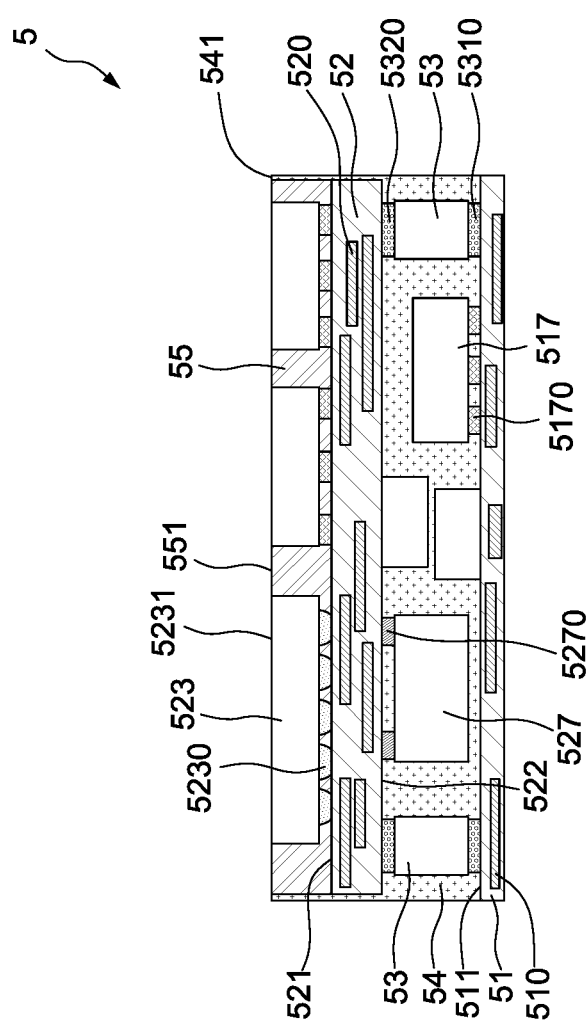

PLURALITY OF SEMICONDUCTOR DEVICES BETWEEN STACKED SUBSTRATES

BACKGROUND

1. Field of the Disclosure

The instant disclosure relates to, amongst other things, a semiconductor device package and method of manufacturing the same.

2. Description of Related Art

In a typical 3D stacking module, an upper module may include a substrate which has a plurality of components mounted on its both sides. Thus, a tape may not be tightly attached to the upper module. Therefore, the upper module cannot be singulated by a tape saw.

SUMMARY

According to one example embodiment of the instant disclosure, an electronic device includes a first substrate, a second substrate disposed over the first substrate and having a first surface facing away from the first substrate and a second surface facing the first substrate, a first component disposed on the first surface of the second substrate, a second component disposed on the second surface of the second substrate; and a support member covering the first component.

According to another example embodiment of the instant disclosure, an electronic device includes a first substrate, a second substrate disposed over the first substrate and having a first surface facing away from the first substrate, a second surface facing the first substrate and a side surface between the first surface and the second surface, a first component disposed on the first surface of the second substrate, a second component disposed on the second surface of the second substrate, a third component disposed on the first substrate and under the second substrate, and a first package body covering the first component and having a lateral surface substantially coplanar with the side surface of the second substrate.

According to another example embodiment of the instant disclosure, an electronic device comprises a first substrate having a first surface, a first component disposed on the first surface of the first substrate, a first package body disposed on the first surface of the first substrate and covering the first component; a second component adjacent to the first substrate and free from being covered by the first substrate and a second package body covering the first package body and the second component.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 5A is a cross-sectional view of a semiconductor device package in accordance with an embodiment of the instant disclosure.

FIG. 7A, FIG. 7B, FIG. 7C, FIG. 7D, FIG. 7E, FIG. 7F, FIG. 7G, FIG. 7H, FIG. 7I, FIG. 7J.

DETAILED DESCRIPTION

Figure 1A:
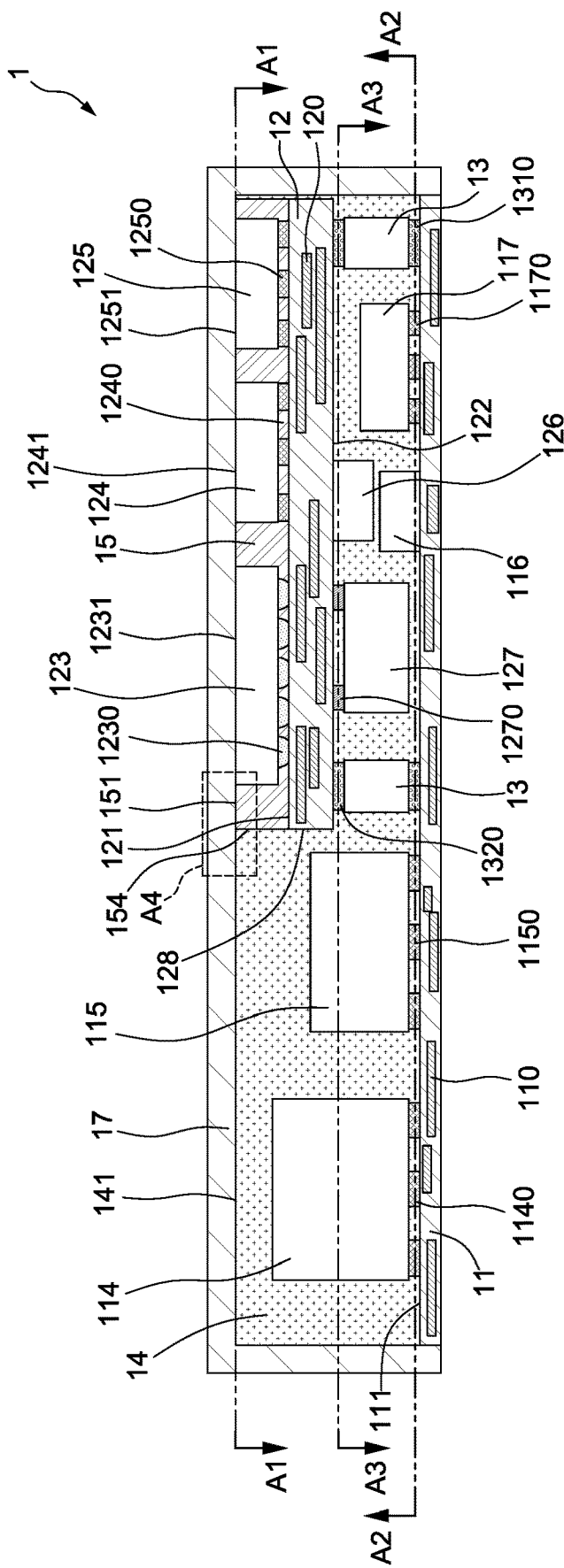
FIG. 1A is a cross-sectional view of a semiconductor device package in accordance with an embodiment of the instant disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package including a main substrate and a sub-substrate which is smaller than the main substrate and disposed over the substrate. A package body is disposed on the sub-substrate and covers the sub-substrate. The package body may have a substantially flat surface facing away from the sub-substrate.

FIG. 1A is a cross-sectional view of a semiconductor device package 1 in accordance with some embodiments of the present disclosure. As shown in FIG. 1A, the semiconductor device package 1 includes a main carrier 11, interposers 13 and a sub-carrier 12. In some embodiments, the main carrier 11 includes a substrate, which may include a redistribution structure 110. Referring to FIG. 1A, the main carrier 11 has a surface 111 (e.g., an upper surface), and the interposers 13 may be disposed on the surface 111 of the main carrier 11. In some embodiments, the sub-carrier 12 includes a substrate, which may include a redistribution structure 120. In some embodiments of the present disclosure, the sub-carrier 12 is a redistribution layer. The sub-carrier 12 is stacked on the interposers 13. The sub-carrier 12 has a surface 121 (e.g., an upper surface) facing away from the surface 111 of the main carrier 11 and a surface 122 (e.g., a lower surface) facing the surface 111 of the main carrier 11. A plurality of electrical connections 1310 configured to electrically connect the interposer 13 and the main carrier 11. In some embodiments of the present disclosure, the electrical connections 1310 are arranged between the interposer 13 and the surface 111 of the main carrier 11. In some embodiments of the present disclosure, the electrical connections 1310 abut the surface 111 of the main carrier 11. In some embodiments of the present disclosure, the electrical connections 1310 may include electrical pads, terminals, contacts and/or ports. Further, a plurality of electrical connections 1320 are configured to electrically connect the interposer 13 and the sub-carrier 12. In some embodiments of the present disclosure, the electrical connections 1320 are arranged between the interposer 13 and the surface 122 of the sub-carrier 12. In some embodiments of the present disclosure, the electrical connections 1320 abut the surface 122 of the sub-carrier 12. In some embodiments of the present disclosure, the electrical connections 1320 may include electrical pads, terminals, contacts and/or ports. Given the above, the sub-carrier 12 may be electrically connected to the main carrier 11 through the interposers 13.

Referring to FIG. 1A, the surface 111 of the main carrier 11 may have a portion, which is covered by the sub-carrier 12, and another portion, which is not covered by the sub-carrier 12. Electronic components 114 and 115 may be disposed or mounted on the portion of the surface 111 of the main carrier, which is not covered by the sub-carrier 12. In some embodiments of the present disclosure, the electronic component 114, 115 is a passive device. In some embodiments of the present disclosure, the electronic component 114, 115 is a ceramic-based device. In some embodiments of the present disclosure, the electronic component 114 is a Power Management IC (PMIC). In some embodiments of the present disclosure, the electronic component 115 is a capacitor. A plurality of electrical connections 1140 are configured to electrically connect the electronic component 114 and the main carrier 11. In some embodiments of the present disclosure, the electrical connections 1140 are arranged between the electronic component 114 and the surface 111 of the main carrier 11. In some embodiments of the present disclosure, the electrical connection 1140 abut the surface 111 of the main carrier 11. In some embodiments of the present disclosure, the electrical connections 1140 may include electrical pads, terminals, contacts and/or ports. A plurality of electrical connections 1150 are configured to electrically connect the electronic component 115 and the main carrier 11. In some embodiments of the present disclosure, the electrical connection 1150 are arranged between the electronic component 115 and the surface 111 of the main carrier 11. In some embodiments of the present disclosure, the electrical connection 1150 abut the surface 111 of the main carrier 11. In some embodiments of the present disclosure, the electrical connections 1150 may include electrical pads, terminals, contacts and/or ports.

Further, electronic components 116 and 117 may be disposed or mounted on the portion of the surface 111 of the main carrier, which is covered by the sub-carrier 12. In some embodiments of the present disclosure, the electronic component 116, 117 is a passive device. In some embodiments of the present disclosure, the electronic component 116, 117 is a ceramic-based device. In some embodiments of the present disclosure, the electronic component 117 is a capacitor. A plurality of electrical connections 1170 are configured to electrically connect the electronic component 117 and the main carrier 11. In some embodiments of the present disclosure, the electrical connection 1170 are arranged between the electronic component 117 and the surface 111 of the main carrier 11. In some embodiments of the present disclosure, the electrical connection 1170 abut the surface 111 of the main carrier 11. In some embodiments of the present disclosure, the electrical connection 1170 may include electrical pads, terminals, contacts and/or ports. In some embodiments of the present disclosure, a thickness of the electronic component 114, 115 is greater than a thickness of the electronic component 116, 117. In some embodiments of the present disclosure, the thickness of the electronic component 114, 115 is greater than a height of the interposer 13.

Electronic components 126 and 127 may be disposed or mounted on the surface 122 of the sub-carrier 12. In some embodiments of the present disclosure, the electronic component 126, 127 is a passive device. In some embodiments of the present disclosure, the electronic component 126, 127 is a ceramic-based device. In some embodiments of the present disclosure, the electronic component 127 is a capacitor. A plurality of electrical connections 1270 are configured to electrically connect the electronic component 127 and the sub-carrier 12. In some embodiments of the present disclosure, the electrical connection 1270 are arranged between the electronic component 127 and the surface 122 of the sub-carrier 12. In some embodiments of the present disclosure, the electrical connection 1270 abut the surface 122 of the sub-carrier 12. In some embodiments of the present disclosure, the electrical connection 1270 may include an electrical pad, terminal, contact and/or port. In some embodiments of the present disclosure, the thickness of the electronic component 114, 115 is greater than a thickness of the electronic component 126, 127.

Referring to FIG. 1A, electronic components 123, 124 and 125 may be disposed or mounted on the surface 121 of the sub-carrier 12. In some embodiments of the present disclosure, the electronic component 123, 124, 125 is an active device. In some embodiments of the present disclosure, the electronic component 123, 124, 125 is a silicon-based device. In some embodiments of the present disclosure, a non-active side of the electronic component 123, 124, 125 faces away from the surface 121 of the sub-carrier 12. A plurality of electrical connections 1230 are configured to electrically connect the electronic component 123 and the sub-carrier 12. In some embodiments of the present disclosure, the electrical connection 1230 are arranged between the electronic component 123 and the surface 121 of the sub-carrier 12. In some embodiments of the present disclosure, the electrical connection 1230 abut the surface 121 of the sub-carrier 12. In some embodiments of the present disclosure, the electrical connections 1230 may include electrical pads, terminals, contacts and/or ports. A plurality of electrical connections 1240 are configured to electrically connect the electronic component 124 and the sub-carrier 12. In some embodiments of the present disclosure, the electrical connection 1240 are arranged between the electronic component 124 and the surface 121 of the sub-carrier 12. In some embodiments of the present disclosure, the electrical connection 1240 abut the surface 121 of the sub-carrier 12. In some embodiments of the present disclosure, the electrical connections 1240 may include electrical pads, terminals, contacts and/or ports. A plurality of electrical connections 1250 are configured to electrically connect the electronic component 125 and the sub-carrier 12. In some embodiments of the present disclosure, the electrical connection 1250 are arranged between the electronic component 125 and the surface 121 of the sub-carrier 12. In some embodiments of the present disclosure, the electrical connection 1250 abut the surface 121 of the sub-carrier 12. In some embodiments of the present disclosure, the electrical connection 1250 may include electrical pads, terminals, contacts and/or ports. In some embodiments of the present disclosure, an amount of the electrical connections 1230, 1240, 1250 is greater than an amount of the electrical connections 1140, 1150. In some embodiments of the present disclosure, the amount of the electrical connections 1230, 1240, 1250 is greater than an amount of the electrical connections 1170. In some embodiments of the present disclosure, the amount of the electrical connections 1230, 1240, 1250 is greater than an amount of the electrical connections 1260, 1270.

Referring to FIG. 1A, an encapsulant 15 (i.e., package body) is disposed on the surface 121 of the sub-carrier 12. The encapsulant 15 may cover the surface 121 of the sub-carrier 12 and the electronic components 123, 124 and 125 disposed on the surface 121 of the sub-carrier 12. The encapsulant 15 may include molding compounds, such as a Novolac-based resin, an epoxy-based resin, a silicone-based resin, or other another suitable encapsulant; fillers such as silicon oxide fillers, may be included in the molding compound. In addition, the encapsulant 15 may include a molding underfill (MUF) or a capillary underfill (CUF). As shown in FIG. 1A, the encapsulant 15 may have a substantially flat surface 151 (e.g., an upper surface) facing away from the surface 121 of the sub-carrier. The electronic component 123 may have a substantially flat surface 1231 (e.g., an upper surface) facing away from the surface 121 of the sub-carrier 12. The electronic component 124 may have a substantially flat surface 1241 (e.g., an upper surface) facing away from the surface 121 of the sub-carrier 12. The electronic component 125 may have a substantially flat surface 1251 (e.g., an upper surface) facing away from the surface 121 of the sub-carrier 12. The surfaces 1231, 1241 and 1251 of the electronic components 123, 124 and 125 are exposed from the surface 151 of the encapsulant 15. In some embodiments of the present disclosure, the surfaces 1231, 1241 and 1251 of the electronic components 123, 124 and 125 are coplanar with the surface 151 of the encapsulant 15. In some embodiments of the present disclosure, the encapsulant 15 includes a lateral surface 154 and the substrate 12 has a side surface 128 between the surface 121 and 122, and the lateral surface 154 is substantially coplanar with the side surface 128.

Further, an encapsulant 14 (i.e., package body) is disposed on the surface 111 of the main carrier 11. The encapsulant 14 may cover the surface 111 of the main carrier 11 and the electronic components 114, 115, 116 and 117 disposed on the surface 111 of the main carrier 11, the interposers 13, the electronic components 126 and 127 disposed on the surface 122 of the sub-carrier 12, the sub-carrier 12 and the encapsulant 15. The encapsulant 14 may include molding compounds, such as a Novolac-based resin, an epoxy-based resin, a silicone-based resin, or other another suitable encapsulant; fillers such as silicon oxide fillers, may be included in the molding compound. In addition, the encapsulant 14 may include a molding underfill (MUF) or a capillary underfill (CUF). The encapsulant 14 may have a substantially flat surface 141 (e.g., an upper surface) facing away from the surface 111 of the main-carrier 11. In some embodiments of the present disclosure, the surface 141 of the encapsulant 14 is substantially coplanar with the surface 151 of the encapsulant 15. In some embodiments of the present disclosure, the surface 141 of the encapsulant 14 is recessed with respect to the surface 151 of the encapsulant 15.

Moreover, a shielding layer 17 covers the main-carrier 11, the sub-carrier 12, the encapsulant 14 and the encapsulant 15.

Figure 1B:
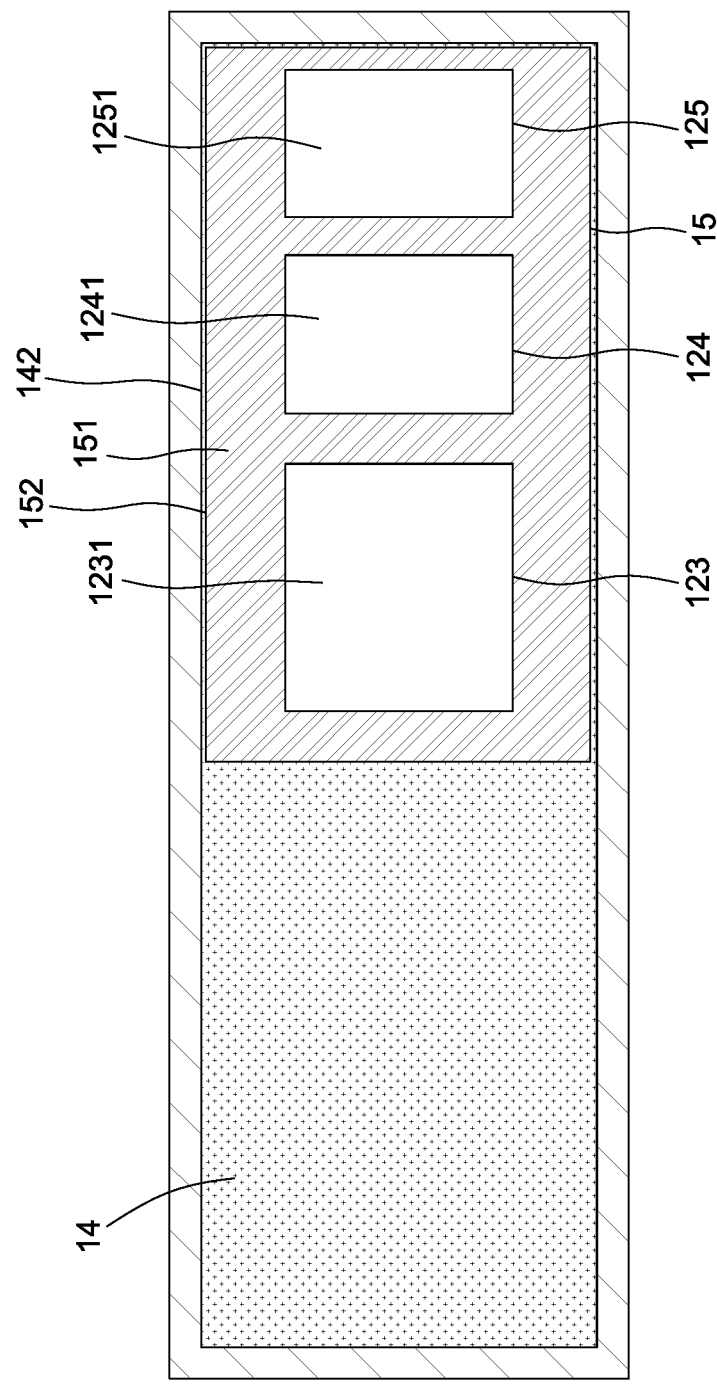
FIG. 1B illustrates a cross-sectional view along line A1-A1 in FIG. 1A.

FIG. 1B illustrates a cross-sectional view along line A1-A1 in FIG. 1A. Referring to FIG. 1B, an area of the encapsulant 14 is greater than an area the encapsulant 15. The surfaces 1231, 1241 and 1251 of the electronic components 123, 124 and 125 may be exposed from the surface 151 of the encapsulant 15. A side surface 142 of the encapsulant 14 does not contact a side surface 152 of the encapsulant 15. That is, the side surface 142 of the encapsulant 14 is spaced apart from the side surface 152 of the encapsulant 15.

Figure 1C:
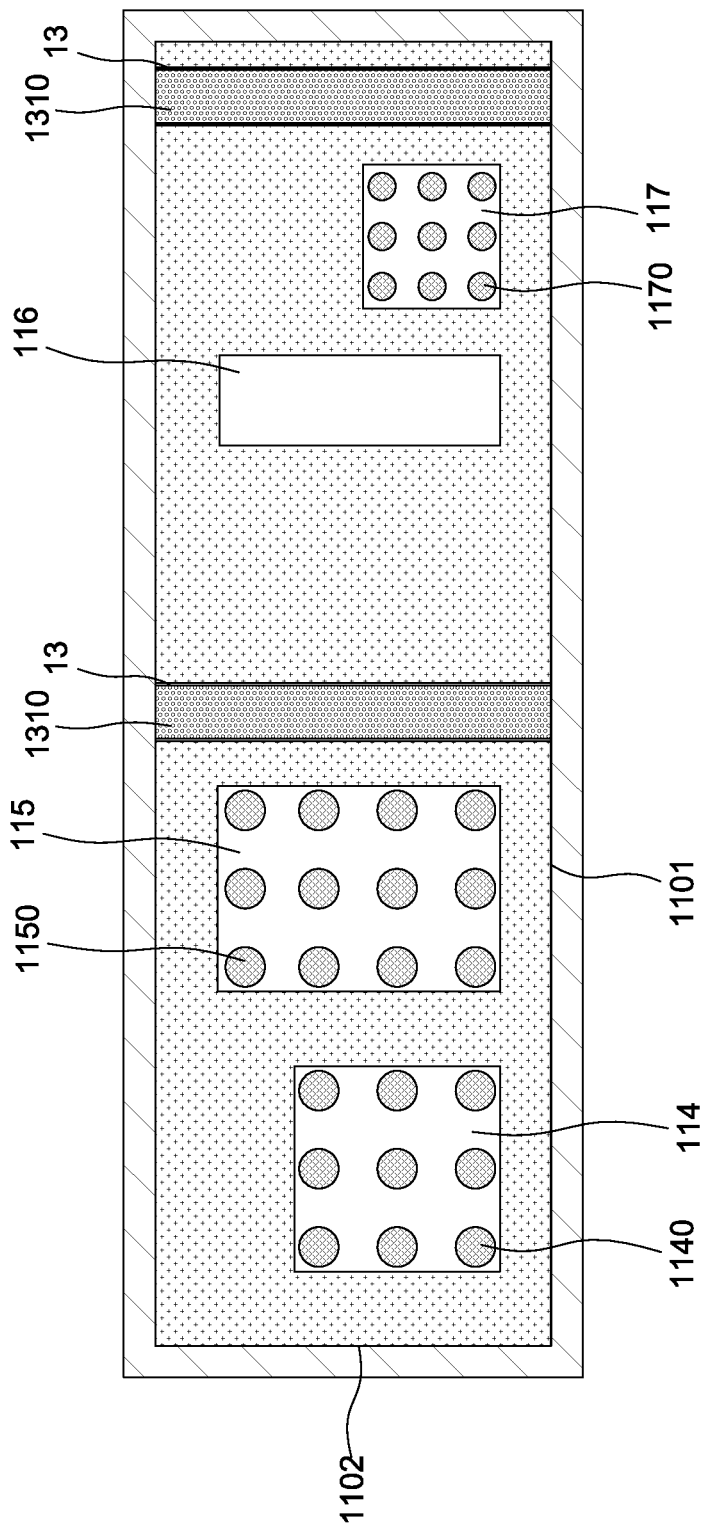
FIG. 1C illustrates a cross-sectional view along line A2-A2 in FIG. 1A.

FIG. 1C illustrates a cross-sectional view along line A2-A2 in FIG. 1A. As shown in FIG. 1C, the main carrier 11 may have a side 1101 and a side 1102 connecting the side 1101. In some embodiments of the present disclosure, a length of the side 1101 is greater than a length of the side 1102. The interposer 13 may extend along a direction which is substantially parallel to the side 1102 of the main carrier 11.

Referring to FIG. 1C, an amount of the electrical connections 1310 may be greater than the amount of the electrical connections 1140, and the amount of the electrical connections 1310 may be greater than the amount of the electrical connections 1150, and the amount of the electrical connections 1310 may be greater than the amount of the electrical connections 1170. Moreover, a density of the electrical connections 1310 under the interposer 13 may be greater than a density of the electrical connections 1140 under the electrical component 114, and the density of the electrical connections 1310 under the interposer 13 may be greater than a density of the electrical connections 1150 under the electrical component 115, and the density of the electrical connections 1310 under the interposer 13 may be greater than a density of the electrical connections 1170 under the electrical component 117. That is, a pitch between the electrical connections 1310 is smaller than a pitch between the electrical connections 1140, a pitch between the electrical connections 1150 and a pitch between the electrical connections 1170. Further, a density of the electrical connections 1310 in an area occupied by the interposer 13 is greater than a density of the electrical connections 1140, 1150 on the portion of the surface 111 of the main carrier 11, which is not covered by the sub-carrier 12 and greater than a density of the electrical connections 1170 on the portion of the surface of the main carrier 11, which is covered by the sub-carrier 12.

Figure 1D:
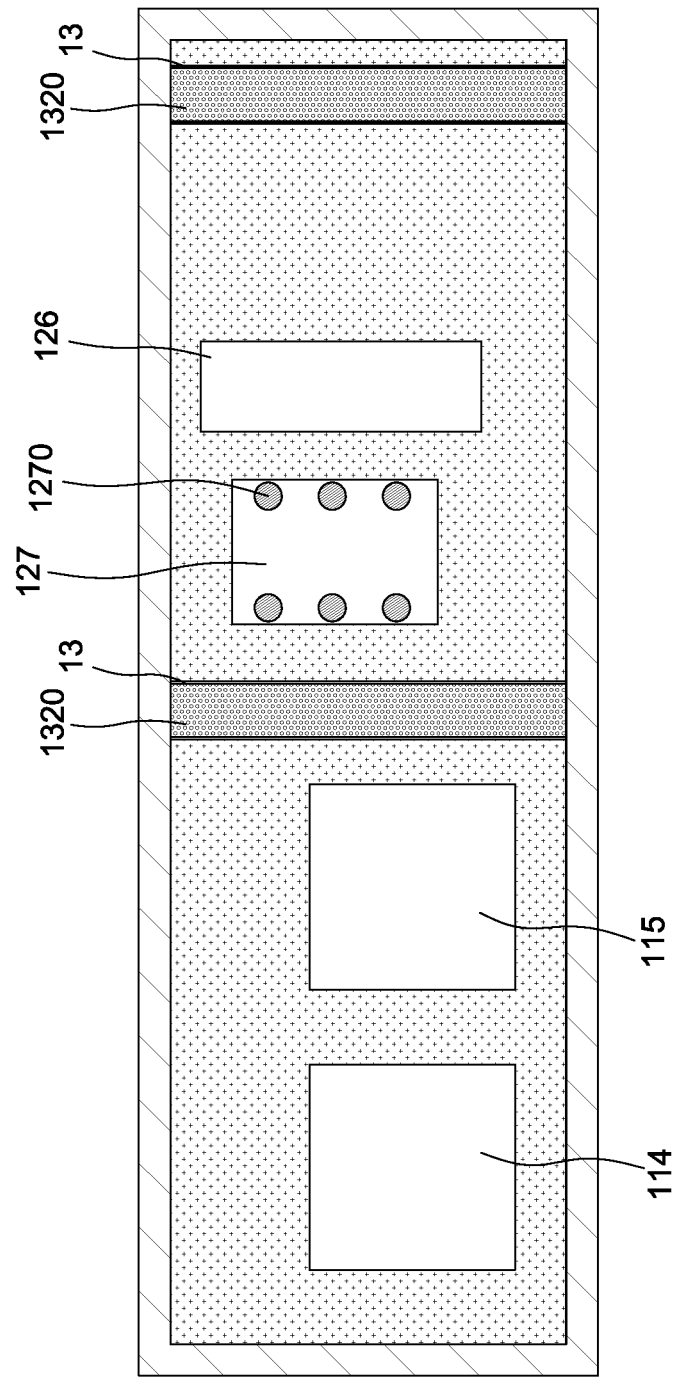
FIG. 1D illustrates a cross-sectional view along line A3-A3 in FIG. 1A.

FIG. 1D illustrates a cross-sectional view along line A3-A3 in FIG. 1A. Referring to FIG. 1D, an amount of the electrical connections 1320 may be greater than the amount of the electrical connections 1270. Moreover, a density of the electrical connections 1320 under the interposer 13 may be greater than a density of the electrical connections 1270 under the electrical component 127. That is, a pitch between the electrical connections 1320 is smaller than a pitch between the electrical connections 1270. Further, a density of the electrical connections 1320 in an area occupied by the interposer 13 is greater than a density of the electrical connections 1270 on the surface 122 of the sub-carrier 12.

Figure 1E:
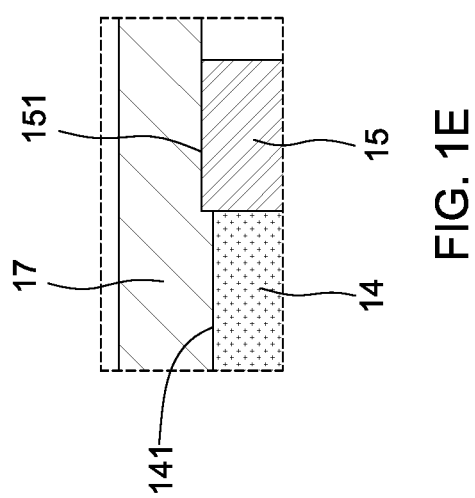
FIG. 1E illustrates an enlarged view of portion A4 in FIG. 1A.

In some embodiments of the present disclosure, the surface 141 of the encapsulant 14 may be recessed with respect to the surface 151 of the encapsulant 15 (referring to FIG. 1E).

Figure 2A:
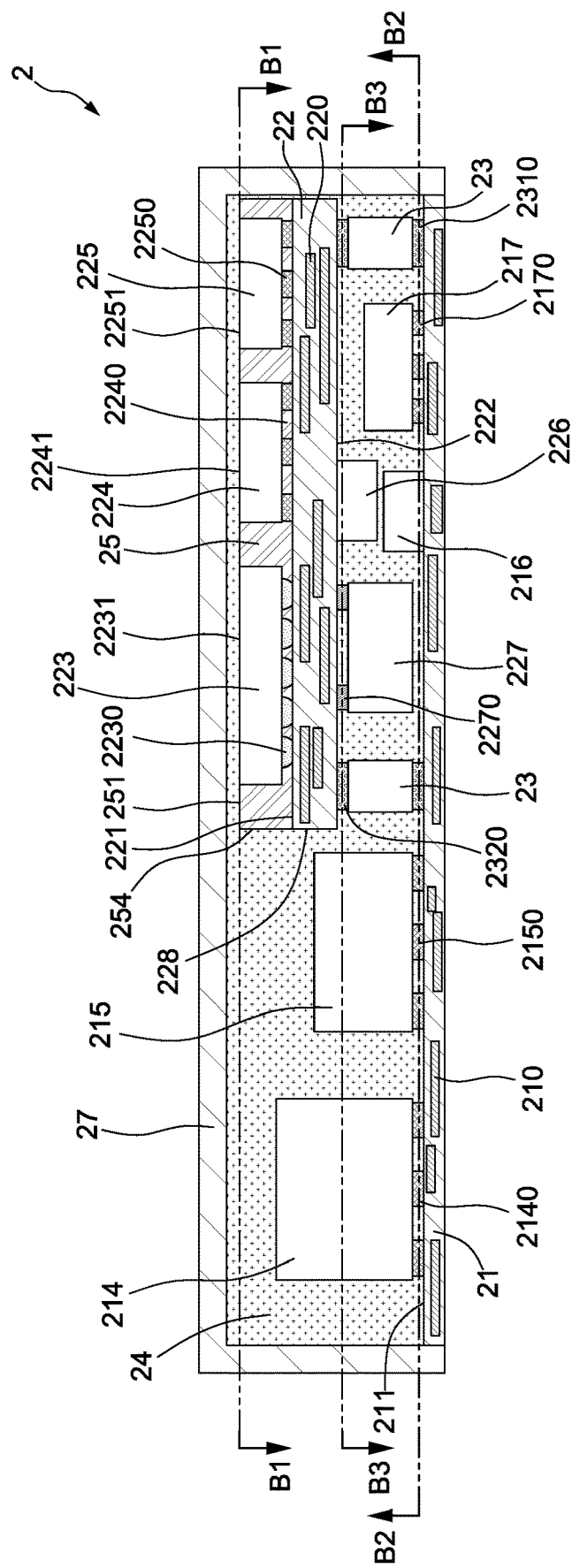
FIG. 2A is a cross-sectional view of a semiconductor device package in accordance with an embodiment of the instant disclosure.

FIG. 2A is a cross-sectional view of a semiconductor device package 2 in accordance with some embodiments of the present disclosure. As shown in FIG. 2A, the semiconductor device package 2 includes a main carrier 21, interposers 23 and a sub-carrier 22. In some embodiments, the main carrier 21 includes a substrate, which may include a redistribution structure 210. Referring to FIG. 2A, the main carrier 21 has a surface 211 (e.g., an upper surface), and the interposers 23 may be disposed on the surface 211 of the main carrier 21. In some embodiments, the sub-carrier 22 includes a substrate, which may include a redistribution structure 220. In some embodiments of the present disclosure, the sub-carrier 22 is a redistribution layer. The sub-carrier 22 is stacked on the interposers 23. The sub-carrier 22 has a surface 221 (e.g., an upper surface) facing away from the surface 211 of the main carrier 21 and a surface 222 (e.g., a lower surface) facing the surface 211 of the main carrier 21. A plurality of electrical connections 2310 configured to electrically connect the interposer 23 and the main carrier 21. In some embodiments of the present disclosure, the electrical connections 2310 are arranged between the interposer 23 and the surface 211 of the main carrier 21. In some embodiments of the present disclosure, the electrical connections 2310 abut the surface 211 of the main carrier 21. In some embodiments of the present disclosure, the electrical connections 2310 may include electrical pads, terminals, contacts and/or ports. Further, a plurality of electrical connections 2320 are configured to electrically connect the interposer 23 and the sub-carrier 22. In some embodiments of the present disclosure, the electrical connections 2320 are arranged between the interposer 23 and the surface 222 of the sub-carrier 22. In some embodiments of the present disclosure, the electrical connections 2320 abut the surface 222 of the sub-carrier 22. In some embodiments of the present disclosure, the electrical connections 2320 may include electrical pads, terminals, contacts and/or ports. Given the above, the sub-carrier 22 may be electrically connected to the main carrier 11 through the interposers 23.

Referring to FIG. 2A, the surface 211 of the main carrier 21 may have a portion, which is covered by the sub-carrier 22, and another portion, which is not covered by the sub-carrier 22. Electronic components 214 and 215 may be disposed or mounted on the portion of the surface 211 of the main carrier, which is not covered by the sub-carrier 22. In some embodiments of the present disclosure, the electronic component 214, 215 is a passive device. In some embodiments of the present disclosure, the electronic component 214, 215 is a ceramic-based device. In some embodiments of the present disclosure, the electronic component 214 is a Power Management IC (PMIC). In some embodiments of the present disclosure, the electronic component 215 is a capacitor. A plurality of electrical connections 2140 are configured to electrically connect the electronic component 214 and the main carrier 21. In some embodiments of the present disclosure, the electrical connections 2140 are arranged between the electronic component 214 and the surface 211 of the main carrier 21. In some embodiments of the present disclosure, the electrical connection 2140 abut the surface 211 of the main carrier 21. In some embodiments of the present disclosure, the electrical connections 2140 may include electrical pads, terminals, contacts and/or ports. A plurality of electrical connections 2150 are configured to electrically connect the electronic component 215 and the main carrier 21. In some embodiments of the present disclosure, the electrical connection 2150 are arranged between the electronic component 215 and the surface 211 of the main carrier 21. In some embodiments of the present disclosure, the electrical connection 2150 abut the surface 211 of the main carrier 21. In some embodiments of the present disclosure, the electrical connections 2150 may include electrical pads, terminals, contacts and/or ports.

Further, electronic components 216 and 217 may be disposed or mounted on the portion of the surface 211 of the main carrier, which is covered by the sub-carrier 22. In some embodiments of the present disclosure, the electronic component 216, 217 is a passive device. In some embodiments of the present disclosure, the electronic component 216, 217 is a ceramic-based device. In some embodiments of the present disclosure, the electronic component 217 is a capacitor. A plurality of electrical connections 2170 are configured to electrically connect the electronic component 217 and the main carrier 21. In some embodiments of the present disclosure, the electrical connection 2170 are arranged between the electronic component 217 and the surface 211 of the main carrier 21. In some embodiments of the present disclosure, the electrical connection 2170 abut the surface 211 of the main carrier 21. In some embodiments of the present disclosure, the electrical connection 2170 may include electrical pads, terminals, contacts and/or ports. In some embodiments of the present disclosure, a thickness of the electronic component 214, 215 is greater than a thickness of the electronic component 216, 217. In some embodiments of the present disclosure, the thickness of the electronic component 214, 215 is greater than a height of the interposer 23.

Electronic components 226 and 227 may be disposed or mounted on the surface 222 of the sub-carrier 22. In some embodiments of the present disclosure, the electronic component 226, 227 is a passive device. In some embodiments of the present disclosure, the electronic component 226, 227 is a ceramic-based device. In some embodiments of the present disclosure, the electronic component 227 is a capacitor. A plurality of electrical connections 2270 are configured to electrically connect the electronic component 227 and the sub-carrier 22. In some embodiments of the present disclosure, the electrical connection 2270 are arranged between the electronic component 127 and the surface 222 of the sub-carrier 22. In some embodiments of the present disclosure, the electrical connection 2270 abut the surface 222 of the sub-carrier 22. In some embodiments of the present disclosure, the electrical connection 2270 may include an electrical pad, terminal, contact and/or port. In some embodiments of the present disclosure, the thickness of the electronic component 214, 215 is greater than a thickness of the electronic component 226, 227.

Referring to FIG. 2A, electronic components 223, 224 and 225 may be disposed or mounted on the surface 221 of the sub-carrier 22. In some embodiments of the present disclosure, the electronic component 223, 224, 225 is an active device. In some embodiments of the present disclosure, the electronic component 223, 224, 225 is a silicon-based device. In some embodiments of the present disclosure, a non-active side of the electronic component 223, 224, 225 faces away from the surface 221 of the sub-carrier 22. A plurality of electrical connections 2230 are configured to electrically connect the electronic component 223 and the sub-carrier 22. In some embodiments of the present disclosure, the electrical connection 2230 are arranged between the electronic component 223 and the surface 221 of the sub-carrier 22. In some embodiments of the present disclosure, the electrical connection 2230 abut the surface 221 of the sub-carrier 22. In some embodiments of the present disclosure, the electrical connections 2230 may include electrical pads, terminals, contacts and/or ports. A plurality of electrical connections 2240 are configured to electrically connect the electronic component 224 and the sub-carrier 22. In some embodiments of the present disclosure, the electrical connection 2240 are arranged between the electronic component 224 and the surface 221 of the sub-carrier 22. In some embodiments of the present disclosure, the electrical connection 2240 abut the surface 221 of the sub-carrier 22. In some embodiments of the present disclosure, the electrical connections 2240 may include electrical pads, terminals, contacts and/or ports. A plurality of electrical connections 2250 are configured to electrically connect the electronic component 225 and the sub-carrier 22. In some embodiments of the present disclosure, the electrical connection 2250 are arranged between the electronic component 225 and the surface 221 of the sub-carrier 22. In some embodiments of the present disclosure, the electrical connection 2250 abut the surface 221 of the sub-carrier 22. In some embodiments of the present disclosure, the electrical connection 2250 may include electrical pads, terminals, contacts and/or ports. In some embodiments of the present disclosure, an amount of the electrical connections 2230, 2240, 2250 is greater than an amount of the electrical connections 2140, 2150. In some embodiments of the present disclosure, the amount of the electrical connections 2230, 2240, 2250 is greater than an amount of the electrical connections 2170. In some embodiments of the present disclosure, the amount of the electrical connections 2230, 2240, 2250 is greater than an amount of the electrical connections 2270.

Referring to FIG. 2A, an encapsulant 25 (i.e., package body) is disposed on the surface 221 of the sub-carrier 22. The encapsulant 25 may cover the surface 221 of the sub-carrier 22 and the electronic components 223, 224 and 225 disposed on the surface 221 of the sub-carrier 22. The encapsulant 25 may include molding compounds, such as a Novolac-based resin, an epoxy-based resin, a silicone-based resin, or other another suitable encapsulant; fillers such as silicon oxide fillers, may be included in the molding compound. In addition, the encapsulant 25 may include a molding underfill (MUF) or a capillary underfill (CUF). As shown in FIG. 2A, the encapsulant 25 may have a substantially flat surface 251 (e.g., an upper surface) facing away from the surface 221 of the sub-carrier 22. The electronic component 223 may have a substantially flat surface 2231 (e.g., an upper surface) facing away from the surface 221 of the sub-carrier 22. The electronic component 224 may have a substantially flat surface 2241 (e.g., an upper surface) facing away from the surface 221 of the sub-carrier 22. The electronic component 225 may have a substantially flat surface 2251 (e.g., an upper surface) facing away from the surface 221 of the sub-carrier 22. The surfaces 2231, 2241 and 2251 of the electronic components 223, 224 and 225 are exposed from the surface 251 of the encapsulant 25. In some embodiments of the present disclosure, the surfaces 2231, 2241 and 2251 of the electronic components 223, 224 and 225 are coplanar with the surface 251 of the encapsulant 25. In some embodiments of the present disclosure, the encapsulant 25 includes a lateral surface 254 and the substrate 22 has a side surface 228 between the surface 221 and 222, and the lateral surface 254 is substantially coplanar with the side surface 228.

Further, an encapsulant 24 (i.e., package body) is disposed on the surface 211 of the main carrier 21. The encapsulant 14 may cover the surface 211 of the main carrier 21 and the electronic components 214, 215, 216 and 217 disposed on the surface 211 of the main carrier 21, the interposers 23, the electronic components 226 and 227 disposed on the surface 222 of the sub-carrier 22, the sub-carrier 12 and the encapsulant 25. The encapsulant 24 may include molding compounds, such as a Novolac-based resin, an epoxy-based resin, a silicone-based resin, or other another suitable encapsulant; fillers such as silicon oxide fillers, may be included in the molding compound. In addition, the encapsulant 24 may include a molding underfill (MUF) or a capillary underfill (CUF). Referring to FIG. 2A, the surface 151 of the encapsulant 15 is covered by the encapsulant 14.

Moreover, a shielding layer 27 covers the main-carrier 21, the sub-carrier 22, the encapsulant 24 and the encapsulant 25.

Figure 2B:
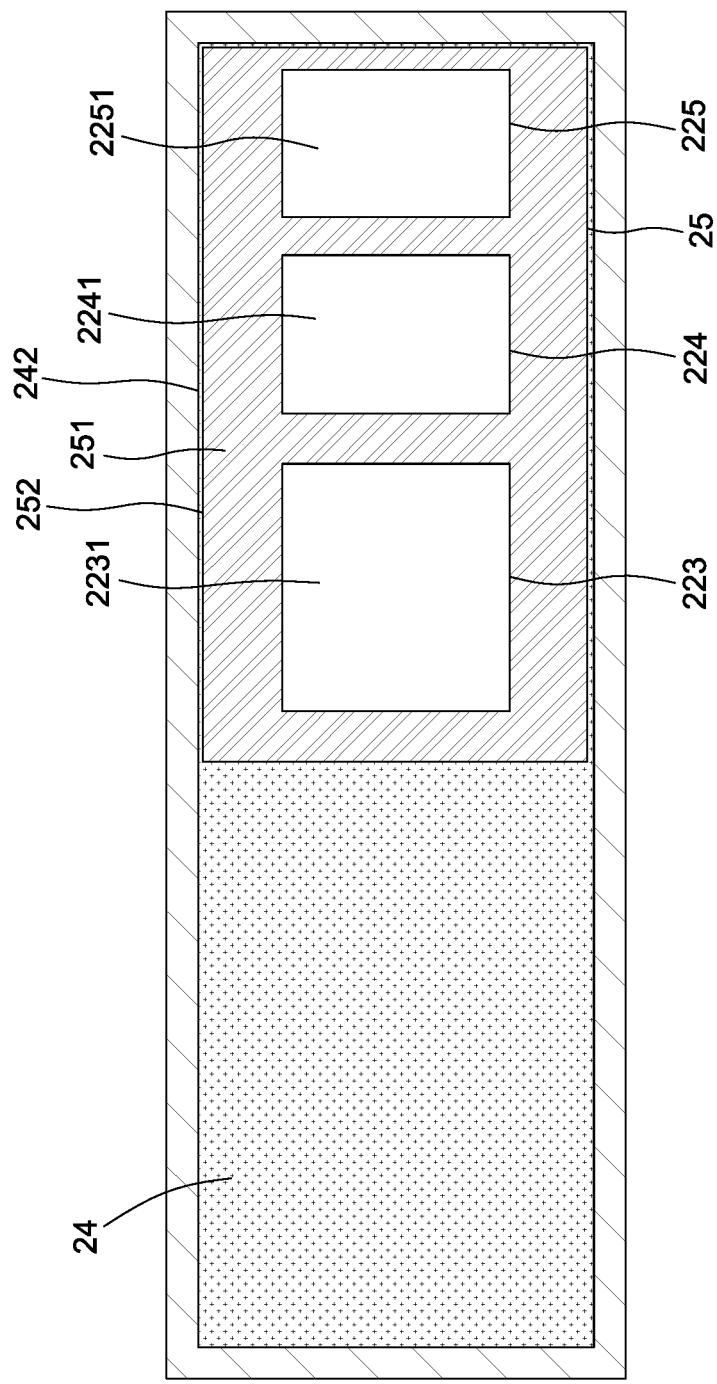
FIG. 2B illustrates a cross-sectional view along line B1-B1 in FIG. 2A.

FIG. 2B illustrates a cross-sectional view along line B1-B1 in FIG. 2A. Referring to FIG. 2B, an area of the encapsulant 24 is greater than an area the encapsulant 25. The surfaces 2231, 2241 and 2251 of the electronic components 223, 224 and 225 may be exposed from the surface 251 of the encapsulant 25. A side surface 242 of the encapsulant 24 does not contact a side surface 252 of the encapsulant 25. That is, the side surface 242 of the encapsulant 24 is spaced apart from the side surface 252 of the encapsulant 25.

Figure 2C:
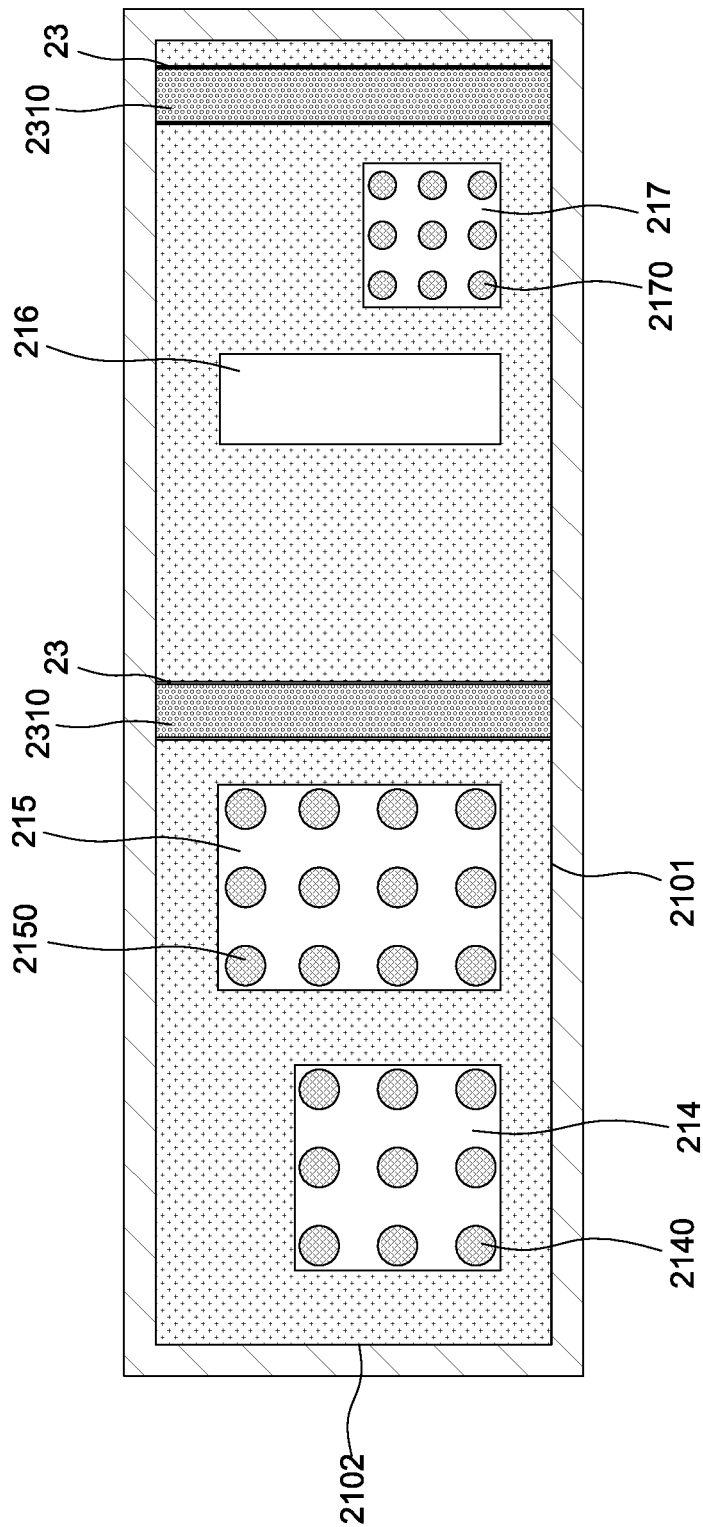
FIG. 2C illustrates a cross-sectional view along line B2-B2 in FIG. 2A.

FIG. 2C illustrates a cross-sectional view along line B2-B2 in FIG. 2A. As shown in FIG. 2C, the main carrier 21 may have a side 2101 and a side 2102 connecting the side 2101. In some embodiments of the present disclosure, a length of the side 2101 is greater than a length of the side 2102. The interposer 23 may extend along a direction which is substantially parallel to the side 2102 of the main carrier 21.

Referring to FIG. 2C, an amount of the electrical connections 2310 may be greater than the amount of the electrical connections 2140, and the amount of the electrical connections 2310 may be greater than the amount of the electrical connections 2150, and the amount of the electrical connections 2310 may be greater than the amount of the electrical connections 2170. Moreover, a density of the electrical connections 2310 under the interposer 23 may be greater than a density of the electrical connections 2140 under the electrical component 214, and the density of the electrical connections 2310 under the interposer 23 may be greater than a density of the electrical connections 2150 under the electrical component 215, and the density of the electrical connections 2310 under the interposer 23 may be greater than a density of the electrical connections 2170 under the electrical component 217. That is, a pitch between the electrical connections 2310 is smaller than a pitch between the electrical connections 2140, a pitch between the electrical connections 2150 and a pitch between the electrical connections 2170. Further, a density of the electrical connections 2310 in an area occupied by the interposer 23 is greater than a density of the electrical connections 2140, 2150 on the portion of the surface 211 of the main carrier 21, which is not covered by the sub-carrier 22 and greater than a density of the electrical connections 2170 on the portion of the surface of the main carrier 21, which is covered by the sub-carrier 22.

Figure 2D:
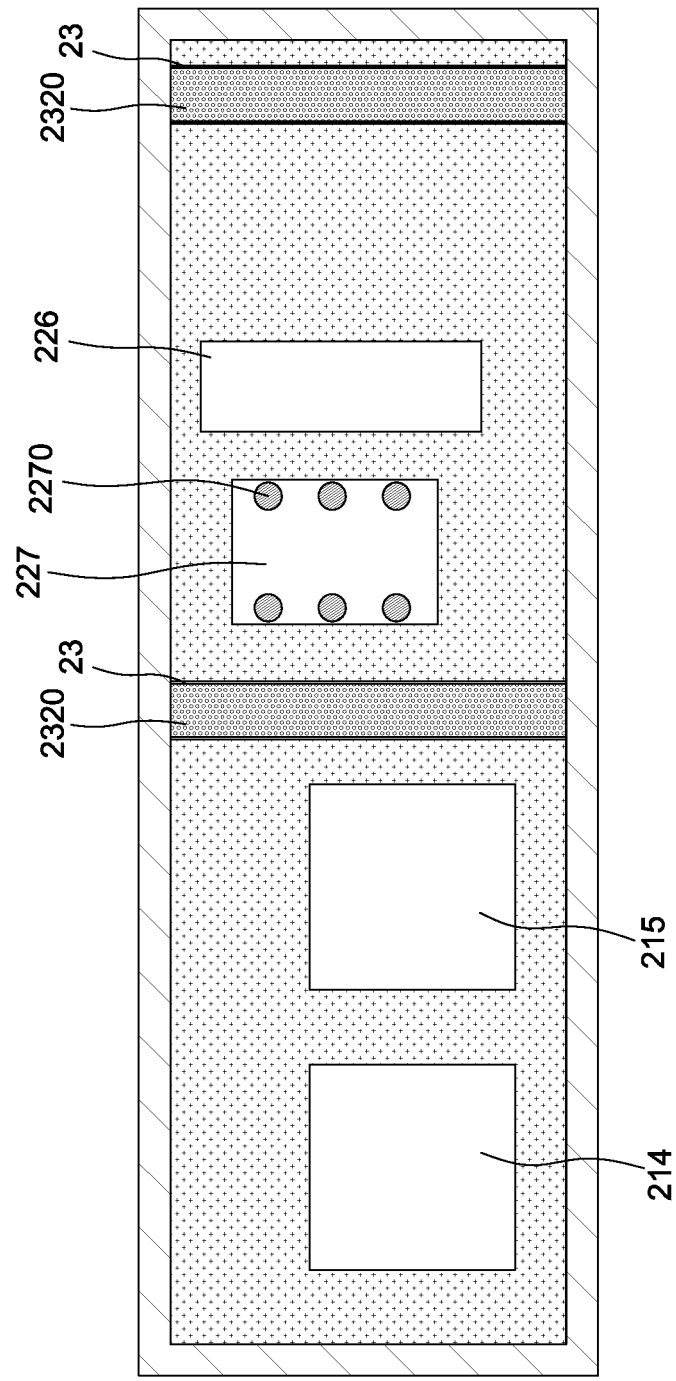
FIG. 2D illustrates a cross-sectional view along line B3-B3 in FIG. 2A.

FIG. 2D illustrates a cross-sectional view along line B3-B3 in FIG. 2A. Referring to FIG. 2D, an amount of the electrical connections 2320 may be greater than the amount of the electrical connections 2270. Moreover, a density of the electrical connections 2320 under the interposer 23 may be greater than a density of the electrical connections 2270 under the electrical component 227. That is, a pitch between the electrical connections 2320 is smaller than a pitch between the electrical connections 2270. Further, a density of the electrical connections 2320 in an area occupied by the interposer 23 is greater than a density of the electrical connections 2270 on the surface 222 of the sub-carrier 22.

Figure 3A:
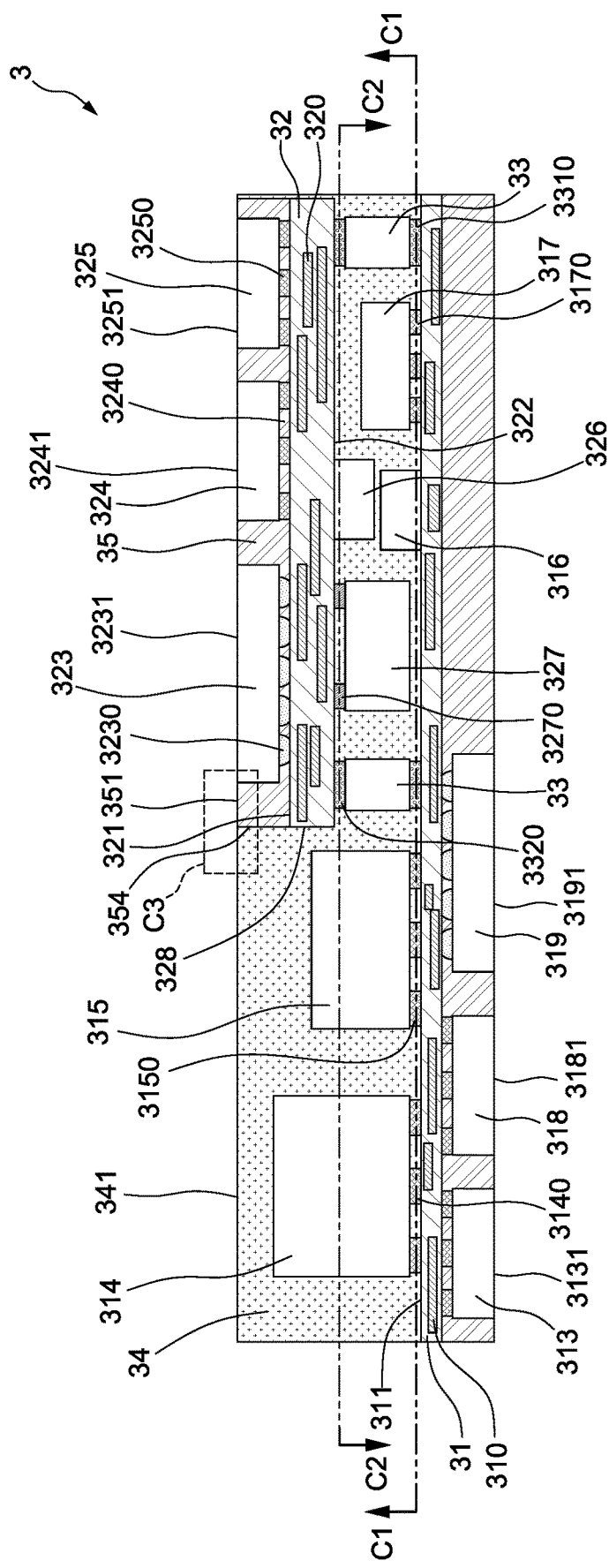
FIG. 3A is a cross-sectional view of a semiconductor device package in accordance with an embodiment of the instant disclosure.

FIG. 3A is a cross-sectional view of a semiconductor device package 3 in accordance with some embodiments of the present disclosure. As shown in FIG. 3A, the semiconductor device package 3 includes a main carrier 31, interposers 33 and a sub-carrier 32. In some embodiments, the main carrier 31 includes a substrate, which may include a redistribution structure 310. Referring to FIG. 3A, the main carrier 31 has a surface 311 (e.g., an upper surface), and the interposers 33 may be disposed on the surface 311 of the main carrier 31. In some embodiments, the sub-carrier 32 includes a substrate, which may include a redistribution structure 320. In some embodiments of the present disclosure, the sub-carrier 32 is a redistribution layer. The sub-carrier 32 is stacked on the interposers 33. The sub-carrier 32 has a surface 321 (e.g., an upper surface) facing away from the surface 311 of the main carrier 31 and a surface 322 (e.g., a lower surface) facing the surface 311 of the main carrier 31. A plurality of electrical connections 3310 configured to electrically connect the interposer 33 and the main carrier 31. In some embodiments of the present disclosure, the electrical connections 3310 are arranged between the interposer 33 and the surface 311 of the main carrier 31. In some embodiments of the present disclosure, the electrical connections 3310 abut the surface 311 of the main carrier 31. In some embodiments of the present disclosure, the electrical connections 3310 may include electrical pads, terminals, contacts and/or ports. Further, a plurality of electrical connections 3320 are configured to electrically connect the interposer 33 and the sub-carrier 32. In some embodiments of the present disclosure, the electrical connections 3320 are arranged between the interposer 33 and the surface 322 of the sub-carrier 32. In some embodiments of the present disclosure, the electrical connections 3320 abut the surface 322 of the sub-carrier 32. In some embodiments of the present disclosure, the electrical connections 3320 may include electrical pads, terminals, contacts and/or ports. Given the above, the sub-carrier 32 may be electrically connected to the main carrier 31 through the interposers 33.

Referring to FIG. 3A, the surface 311 of the main carrier 31 may have a portion, which is covered by the sub-carrier 32, and another portion, which is not covered by the sub-carrier 32. Electronic components 314 and 315 may be disposed or mounted on the portion of the surface 311 of the main carrier 31, which is not covered by the sub-carrier 32. In some embodiments of the present disclosure, the electronic component 314, 315 is a passive device. In some embodiments of the present disclosure, the electronic component 314, 315 is a ceramic-based device. In some embodiments of the present disclosure, the electronic component 314 is a Power Management IC (PMIC). In some embodiments of the present disclosure, the electronic component 315 is a capacitor. A plurality of electrical connections 3140 are configured to electrically connect the electronic component 314 and the main carrier 31. In some embodiments of the present disclosure, the electrical connections 3140 are arranged between the electronic component 314 and the surface 311 of the main carrier 31. In some embodiments of the present disclosure, the electrical connection 3140 abut the surface 311 of the main carrier 31. In some embodiments of the present disclosure, the electrical connections 3140 may include electrical pads, terminals, contacts and/or ports. A plurality of electrical connections 3150 are configured to electrically connect the electronic component 315 and the main carrier 31. In some embodiments of the present disclosure, the electrical connection 3150 are arranged between the electronic component 315 and the surface 311 of the main carrier 31. In some embodiments of the present disclosure, the electrical connection 3150 abut the surface 311 of the main carrier 31. In some embodiments of the present disclosure, the electrical connections 3150 may include electrical pads, terminals, contacts and/or ports.

Further, electronic components 316 and 317 may be disposed or mounted on the portion of the surface 311 of the main carrier 31, which is covered by the sub-carrier 32. In some embodiments of the present disclosure, the electronic component 316, 317 is a passive device. In some embodiments of the present disclosure, the electronic component 316, 317 is a ceramic-based device. In some embodiments of the present disclosure, the electronic component 317 is a capacitor. A plurality of electrical connections 3170 are configured to electrically connect the electronic component 317 and the main carrier 31. In some embodiments of the present disclosure, the electrical connection 3170 are arranged between the electronic component 317 and the surface 311 of the main carrier 31. In some embodiments of the present disclosure, the electrical connection 3170 abut the surface 311 of the main carrier 31. In some embodiments of the present disclosure, the electrical connection 3170 may include electrical pads, terminals, contacts and/or ports. In some embodiments of the present disclosure, a thickness of the electronic component 314, 315 is greater than a thickness of the electronic component 316, 317. In some embodiments of the present disclosure, the thickness of the electronic component 314, 315 is greater than a height of the interposer 33.

Electronic components 326 and 327 may be disposed or mounted on the surface 322 of the sub-carrier 32. In some embodiments of the present disclosure, the electronic component 326, 327 is a passive device. In some embodiments of the present disclosure, the electronic component 326, 327 is a ceramic-based device. In some embodiments of the present disclosure, the electronic component 327 is a capacitor. A plurality of electrical connections 3270 are configured to electrically connect the electronic component 327 and the sub-carrier 32. In some embodiments of the present disclosure, the electrical connection 3270 are arranged between the electronic component 327 and the surface 322 of the sub-carrier 32. In some embodiments of the present disclosure, the electrical connection 3270 abut the surface 322 of the sub-carrier 32. In some embodiments of the present disclosure, the electrical connection 3270 may include an electrical pad, terminal, contact and/or port. In some embodiments of the present disclosure, the thickness of the electronic component 314, 315 is greater than a thickness of the electronic component 326, 327.

Referring to FIG. 3A, electronic components 323, 324 and 325 may be disposed or mounted on the surface 321 of the sub-carrier 32. In some embodiments of the present disclosure, the electronic component 323, 324, 325 is an active device. In some embodiments of the present disclosure, the electronic component 323, 324, 325 is a silicon-based device. In some embodiments of the present disclosure, a non-active side of the electronic component 323, 324, 325 faces away from the surface 321 of the sub-carrier 32. A plurality of electrical connections 3230 are configured to electrically connect the electronic component 323 and the sub-carrier 32. In some embodiments of the present disclosure, the electrical connection 3230 are arranged between the electronic component 323 and the surface 321 of the sub-carrier 32. In some embodiments of the present disclosure, the electrical connection 3230 abut the surface 321 of the sub-carrier 32. In some embodiments of the present disclosure, the electrical connections 3230 may include electrical pads, terminals, contacts and/or ports. A plurality of electrical connections 3240 are configured to electrically connect the electronic component 324 and the sub-carrier 32. In some embodiments of the present disclosure, the electrical connection 3240 are arranged between the electronic component 324 and the surface 321 of the sub-carrier 32. In some embodiments of the present disclosure, the electrical connection 3240 abut the surface 321 of the sub-carrier 32. In some embodiments of the present disclosure, the electrical connections 3240 may include electrical pads, terminals, contacts and/or ports. A plurality of electrical connections 3250 are configured to electrically connect the electronic component 325 and the sub-carrier 32. In some embodiments of the present disclosure, the electrical connection 3250 are arranged between the electronic component 325 and the surface 321 of the sub-carrier 32. In some embodiments of the present disclosure, the electrical connection 3250 abut the surface 321 of the sub-carrier 32. In some embodiments of the present disclosure, the electrical connection 3250 may include electrical pads, terminals, contacts and/or ports. In some embodiments of the present disclosure, an amount of the electrical connections 3230, 3240, 3250 is greater than an amount of the electrical connections 3140, 3150. In some embodiments of the present disclosure, the amount of the electrical connections 3230, 3240, 3250 is greater than an amount of the electrical connections 3170. In some embodiments of the present disclosure, the amount of the electrical connections 3230, 3240, 3250 is greater than an amount of the electrical connections 3270.

Referring to FIG. 3A, an encapsulant 35 (i.e., package body) is disposed on the surface 321 of the sub-carrier 32. The encapsulant 35 may cover the surface 321 of the sub-carrier 32 and the electronic components 323, 324 and 325 disposed on the surface 321 of the sub-carrier 32. The encapsulant 35 may include molding compounds, such as a Novolac-based resin, an epoxy-based resin, a silicone-based resin, or other another suitable encapsulant; fillers such as silicon oxide fillers, may be included in the molding compound. In addition, the encapsulant 35 may include a molding underfill (MUF) or a capillary underfill (CUF). As shown in FIG. 3A, the encapsulant 35 may have a substantially flat surface 351 (e.g., an upper surface) facing away from the surface 321 of the sub-carrier 32. The electronic component 323 may have a substantially flat surface 3231 (e.g., an upper surface) facing away from the surface 321 of the sub-carrier 32. The electronic component 324 may have a substantially flat surface 3241 (e.g., an upper surface) facing away from the surface 321 of the sub-carrier 32. The electronic component 325 may have a substantially flat surface 3251 (e.g., an upper surface) facing away from the surface 321 of the sub-carrier 32. The surfaces 3231, 3241 and 3251 of the electronic components 323, 324 and 325 are exposed from the surface 351 of the encapsulant 35. In some embodiments of the present disclosure, the surfaces 3231, 3241 and 3251 of the electronic components 323, 324 and 325 are coplanar with the surface 351 of the encapsulant 35. In some embodiments of the present disclosure, the encapsulant 35 includes a lateral surface 354 and the substrate 32 has a side surface 328 between the surface 321 and 322, and the lateral surface 354 is substantially coplanar with the side surface 328.

Further, an encapsulant 34 (i.e., package body) is disposed on the surface 311 of the main carrier 31. The encapsulant 34 may cover the surface 311 of the main carrier 11 and the electronic components 314, 315, 316 and 317 disposed on the surface 311 of the main carrier 31, the interposers 33, the electronic components 326 and 327 disposed on the surface 322 of the sub-carrier 32, the sub-carrier 32 and the encapsulant 35. The encapsulant 34 may include molding compounds, such as a Novolac-based resin, an epoxy-based resin, a silicone-based resin, or other another suitable encapsulant; fillers such as silicon oxide fillers, may be included in the molding compound. In addition, the encapsulant 34 may include a molding underfill (MUF) or a capillary underfill (CUF). The encapsulant 34 may have a substantially flat surface 341 (e.g., an upper surface) facing away from the surface 311 of the main-carrier 31. In some embodiments of the present disclosure, the surface 341 of the encapsulant 34 is substantially coplanar with the surface 351 of the encapsulant 35. In some embodiments of the present disclosure, the surface 341 of the encapsulant 34 is recessed with respect to the surface 351 of the encapsulant 35.

Moreover, as shown in FIG. 3A, the main carrier has a surface 312 (e.g., a lower surface) opposite to the surface 311. Electronic devices 313, 318 and 319 may be disposed or mounted on the surface 312 of the main carrier 31. In some embodiments of the present disclosure, the electronic component 313, 318, 319 is an active device. In some embodiments of the present disclosure, the electronic component 313, 318, 319 is a silicon-based device. In some embodiments of the present disclosure, a non-active side of the electronic component 313, 318, 319 faces away from the surface 312 of the main carrier 31. Further, an encapsulant 38 (i.e., package body) is disposed on the surface 312 of the main carrier 31. The encapsulant 38 may cover the surface 312 of the main carrier 11 and the electronic components 313, 318 and 319 disposed on the surface 312 of the main carrier 31. The encapsulant 38 may include molding compounds, such as a Novolac-based resin, an epoxy-based resin, a silicone-based resin, or other another suitable encapsulant; fillers such as silicon oxide fillers, may be included in the molding compound. In addition, the encapsulant 38 may include a molding underfill (MUF) or a capillary underfill (CUF). The encapsulant 38 may have a substantially flat surface 381 (e.g., a lower surface) facing away from the surface 312 of the main-carrier 31. The electronic component 313 may have a substantially flat surface 3131 (e.g., a lower surface) facing away from the surface 312 of the main carrier 31. The electronic component 318 may have a substantially flat surface 3181 (e.g., a lower surface) facing away from the surface 312 of the main carrier 31. The electronic component 319 may have a substantially flat surface 3191 (e.g., a lower surface) facing away from the surface 312 of the main carrier 31. The surfaces 3131, 3181 and 3191 of the electronic components 313, 318 and 319 are exposed from the surface 381 of the encapsulant 38. In some embodiments of the present disclosure, the surfaces 3131, 3181 and 3191 of the electronic components 313, 318 and 319 are coplanar with the surface 381 of the encapsulant 38.

Figure 3B:
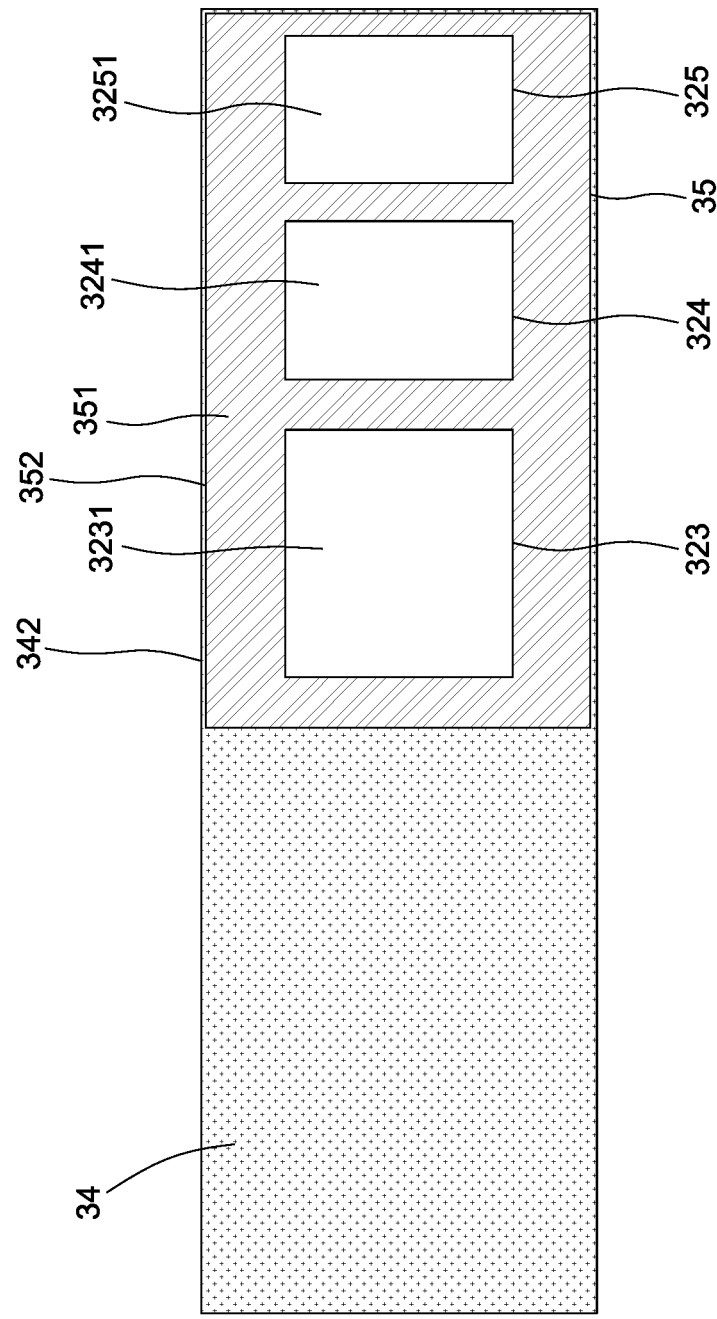
FIG. 3B is a top view of a semiconductor device package in accordance with an embodiment of the instant disclosure.

FIG. 3B illustrates a top view of a semiconductor device package 3 in accordance with some embodiments of the present disclosure. Referring to FIG. 3B, an area of the encapsulant 34 is greater than an area the encapsulant 35. The surfaces 3231, 3241 and 3251 of the electronic components 323, 324 and 325 may be exposed from the surface 351 of the encapsulant 35. A side surface 342 of the encapsulant 34 does not contact a side surface 352 of the encapsulant 35. That is, the side surface 342 of the encapsulant 34 is spaced apart from the side surface 352 of the encapsulant 35

Figure 3C:
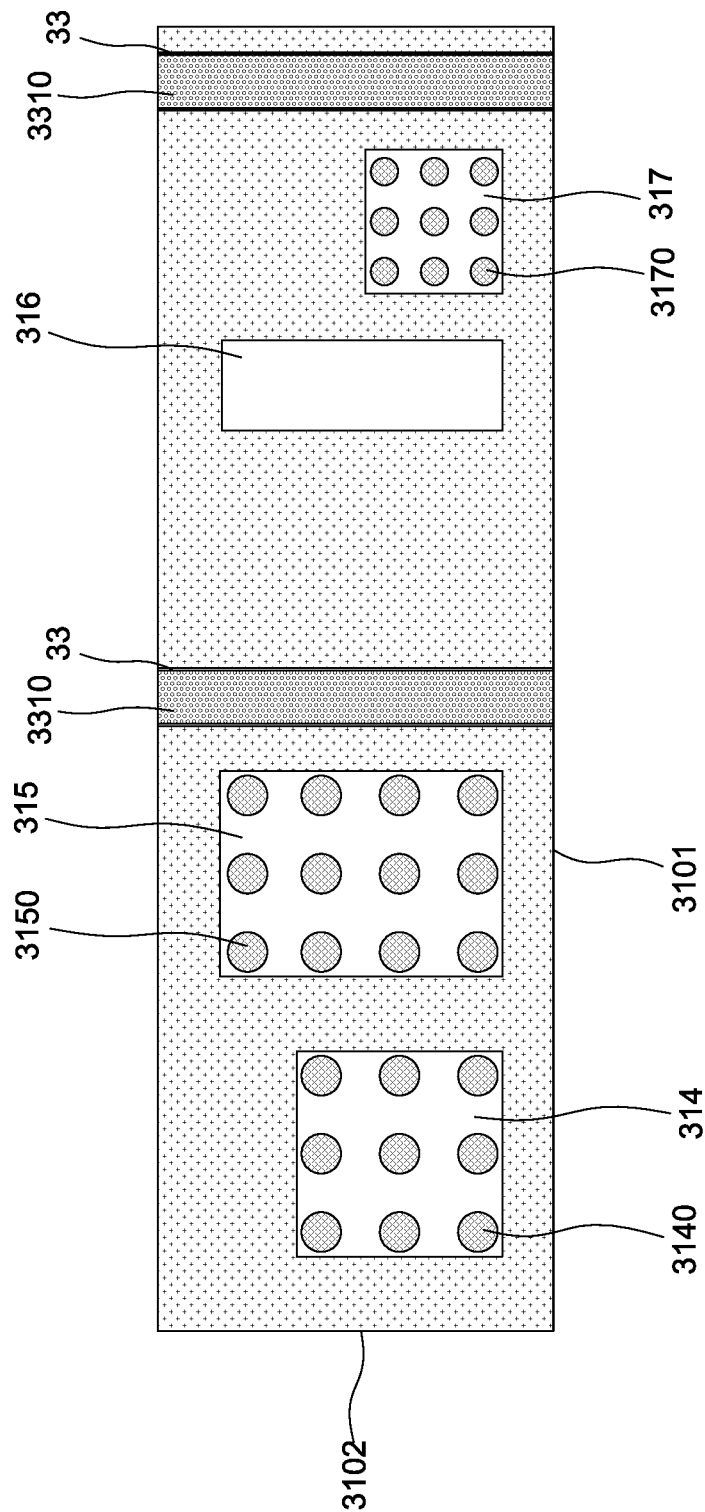
FIG. 3C illustrates a cross-sectional view along line C1-C1 in FIG. 3A.

FIG. 3C illustrates a cross-sectional view along line C1-C1 in FIG. 3A. As shown in FIG. 3C, the main carrier 31 may have a side 3101 and a side 3102 connecting the side 3101. In some embodiments of the present disclosure, a length of the side 3101 is greater than a length of the side 3102. The interposer 33 may extend along a direction which is substantially parallel to the side 3102 of the main carrier 31.

Referring to FIG. 3C, an amount of the electrical connections 3310 may be greater than the amount of the electrical connections 3140, and the amount of the electrical connections 3310 may be greater than the amount of the electrical connections 3150, and the amount of the electrical connections 3310 may be greater than the amount of the electrical connections 3170. Moreover, a density of the electrical connections 3310 under the interposer 33 may be greater than a density of the electrical connections 3140 under the electrical component 314, and the density of the electrical connections 3310 under the interposer 33 may be greater than a density of the electrical connections 3150 under the electrical component 315, and the density of the electrical connections 3310 under the interposer 33 may be greater than a density of the electrical connections 3170 under the electrical component 317. That is, a pitch between the electrical connections 3310 is smaller than a pitch between the electrical connections 3140, a pitch between the electrical connections 3150 and a pitch between the electrical connections 3170. Further, a density of the electrical connections 3310 in an area occupied by the interposer 33 is greater than a density of the electrical connections 3140, 3150 on the portion of the surface 311 of the main carrier 31, which is not covered by the sub-carrier 32 and greater than a density of the electrical connections 3170 on the portion of the surface of the main carrier 31, which is covered by the sub-carrier 32.

Figure 3D:
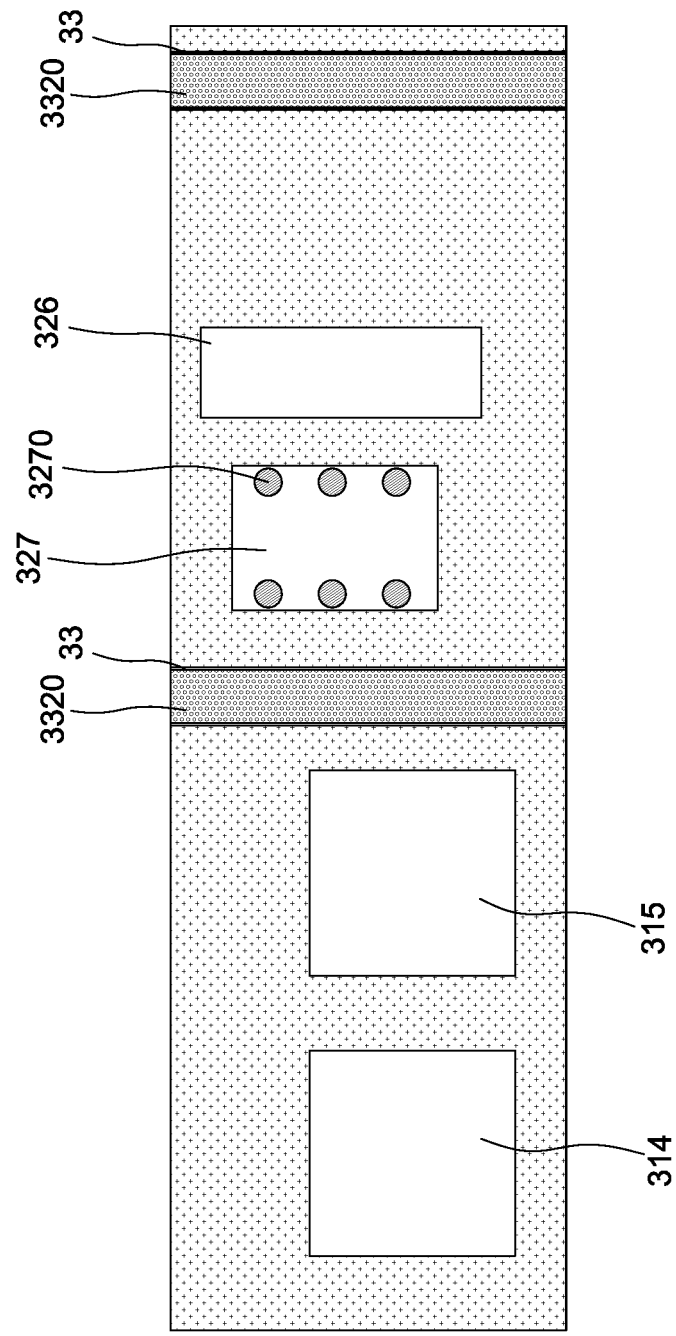
FIG. 3D illustrates a cross-sectional view along line C2-C2 in FIG. 3A.

FIG. 3D illustrates a cross-sectional view along line C2-C2 in FIG. 3A. Referring to FIG. 3D, an amount of the electrical connections 3320 may be greater than the amount of the electrical connections 3270. Moreover, a density of the electrical connections 3320 under the interposer 33 may be greater than a density of the electrical connections 3270 under the electrical component 327. That is, a pitch between the electrical connections 3320 is smaller than a pitch between the electrical connections 3270. Further, a density of the electrical connections 3320 in an area occupied by the interposer 33 is greater than a density of the electrical connections 3270 on the surface 322 of the sub-carrier 32.

Figure 3E:
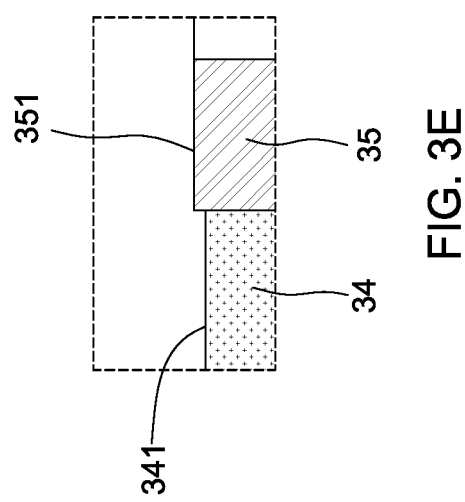
FIG. 3E illustrates an enlarged view of portion C3 in FIG. 3A.

In some embodiments of the present disclosure, the surface 341 of the encapsulant 34 may be recessed with respect to the surface 351 of the encapsulant 35 (referring to FIG. 3E).

Figure 4A:
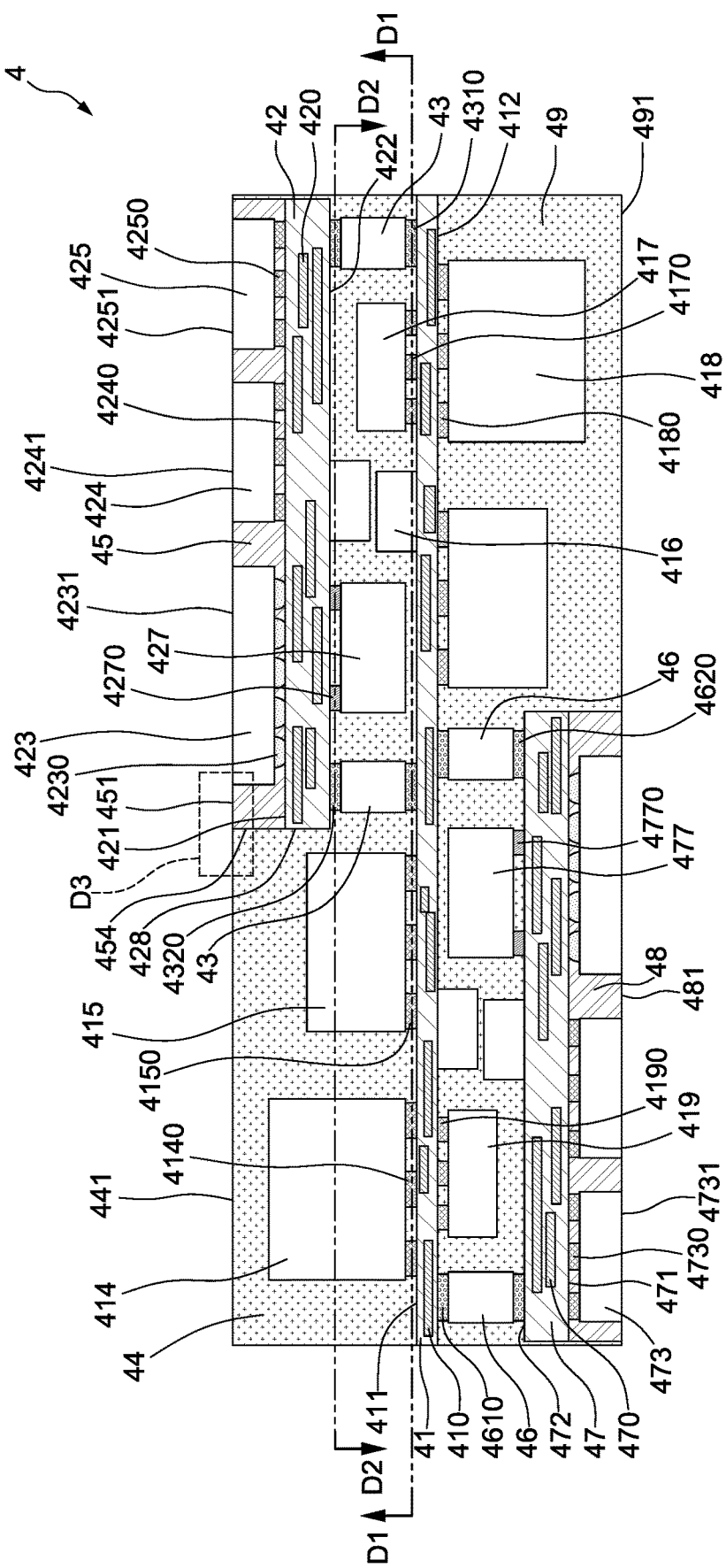
FIG. 4A is a cross-sectional view of a semiconductor device package in accordance with an embodiment of the instant disclosure.

FIG. 4A is a cross-sectional view of a semiconductor device package 4 in accordance with some embodiments of the present disclosure. As shown in FIG. 4A, the semiconductor device package 4 includes a main carrier 41, interposers 43 and 46 and sub-carriers 32. In some embodiments, the main carrier 41 includes a substrate, which may include a redistribution structure 410. Referring to FIG. 4A, the main carrier 41 has a surface 411 (e.g., an upper surface), and the interposers 43 may be disposed on the surface 411 of the main carrier 41. In some embodiments, the sub-carrier 42 includes a substrate, which may include a redistribution structure 420. In some embodiments of the present disclosure, the sub-carrier 42 is a redistribution layer. The sub-carrier 42 is stacked on the interposers 43. The sub-carrier 42 has a surface 421 (e.g., an upper surface) facing away from the surface 411 of the main carrier 41 and a surface 422 (e.g., a lower surface) facing the surface 411 of the main carrier 41. A plurality of electrical connections 4310 configured to electrically connect the interposer 43 and the main carrier 41. In some embodiments of the present disclosure, the electrical connections 4310 are arranged between the interposer 43 and the surface 411 of the main carrier 41. In some embodiments of the present disclosure, the electrical connections 4310 abut the surface 411 of the main carrier 41. In some embodiments of the present disclosure, the electrical connections 4310 may include electrical pads, terminals, contacts and/or ports. Further, a plurality of electrical connections 4320 are configured to electrically connect the interposer 43 and the sub-carrier 42. In some embodiments of the present disclosure, the electrical connections 4320 are arranged between the interposer 43 and the surface 422 of the sub-carrier 42. In some embodiments of the present disclosure, the electrical connections 4320 abut the surface 422 of the sub-carrier 42. In some embodiments of the present disclosure, the electrical connections 4320 may include electrical pads, terminals, contacts and/or ports. Given the above, the sub-carrier 42 may be electrically connected to the main carrier 41 through the interposers 43.

Moreover, the main carrier 41 has a surface 412 (e.g., a lower surface) opposite to the surface 411, and the interposers 46 may be disposed on the surface 412 of the main carrier 41. In some embodiments, the sub-carrier 47 includes a substrate, which may include a redistribution structure 470. In some embodiments of the present disclosure, the sub-carrier 47 is a redistribution layer. The sub-carrier 47 is stacked on the interposers 46. The sub-carrier 47 has a surface 471 (e.g., a lower surface) facing away from the surface 412 of the main carrier 41 and a surface 472 (e.g., an upper surface) facing the surface 412 of the main carrier 41. A plurality of electrical connections 4610 configured to electrically connect the interposer 46 and the main carrier 41. In some embodiments of the present disclosure, the electrical connections 4610 are arranged between the interposer 46 and the surface 412 of the main carrier 41. In some embodiments of the present disclosure, the electrical connections 4610 abut the surface 412 of the main carrier 41. In some embodiments of the present disclosure, the electrical connections 4610 may include electrical pads, terminals, contacts and/or ports. Further, a plurality of electrical connections 4620 are configured to electrically connect the interposer 46 and the sub-carrier 47. In some embodiments of the present disclosure, the electrical connections 4620 are arranged between the interposer 46 and the surface 472 of the sub-carrier 47. In some embodiments of the present disclosure, the electrical connections 4620 abut the surface 472 of the sub-carrier 47. In some embodiments of the present disclosure, the electrical connections 4620 may include electrical pads, terminals, contacts and/or ports. Given the above, the sub-carrier 47 may be electrically connected to the main carrier 41 through the interposers 46.

Referring to FIG. 4A, the surface 411 of the main carrier 41 may have a portion, which is covered by the sub-carrier 42, and another portion, which is not covered by the sub-carrier 42. Electronic components 414 and 415 may be disposed or mounted on the portion of the surface 411 of the main carrier 41, which is not covered by the sub-carrier 42. In some embodiments of the present disclosure, the electronic component 414, 415 is a passive device. In some embodiments of the present disclosure, the electronic component 414, 415 is a ceramic-based device. In some embodiments of the present disclosure, the electronic component 414 is a Power Management IC (PMIC). In some embodiments of the present disclosure, the electronic component 415 is a capacitor. A plurality of electrical connections 4140 are configured to electrically connect the electronic component 414 and the main carrier 41. In some embodiments of the present disclosure, the electrical connections 4140 are arranged between the electronic component 414 and the surface 411 of the main carrier 41. In some embodiments of the present disclosure, the electrical connection 4140 abut the surface 411 of the main carrier 41. In some embodiments of the present disclosure, the electrical connections 4140 may include electrical pads, terminals, contacts and/or ports. A plurality of electrical connections 4150 are configured to electrically connect the electronic component 415 and the main carrier 41. In some embodiments of the present disclosure, the electrical connection 4150 are arranged between the electronic component 415 and the surface 411 of the main carrier 41. In some embodiments of the present disclosure, the electrical connection 4150 abut the surface 411 of the main carrier 41. In some embodiments of the present disclosure, the electrical connections 4150 may include electrical pads, terminals, contacts and/or ports.

Further, electronic components 416 and 417 may be disposed or mounted on the portion of the surface 411 of the main carrier 41, which is covered by the sub-carrier 42. In some embodiments of the present disclosure, the electronic component 416, 417 is a passive device. In some embodiments of the present disclosure, the electronic component 416, 417 is a ceramic-based device. In some embodiments of the present disclosure, the electronic component 417 is a capacitor. A plurality of electrical connections 4170 are configured to electrically connect the electronic component 417 and the main carrier 41. In some embodiments of the present disclosure, the electrical connection 4170 are arranged between the electronic component 417 and the surface 411 of the main carrier 41. In some embodiments of the present disclosure, the electrical connection 4170 abut the surface 411 of the main carrier 41. In some embodiments of the present disclosure, the electrical connection 4170 may include electrical pads, terminals, contacts and/or ports. In some embodiments of the present disclosure, a thickness of the electronic component 414, 415 is greater than a thickness of the electronic component 416, 417. In some embodiments of the present disclosure, the thickness of the electronic component 414, 415 is greater than a height of the interposer 43.

Referring to FIG. 4A, the surface 412 of the main carrier 41 may have a portion, which is covered by the sub-carrier 47, and another portion, which is not covered by the sub-carrier 47. Electronic component(s) 418 may be disposed or mounted on the portion of the surface 412 of the main carrier 41, which is not covered by the sub-carrier 47. In some embodiments of the present disclosure, the electronic component 418 is a passive device. In some embodiments of the present disclosure, the electronic component 418 is a ceramic-based device. In some embodiments of the present disclosure, the electronic component 418 is a Power Management IC (PMIC). In some embodiments of the present disclosure, the electronic component 418 is a capacitor. A plurality of electrical connections 4180 are configured to electrically connect the electronic component 418 and the main carrier 41. In some embodiments of the present disclosure, the electrical connections 4180 are arranged between the electronic component 418 and the surface 412 of the main carrier 41. In some embodiments of the present disclosure, the electrical connection 4180 abut the surface 412 of the main carrier 41. In some embodiments of the present disclosure, the electrical connections 4180 may include electrical pads, terminals, contacts and/or ports.

Further, electronic component(s) 419 may be disposed or mounted on the portion of the surface 412 of the main carrier 41, which is covered by the sub-carrier 47. In some embodiments of the present disclosure, the electronic component 419 is a passive device. In some embodiments of the present disclosure, the electronic component 419 is a ceramic-based device. In some embodiments of the present disclosure, the electronic component 419 is a capacitor. A plurality of electrical connections 4190 are configured to electrically connect the electronic component 419 and the main carrier 41. In some embodiments of the present disclosure, the electrical connection 4190 are arranged between the electronic component 419 and the surface 412 of the main carrier 41. In some embodiments of the present disclosure, the electrical connection 4190 abut the surface 412 of the main carrier 41. In some embodiments of the present disclosure, the electrical connection 4190 may include electrical pads, terminals, contacts and/or ports. In some embodiments of the present disclosure, a thickness of the electronic component 418 is greater than a thickness of the electronic component 419. In some embodiments of the present disclosure, the thickness of the electronic component 418 is greater than a height of the interposer 46.

As shown in FIG. 4A, electronic components 426 and 427 may be disposed or mounted on the surface 422 of the sub-carrier 42. In some embodiments of the present disclosure, the electronic component 426, 427 is a passive device. In some embodiments of the present disclosure, the electronic component 426, 427 is a ceramic-based device. In some embodiments of the present disclosure, the electronic component 427 is a capacitor. A plurality of electrical connections 4270 are configured to electrically connect the electronic component 427 and the sub-carrier 42. In some embodiments of the present disclosure, the electrical connection 4270 are arranged between the electronic component 427 and the surface 422 of the sub-carrier 42. In some embodiments of the present disclosure, the electrical connection 4270 abut the surface 422 of the sub-carrier 42. In some embodiments of the present disclosure, the electrical connection 4270 may include an electrical pad, terminal, contact and/or port. In some embodiments of the present disclosure, the thickness of the electronic component 414, 415 is greater than a thickness of the electronic component 426, 427.

Electronic components 423, 424 and 425 may be disposed or mounted on the surface 421 of the sub-carrier 42. In some embodiments of the present disclosure, the electronic component 423, 424, 425 is an active device. In some embodiments of the present disclosure, the electronic component 423, 424, 425 is a silicon-based device. In some embodiments of the present disclosure, a non-active side of the electronic component 423, 424, 425 faces away from the surface 421 of the sub-carrier 42. A plurality of electrical connections 4230 are configured to electrically connect the electronic component 423 and the sub-carrier 42. In some embodiments of the present disclosure, the electrical connection 4230 are arranged between the electronic component 423 and the surface 421 of the sub-carrier 42. In some embodiments of the present disclosure, the electrical connection 4230 abut the surface 421 of the sub-carrier 42. In some embodiments of the present disclosure, the electrical connections 4230 may include electrical pads, terminals, contacts and/or ports. A plurality of electrical connections 4240 are configured to electrically connect the electronic component 424 and the sub-carrier 42. In some embodiments of the present disclosure, the electrical connection 4240 are arranged between the electronic component 424 and the surface 421 of the sub-carrier 42. In some embodiments of the present disclosure, the electrical connection 4240 abut the surface 421 of the sub-carrier 42. In some embodiments of the present disclosure, the electrical connections 4240 may include electrical pads, terminals, contacts and/or ports. A plurality of electrical connections 4250 are configured to electrically connect the electronic component 425 and the sub-carrier 42. In some embodiments of the present disclosure, the electrical connection 4250 are arranged between the electronic component 425 and the surface 421 of the sub-carrier 42. In some embodiments of the present disclosure, the electrical connection 4250 abut the surface 421 of the sub-carrier 42. In some embodiments of the present disclosure, the electrical connection 4250 may include electrical pads, terminals, contacts and/or ports. In some embodiments of the present disclosure, an amount of the electrical connections 4230, 4240, 4250 is greater than an amount of the electrical connections 4140, 4150. In some embodiments of the present disclosure, the amount of the electrical connections 4230, 4240, 4250 is greater than an amount of the electrical connections 4170. In some embodiments of the present disclosure, the amount of the electrical connections 4230, 4240, 4250 is greater than an amount of the electrical connections 4270.

As shown in FIG. 4A, electronic component(s) 477 may be disposed or mounted on the surface 472 of the sub-carrier 47. In some embodiments of the present disclosure, the electronic component 477 is a passive device. In some embodiments of the present disclosure, the electronic component 477 is a ceramic-based device. In some embodiments of the present disclosure, the electronic component 477 is a capacitor. A plurality of electrical connections 4770 configured to electrically connect the electronic component 477 and the sub-carrier 47. In some embodiments of the present disclosure, the electrical connection 4770 are arranged between the electronic component 477 and the surface 472 of the sub-carrier 47. In some embodiments of the present disclosure, the electrical connection 4770 abut the surface 472 of the sub-carrier 47. In some embodiments of the present disclosure, the electrical connections 4770 may include electrical pads, terminals, contacts and/or ports. In some embodiments of the present disclosure, the thickness of the electronic component 418 is greater than a thickness of the electronic component 477.

Electronic component(s) 473 may be disposed or mounted on the surface 471 of the sub-carrier 47. In some embodiments of the present disclosure, the electronic component 473 is an active device. In some embodiments of the present disclosure, the electronic component 473 is a silicon-based device. In some embodiments of the present disclosure, a non-active side of the electronic component 473 faces away from the surface 471 of the sub-carrier 47. A plurality of electrical connections 4730 are configured to electrically connect the electronic component 473 and the sub-carrier 47. In some embodiments of the present disclosure, the electrical connection 4730 are arranged between the electronic component 473 and the surface 471 of the sub-carrier 47. In some embodiments of the present disclosure, the electrical connection 4730 abut the surface 471 of the sub-carrier 47. In some embodiments of the present disclosure, the electrical connections 4730 may include electrical pads, terminals, contacts and/or ports. In some embodiments of the present disclosure, an amount of the electrical connections 4730 is greater than an amount of the electrical connection 4170. In some embodiments of the present disclosure, the amount of the electrical connections 4730 is greater than an amount of the electrical connections 4190. In some embodiments of the present disclosure, the amount of the electrical connections 4730 is greater than an amount of the electrical connections 4770.

Referring to FIG. 4A, an encapsulant 45 (i.e., package body) is disposed on the surface 421 of the sub-carrier 42. The encapsulant 45 may cover the surface 421 of the sub-carrier 42 and the electronic components 423, 424 and 425 disposed on the surface 421 of the sub-carrier 42. The encapsulant 45 may include molding compounds, such as a Novolac-based resin, an epoxy-based resin, a silicone-based resin, or other another suitable encapsulant; fillers such as silicon oxide fillers, may be included in the molding compound. In addition, the encapsulant 45 may include a molding underfill (MUF) or a capillary underfill (CUF). As shown in FIG. 4A, the encapsulant 45 may have a substantially flat surface 451 (e.g., an upper surface) facing away from the surface 421 of the sub-carrier 42. The electronic component 423 may have a substantially flat surface 4231 (e.g., an upper surface) facing away from the surface 421 of the sub-carrier 42. The electronic component 424 may have a substantially flat surface 4241 (e.g., an upper surface) facing away from the surface 421 of the sub-carrier 42. The electronic component 425 may have a substantially flat surface 4251 (e.g., an upper surface) facing away from the surface 421 of the sub-carrier 42. The surfaces 4231, 4241 and 4251 of the electronic components 423, 424 and 425 are exposed from the surface 451 of the encapsulant 45. In some embodiments of the present disclosure, the surfaces 4231, 4241 and 4251 of the electronic components 423, 424 and 425 are coplanar with the surface 451 of the encapsulant 45. In some embodiments of the present disclosure, the encapsulant 45 includes a lateral surface 454 and the substrate 42 has a side surface 428 between the surface 421 and 422, and the lateral surface 454 is substantially coplanar with the side surface 428.

Further, an encapsulant 44 (i.e., package body) is disposed on the surface 411 of the main carrier 41. The encapsulant 44 may cover the surface 411 of the main carrier 41 and the electronic components 414, 415, 416 and 417 disposed on the surface 411 of the main carrier 41, the interposers 43, the electronic components 426 and 427 disposed on the surface 422 of the sub-carrier 42, the sub-carrier 42 and the encapsulant 45. The encapsulant 44 may include molding compounds, such as a Novolac-based resin, an epoxy-based resin, a silicone-based resin, or other another suitable encapsulant; fillers such as silicon oxide fillers, may be included in the molding compound. In addition, the encapsulant 44 may include a molding underfill (MUF) or a capillary underfill (CUF). The encapsulant 44 may have a substantially flat surface 441 (e.g., an upper surface) facing away from the surface 411 of the main-carrier 41. In some embodiments of the present disclosure, the surface 441 of the encapsulant 44 is substantially coplanar with the surface 451 of the encapsulant 45. In some embodiments of the present disclosure, the surface 441 of the encapsulant 44 is recessed with respect to the surface 451 of the encapsulant 45.

Referring to FIG. 4A, an encapsulant 48 (i.e., package body) is disposed on the surface 471 of the sub-carrier 47. The encapsulant 48 may cover the surface 471 of the sub-carrier 47 and the electronic component(s) 473 disposed on the surface 471 of the sub-carrier 47. The encapsulant 48 may include molding compounds, such as a Novolac-based resin, an epoxy-based resin, a silicone-based resin, or other another suitable encapsulant; fillers such as silicon oxide fillers, may be included in the molding compound. In addition, the encapsulant 48 may include a molding underfill (MUF) or a capillary underfill (CUF). As shown in FIG. 4A, the encapsulant 48 may have a substantially flat surface 481 (e.g., a lower surface) facing away from the surface 471 of the sub-carrier 47. The electronic component 473 may have a substantially flat surface 4731 (e.g., a lower surface) facing away from the surface 421 of the sub-carrier 42. The surface 4731 of the electronic component 473 is exposed from the surface 481 of the encapsulant 48. In some embodiments of the present disclosure, the surface 4731 of the electronic component 473 is coplanar with the surface 481 of the encapsulant 48.

Further, an encapsulant 49 (i.e., package body) is disposed on the surface 412 of the main carrier 41. The encapsulant 49 may cover the surface 412 of the main carrier 41 and the electronic components 418, 419 disposed on the surface 412 of the main carrier 41, the interposers 46, the electronic component(s) 477 disposed on the surface 472 of the sub-carrier 47, the sub-carrier 47 and the encapsulant 46. The encapsulant 49 may include molding compounds, such as a Novolac-based resin, an epoxy-based resin, a silicone-based resin, or other another suitable encapsulant; fillers such as silicon oxide fillers, may be included in the molding compound. In addition, the encapsulant 49 may include a molding underfill (MUF) or a capillary underfill (CUF). The encapsulant 49 may have a substantially flat surface 491 (e.g., a lower surface) facing away from the surface 412 of the main-carrier 41. In some embodiments of the present disclosure, the surface 491 of the encapsulant 49 is substantially coplanar with the surface 481 of the encapsulant 48. In some embodiments of the present disclosure, the surface 491 of the encapsulant 49 is recessed with respect to the surface 481 of the encapsulant 48.

Figure 4B:
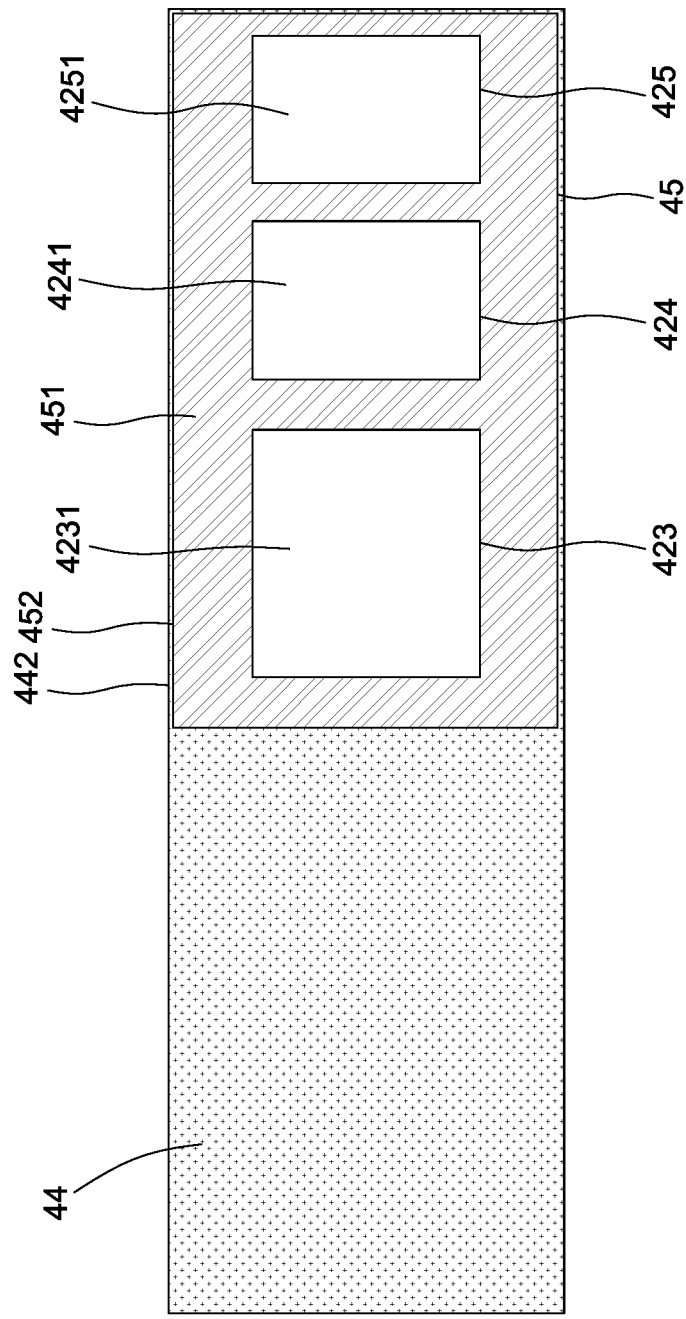
FIG. 4B is a top view of a semiconductor device package in accordance with an embodiment of the instant disclosure.

FIG. 4B illustrates a top view of a semiconductor device package 4 in accordance with some embodiments of the present disclosure. Referring to FIG. 4B, an area of the encapsulant 44 is greater than an area the encapsulant 45. The surfaces 4231, 4241 and 4251 of the electronic components 423, 424 and 425 may be exposed from the surface 451 of the encapsulant 45. A side surface 442 of the encapsulant 44 does not contact a side surface 452 of the encapsulant 45. That is, the side surface 442 of the encapsulant 44 is spaced apart from the side surface 452 of the encapsulant 45.

Similarly, an area of the encapsulant 49 is greater than an area the encapsulant 48. The surface 4731 of the electronic component 473 may be exposed from the surface 481 of the encapsulant 48.

Figure 4C:
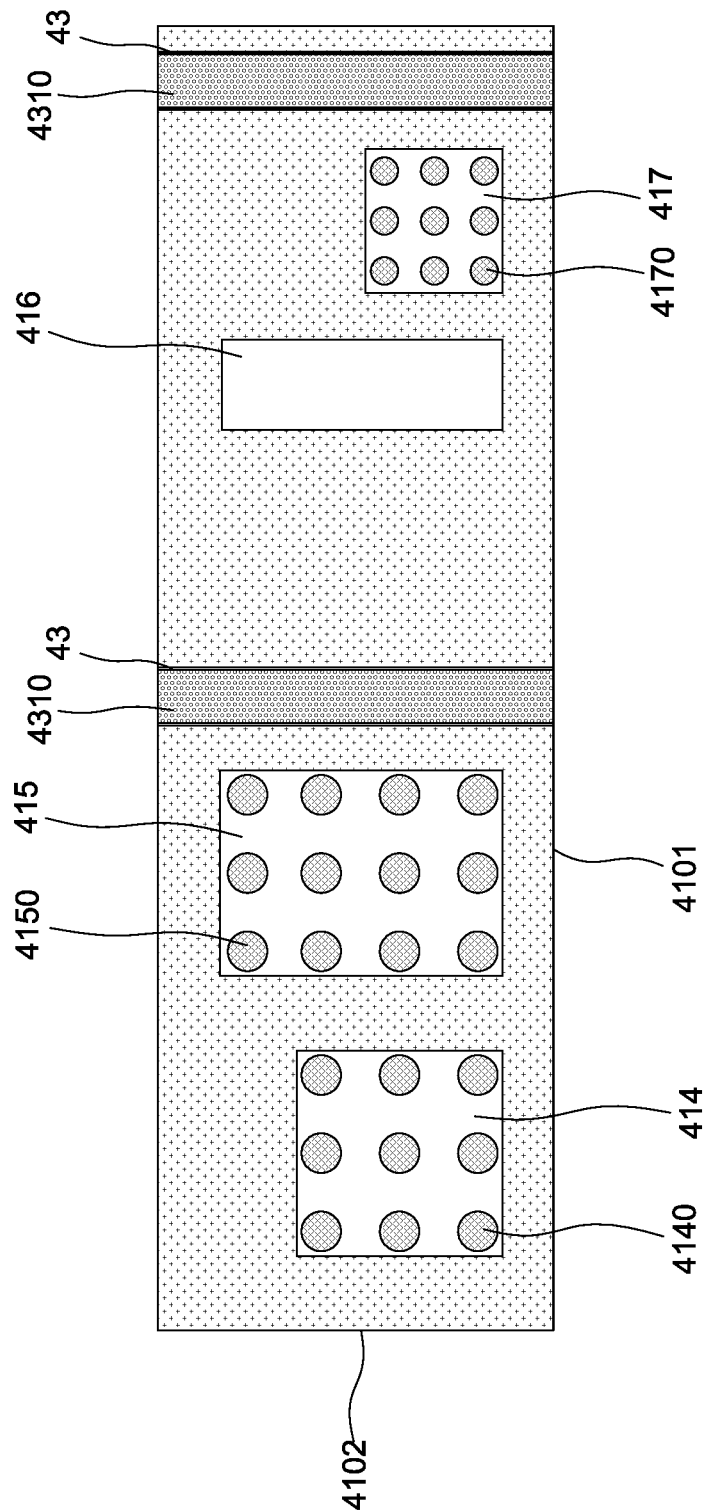
FIG. 4C illustrates a cross-sectional view along line D1-D1 in FIG. 4A.

FIG. 4C illustrates a cross-sectional view along line D1-D1 in FIG. 4A. As shown in FIG. 4C, the main carrier 41 may have a side 4101 and a side 4102 connecting the side 4101. In some embodiments of the present disclosure, a length of the side 4101 is greater than a length of the side 4102. The interposer 43 may extend along a direction which is substantially parallel to the side 4102 of the main carrier 41. Similarly, the interposer 46 may extend along a direction which is substantially parallel to the side 4102 of the main carrier 41.

Referring to FIG. 4C, an amount of the electrical connections 4310 may be greater than the amount of the electrical connections 4140, and the amount of the electrical connections 4310 may be greater than the amount of the electrical connections 4150, and the amount of the electrical connections 4310 may be greater than the amount of the electrical connections 4170. Moreover, a density of the electrical connections 4310 under the interposer 43 may be greater than a density of the electrical connections 4140 under the electrical component 414, and the density of the electrical connections 4310 under the interposer 43 may be greater than a density of the electrical connections 4150 under the electrical component 415, and t the density of the electrical connections 4310 under the interposer 43 may be greater than a density of the electrical connections 4170 under the electrical component 417. That is, a pitch between the electrical connections 4310 is smaller than a pitch between the electrical connections 4140, a pitch between the electrical connections 4150 and a pitch between the electrical connections 4170. Further, a density of the electrical connections 4310 in an area occupied by the interposer 43 is greater than a density of the electrical connections 4140, 4150 on the portion of the surface 411 of the main carrier 41, which is not covered by the sub-carrier 42 and greater than a density of the electrical connections, 4170 on the portion of the surface 411 of the main carrier 41, which is covered by the sub-carrier 42.

Similarly, an amount of the electrical connections 4610 may be greater than the amount of the electrical connections 4170, and the amount of the electrical connections 4610 may be greater than the amount of the electrical connections 4190. Moreover, a density of the electrical connections 4610 under the interposer 46 may be greater than a density of the electrical connections 4170 under the electrical component 417, and the density of the electrical connections 4610 under the interposer 46 may be greater than a density of the electrical connections 4190 under the electrical component 419. That is, a density of the electrical connections 4610 in an area occupied by the interposer 46 is greater than a density of the electrical connections 4170 on the portion of the surface 412 of the main carrier 41, which is not covered by the sub-carrier 47 and greater than a density of the electrical connections 4190 on the portion of the surface 412 of the main carrier 41, which is covered by the sub-carrier 47.

Figure 4D:
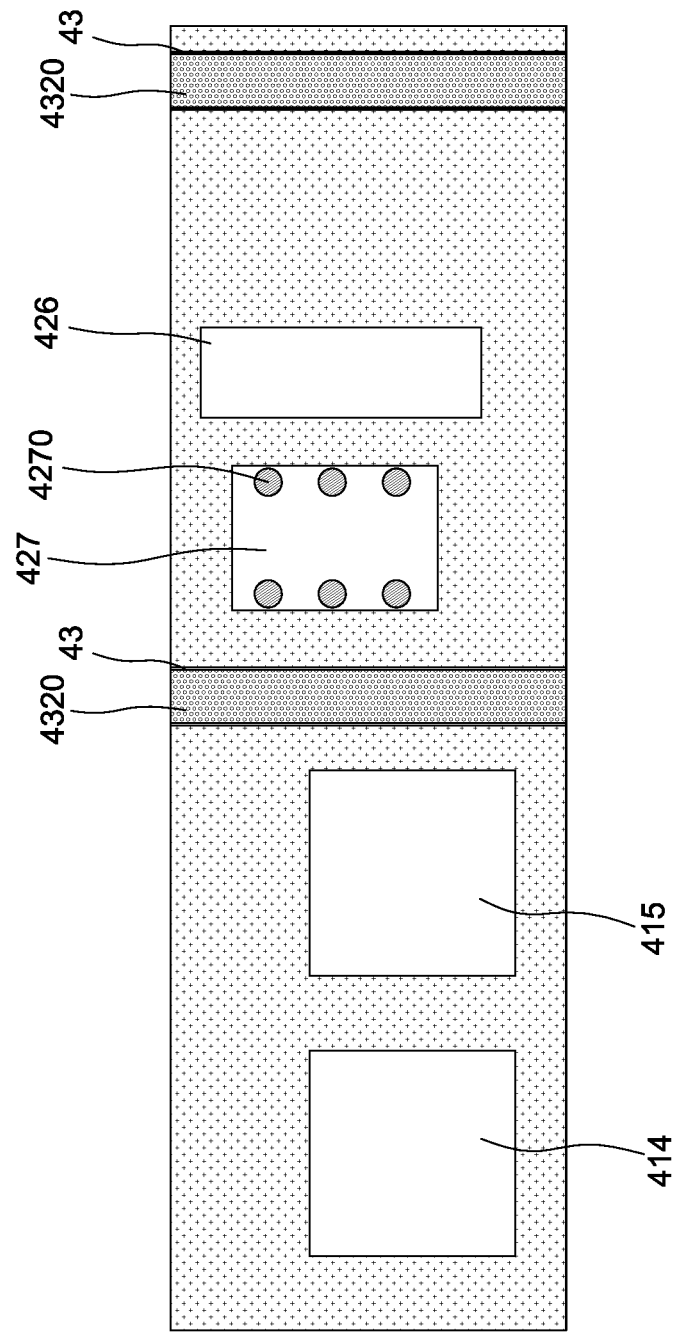
FIG. 4D illustrates a cross-sectional view along line D2-D2 in FIG. 4A.

FIG. 4D illustrates a cross-sectional view along line D2-D2 in FIG. 4A. Referring to FIG. 4D, an amount of the electrical connections 4320 may be greater than the amount of the electrical connections 4270. Moreover, a density of the electrical connections 4320 under the interposer 43 may be greater than a density of the electrical connections 4270 under the electrical component 427. That is, a pitch between the electrical connections 4320 is smaller than a pitch between the electrical connections 4270. Further, a density of the electrical connections 4320 in an area occupied by the interposer 43 is greater than a density of the electrical connections 4270 on the surface 422 of the sub-carrier 42.

Similarly, an amount of the electrical connections 4620 may be greater than the amount of the electrical connections 4770. Moreover, a density of the electrical connections 4620 under the interposer 46 may be greater than a density of the electrical connections 4770 under the electrical component 477. That is, a density of the electrical connections 4620 in an area occupied by the interposer 46 is greater than a density of the electrical connections 4770 on the surface 477 of the sub-carrier 47.

Figure 4E:
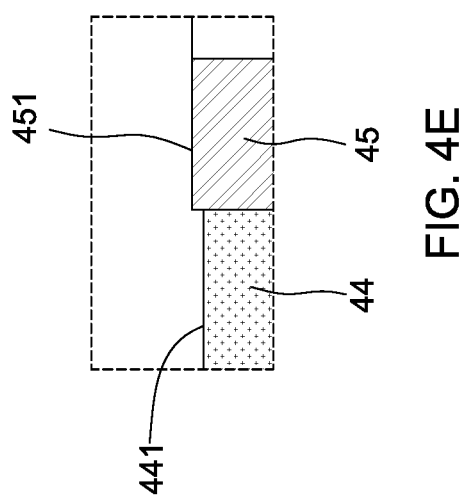
FIG. 4E illustrates an enlarged view of portion D3 in FIG. 4A.

In some embodiments of the present disclosure, the surface 441 of the encapsulant 44 may be recessed with respect to the surface 451 of the encapsulant 45 (referring to FIG. 4E). Similarly, in some embodiments of the present disclosure, the surface 491 of the encapsulant 49 may be recessed with respect to the surface 481 of the encapsulant 48.

FIG. 5A is a cross-sectional view of a semiconductor device package 5 in accordance with some embodiments of the present disclosure. As shown in FIG. 5A, the semiconductor device package 5 includes a main carrier 51, interposers 53 and a sub-carrier 52. In some embodiments, the main carrier 51 includes a substrate, which may include a redistribution structure 510. Referring to FIG. 5A, the main carrier 51 has a surface 511 (e.g., an upper surface), and the interposers 53 may be disposed on the surface 511 of the main carrier 51. In some embodiments, the sub-carrier 52 includes a substrate, which may include a redistribution structure 520. In some embodiments of the present disclosure, the sub-carrier 52 is a redistribution layer. The sub-carrier 52 is stacked on the interposers 53. The sub-carrier 52 has a surface 521 (e.g., an upper surface) facing away from the surface 511 of the main carrier 51 and a surface 522 (e.g., a lower surface) facing the surface 511 of the main carrier 51. A plurality of electrical connections 5310 configured to electrically connect the interposer 53 and the main carrier 51. In some embodiments of the present disclosure, the electrical connections 5310 are arranged between the interposer 53 and the surface 511 of the main carrier 51. In some embodiments of the present disclosure, the electrical connections 5310 abut the surface 511 of the main carrier 51. In some embodiments of the present disclosure, the electrical connections 5310 may include electrical pads, terminals, contacts and/or ports. Further, a plurality of electrical connections 5320 are configured to electrically connect the interposer 53 and the sub-carrier 52. In some embodiments of the present disclosure, the electrical connections 5320 are arranged between the interposer 53 and the surface 522 of the sub-carrier 52. In some embodiments of the present disclosure, the electrical connections 5320 abut the surface 522 of the sub-carrier 52. In some embodiments of the present disclosure, the electrical connections 5320 may include electrical pads, terminals, contacts and/or ports. Given the above, the sub-carrier 52 may be electrically connected to the main carrier 11 through the interposers 53.

Referring to FIG. 5A, electronic component(s) 517 may be disposed or mounted on the portion of the surface 511 of the main carrier and covered by the sub-carrier 52. In some embodiments of the present disclosure, the electronic component 517 is a passive device. In some embodiments of the present disclosure, the electronic component 517 is a ceramic-based device. In some embodiments of the present disclosure, the electronic component 517 is a capacitor. A plurality of electrical connections 5170 are configured to electrically connect the electronic component 517 and the main carrier 51. In some embodiments of the present disclosure, the electrical connection 5170 are arranged between the electronic component 517 and the surface 511 of the main carrier 51. In some embodiments of the present disclosure, the electrical connection 5170 abut the surface 511 of the main carrier 51. In some embodiments of the present disclosure, the electrical connection 5170 may include electrical pads, terminals, contacts and/or ports.

Further, electronic component(s) 527 may be disposed or mounted on the surface 522 of the sub-carrier 52. In some embodiments of the present disclosure, the electronic component 527 is a passive device. In some embodiments of the present disclosure, the electronic component 527 is a ceramic-based device. In some embodiments of the present disclosure, the electronic component 527 is a capacitor. A plurality of electrical connections 5270 are configured to electrically connect the electronic component 527 and the sub-carrier 52. In some embodiments of the present disclosure, the electrical connection 5270 are arranged between the electronic component 527 and the surface 522 of the sub-carrier 52. In some embodiments of the present disclosure, the electrical connection 5270 abut the surface 522 of the sub-carrier 52. In some embodiments of the present disclosure, the electrical connection 5270 may include an electrical pad, terminal, contact and/or port.

Referring to FIG. 5A, electronic component(s) 523 may be disposed or mounted on the surface 521 of the sub-carrier 52. In some embodiments of the present disclosure, the electronic component 523 is an active device. In some embodiments of the present disclosure, the electronic component 523 is a silicon-based device. In some embodiments of the present disclosure, a non-active side of the electronic component 523 faces away from the surface 521 of the sub-carrier 52. A plurality of electrical connections 5230 are configured to electrically connect the electronic component 523 and the sub-carrier 52. In some embodiments of the present disclosure, the electrical connection 5230 are arranged between the electronic component 523 and the surface 521 of the sub-carrier 52. In some embodiments of the present disclosure, the electrical connection 5230 abut the surface 521 of the sub-carrier 52. In some embodiments of the present disclosure, the electrical connections 5230 may include electrical pads, terminals, contacts and/or ports. In some embodiments of the present disclosure, the amount of the electrical connections 5230 is greater than an amount of the electrical connections 5170. In some embodiments of the present disclosure, the amount of the electrical connections 5230 is greater than an amount of the electrical connections 5270.

Referring to FIG. 5A, an encapsulant 55 (i.e., package body) is disposed on the surface 521 of the sub-carrier 52. The encapsulant 55 may cover the surface 521 of the sub-carrier 52 and the electronic component(s) 523 disposed on the surface 521 of the sub-carrier 52. The encapsulant 15 may include molding compounds, such as a Novolac-based resin, an epoxy-based resin, a silicone-based resin, or other another suitable encapsulant; fillers such as silicon oxide fillers, may be included in the molding compound. In addition, the encapsulant 55 may include a molding underfill (MUF) or a capillary underfill (CUF). As shown in FIG. 5A, the encapsulant 55 may have a substantially flat surface 551 (e.g., an upper surface) facing away from the surface 521 of the sub-carrier. The electronic component 523 may have a substantially flat surface 5231 (e.g., an upper surface) facing away from the surface 521 of the sub-carrier 52. The surface 5231 of the electronic component 523 is exposed from the surface 551 of the encapsulant 55. In some embodiments of the present disclosure, the surface 5231 of the electronic component 523 is coplanar with the surface 551 of the encapsulant 55.

Further, an encapsulant 54 (i.e., package body) is disposed on the surface 111 of the main carrier 51. The encapsulant 54 may cover the surface 511 of the main carrier 51 and the electronic component(s) 57 disposed on the surface 511 of the main carrier 51, the interposers 53, the electronic component(s) 527 disposed on the surface 522 of the sub-carrier 52, the sub-carrier 52 and the encapsulant 55. The encapsulant 54 may include molding compounds, such as a Novolac-based resin, an epoxy-based resin, a silicone-based resin, or other another suitable encapsulant; fillers such as silicon oxide fillers, may be included in the molding compound. In addition, the encapsulant 54 may include a molding underfill (MUF) or a capillary underfill (CUF). The encapsulant 54 may have a substantially flat surface 541 (e.g., an upper surface) facing away from the surface 511 of the main-carrier 51. In some embodiments of the present disclosure, the surface 541 of the encapsulant 54 is substantially coplanar with the surface 551 of the encapsulant 55. In some embodiments of the present disclosure, the surface 541 of the encapsulant 54 is recessed with respect to the surface 551 of the encapsulant 55.

Figure 5B:
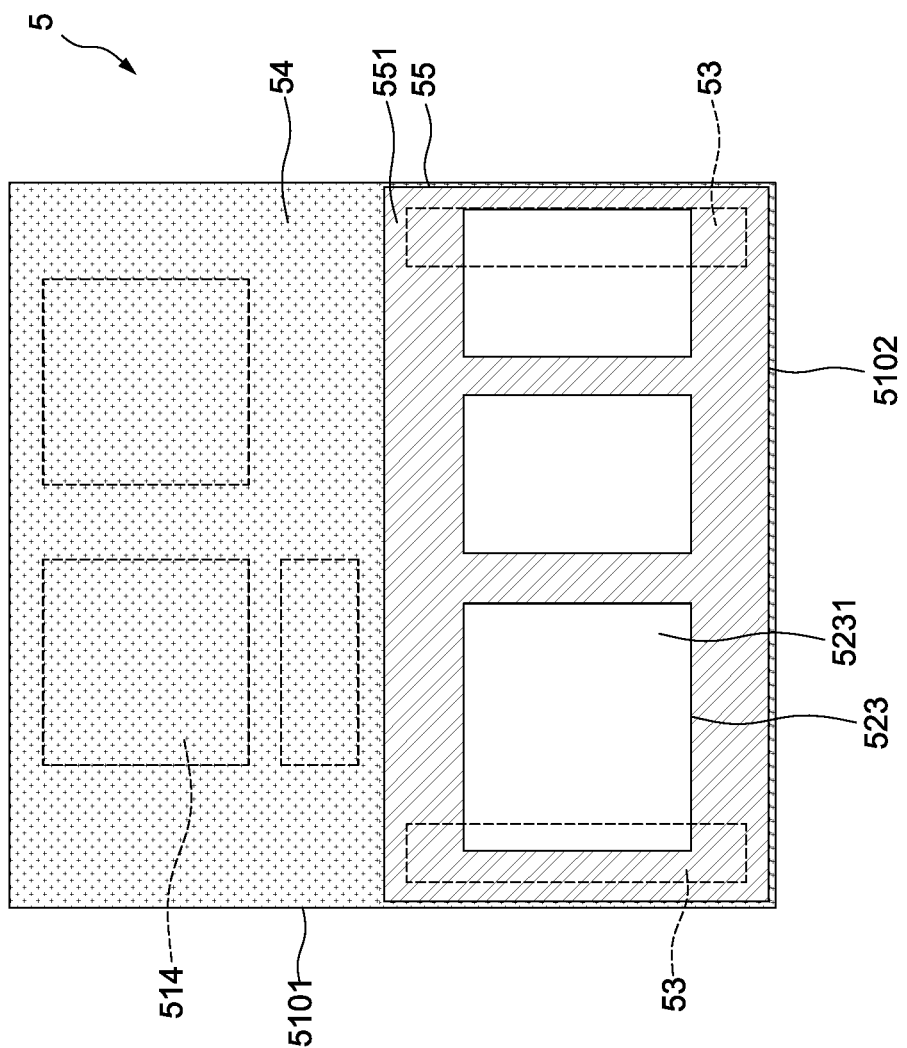
FIG. 5B is a top view of a semiconductor device package in accordance with an embodiment of the instant disclosure.

FIG. 5B illustrates a top view of a semiconductor device package 5 in accordance with some embodiments of the present disclosure. Referring to FIG. 5B, an area of the encapsulant 54 is greater than an area the encapsulant 55. The surface 5231 of the electronic component 523 may be exposed from the surface 551 of the encapsulant 55.

Further, the main carrier 51 may have a side 5101 and a side 5102 connecting the side 5101. In some embodiments of the present disclosure, a length of the side 5101 is greater than a length of the side 5102. The interposer 53 may extend along a direction which is substantially parallel to the side 5102 of the main carrier 51. That is, when the liquid encapsulant 54 is provided on the main carrier 51, the interposer 53 is arranged to extend along a direction which is parallel to the flow of the liquid encapsulant 54.

Further, referring to FIG. 5B, a portion of the main carrier 11 is not covered by the sub-carrier 52 and the encapsulant 55. Electronic component(s) 514 may be disposed or mounted on the portion of the main carrier 51, which is not covered by the sub-carrier 52 and the encapsulant 55. The electronic component(s) 514 may be encapsulated by the encapsulant 54. In some embodiments of the present disclosure, the electronic component 514 is a passive device. In some embodiments of the present disclosure, the electronic component 514 is a ceramic-based device. In some embodiments of the present disclosure, the electronic component 514 is a Power Management IC (PMIC). In some embodiments of the present disclosure, the electronic component 514 is a capacitor. In some embodiments of the present disclosure, a thickness of the electronic device 514 is greater than a thickness of the electronic device 517. In some embodiments of the present disclosure, the thickness of the electronic device 514 is greater than a thickness of the electronic device 527. In some embodiments of the present disclosure, the thickness of the electronic device 514 is greater than a height of the interposer 53.

FIG. 6A, FIG. 6B, FIG. 6C, FIG. 6D, FIG. 6E, FIG. 6F, FIG. 6G, FIG. 6H, FIG. 6I, FIG. 6J and FIG. 6K illustrate a method of manufacturing a semiconductor device package in accordance with another embodiment of the instant disclosure.

Figure 6A:
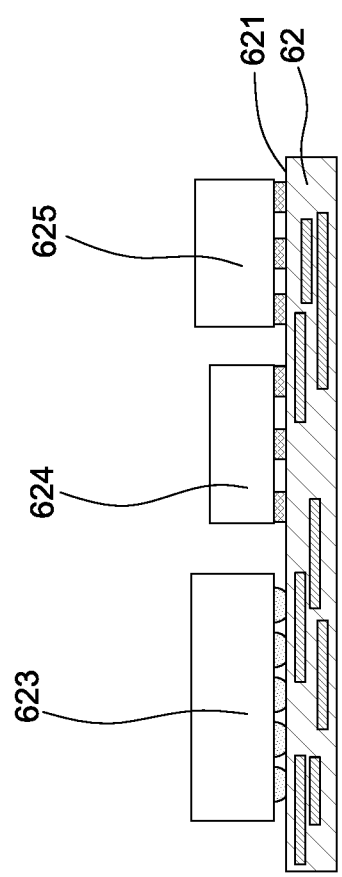
FIG. 6A, FIG. 6B, FIG. 6C, FIG. 6D, FIG. 6E, FIG. 6F, FIG. 6G, FIG. 6H, FIG. 6I, FIG. 6J and FIG. 6K illustrate a method of manufacturing a semiconductor device package in accordance with another embodiment of the instant disclosure.

Referring to FIG. 6A, a sub-carrier 62, which may include a redistribution structure, is provided. Electronic devices 623, 624 and 625 may be disposed or mounted on a surface 621 of the sub-carrier 62. In some embodiments of the present disclosure, the electronic component 623, 624, 625 is an active device. In some embodiments of the present disclosure, the electronic component 623, 624, 625 is a silicon-based device. In some embodiments of the present disclosure, a non-active side of the electronic component 623, 624, 625 faces away from the surface 621 of the sub-carrier 62.

Figure 6B:
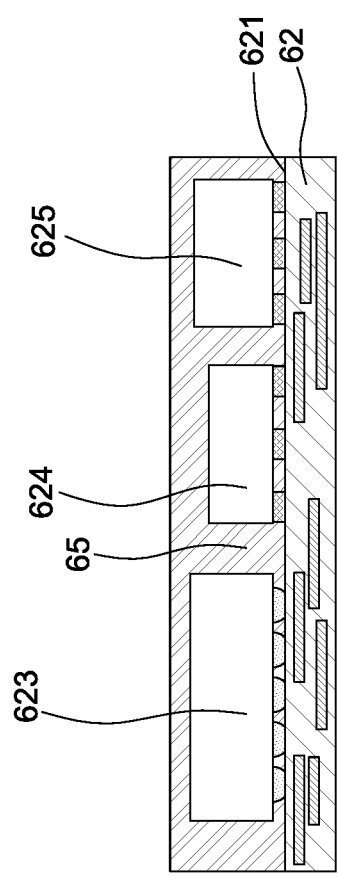

Referring to FIG. 6B, an encapsulant 65 is formed on the surface 621 of the sub-carrier 62. The encapsulant 65 is configured to cover the surface 621 of the sub-carrier and the electronic devices 623, 624 and 625.

Figure 6C:
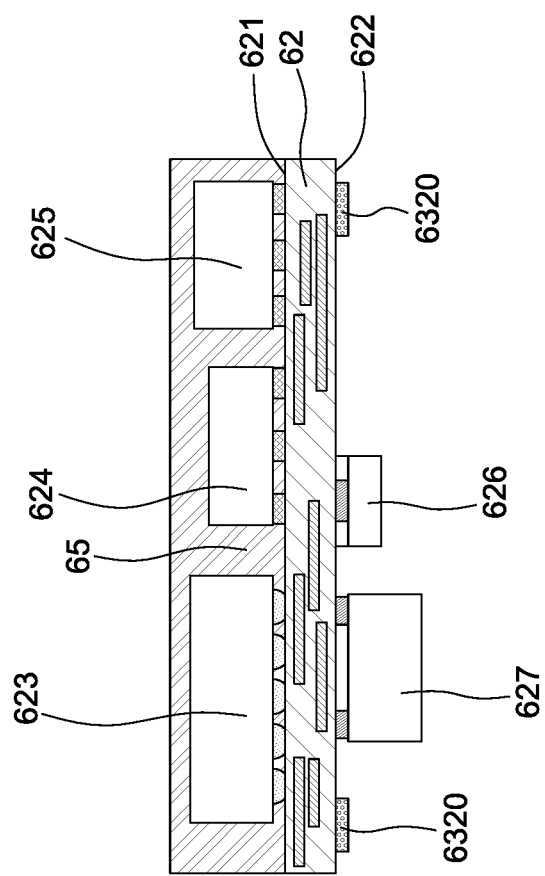

Referring to FIG. 6C, electronic devices 626 and 627 and the electrical connections 6320 may be disposed or mounted on a surface 622 of the sub-carrier 62, which is opposite to the surface 621.

Figure 6D:
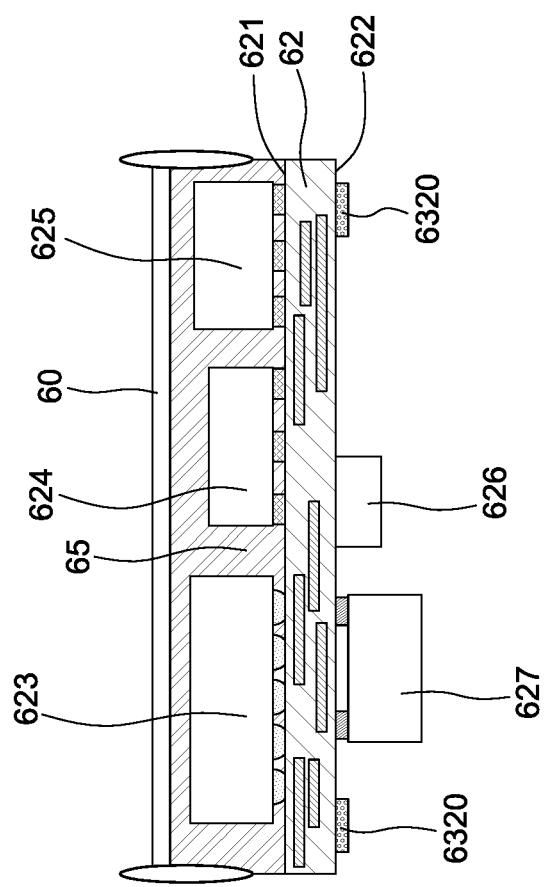

Referring to FIG. 6D, a singulation operation may be performed on the encapsulant 65 and the sub-carrier 62. The singulation operation may be performed by a tape saw and a tape 60 used for the tape saw may be disposed on the encapsulant 65. That is, the encapsulant 65 may be a support member and provides an upper surface such that the tape 60 used for singulation operation is mounted thereon.

Figure 6E:
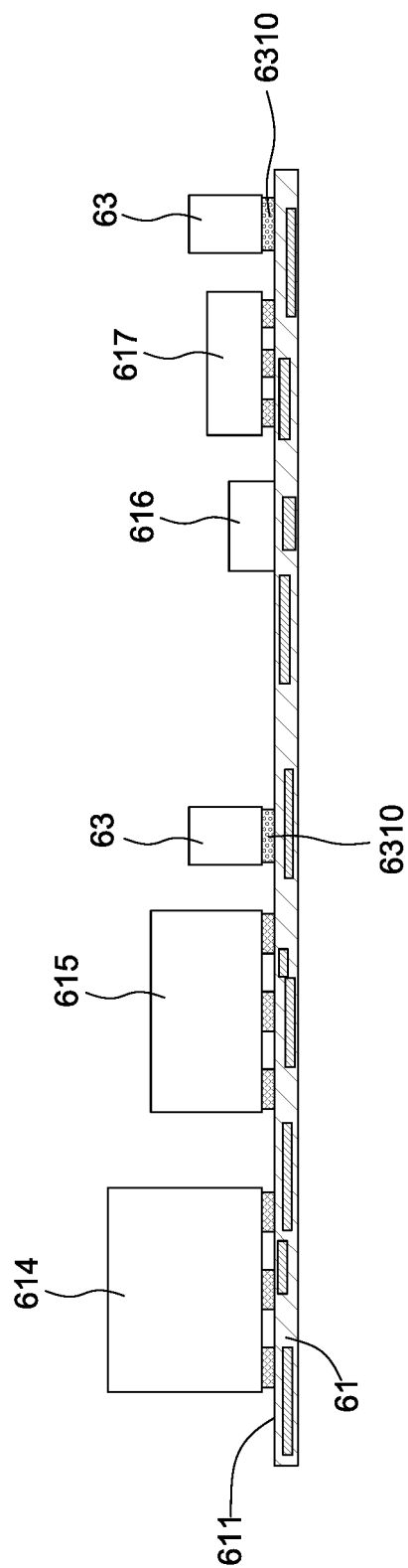

Referring to FIG. 6E, a main carrier 61, which may include a redistribution structure, is provided. Electronic devices 614, 615, 616 and 617 and interposers 63 may be disposed or mounted on a surface 611 of the main carrier 61. The interposer 63 may be electrically connected to the main carrier 61 via electrical connections 6310. In some embodiments of the present disclosure, the electronic component 614, 615, 616, 617 is a passive device. In some embodiments of the present disclosure, the electronic component 614, 615, 616, 617 is a ceramic-based device. In some embodiments of the present disclosure, the electronic component 614, 615 is a Power Management IC (PMIC). In some embodiments of the present disclosure, the electronic component 614, 615, 616, 617 is a capacitor. In some embodiments, a thickness of the electronic device 614, 615 is greater than a thickness of the electronic devices 616 and 617. In some embodiments of the present disclosure, the thickness of the electronic device 614, 615 is greater than a height of the interposer 63.

Figure 6F:
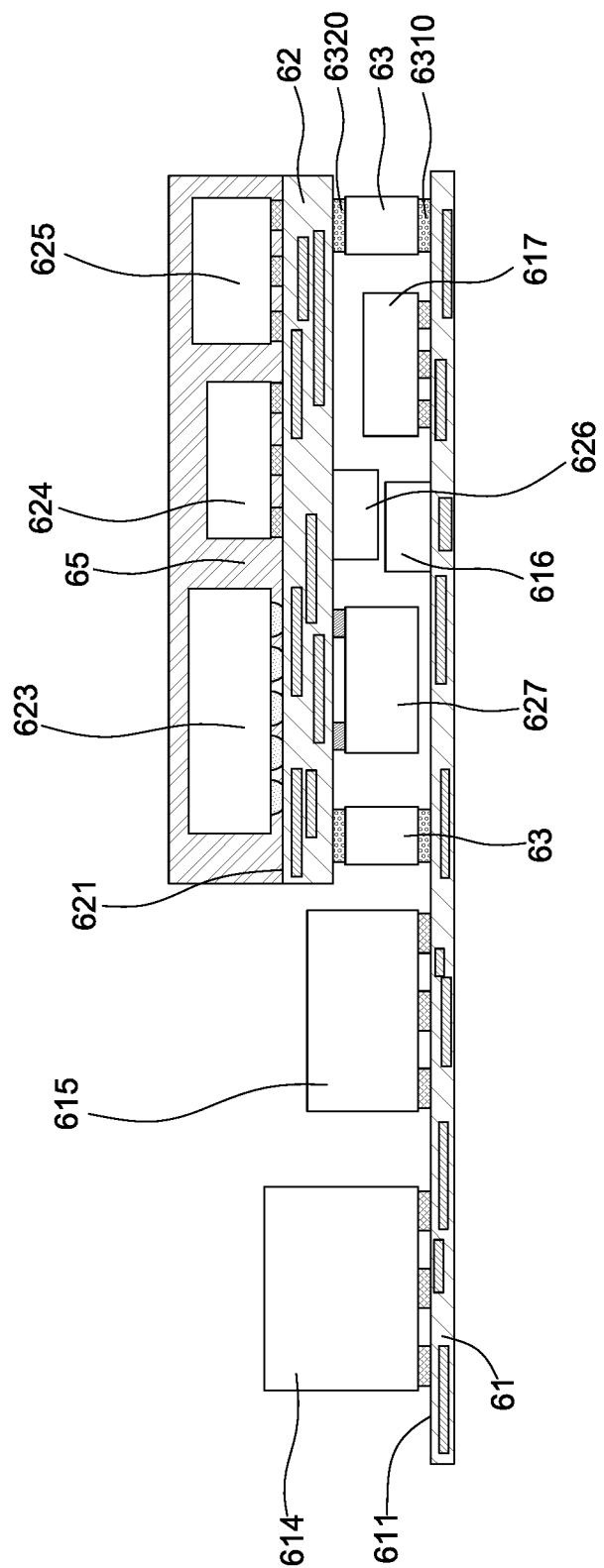

Referring to FIG. 6F, the sub-carrier 62 with the electronic devices 623, 624, 625, 626 and 627 and the encapsulant 65 is stacked on the interposers 63 such that the sub-carrier 62 is disposed over the main carrier 61. The electrical connections 6320 mounted on the surface 622 of the sub-carrier 62 is substantially aligned with the interposers 63 and connected to the interposers 63. As shown in FIG. 6F, a portion of the main carrier 61 may be covered by the sub-carrier 62. The electronic devices 616 and 617 may be disposed on the portion of the main carrier 61, which is covered by the sub-carrier 62, and thus may be disposed underneath the sub-carrier 62, and the electronic devices 614 and 615 may be disposed on another portion of the main carrier 61, which is not covered by the sub-carrier 62.

Figure 6G:
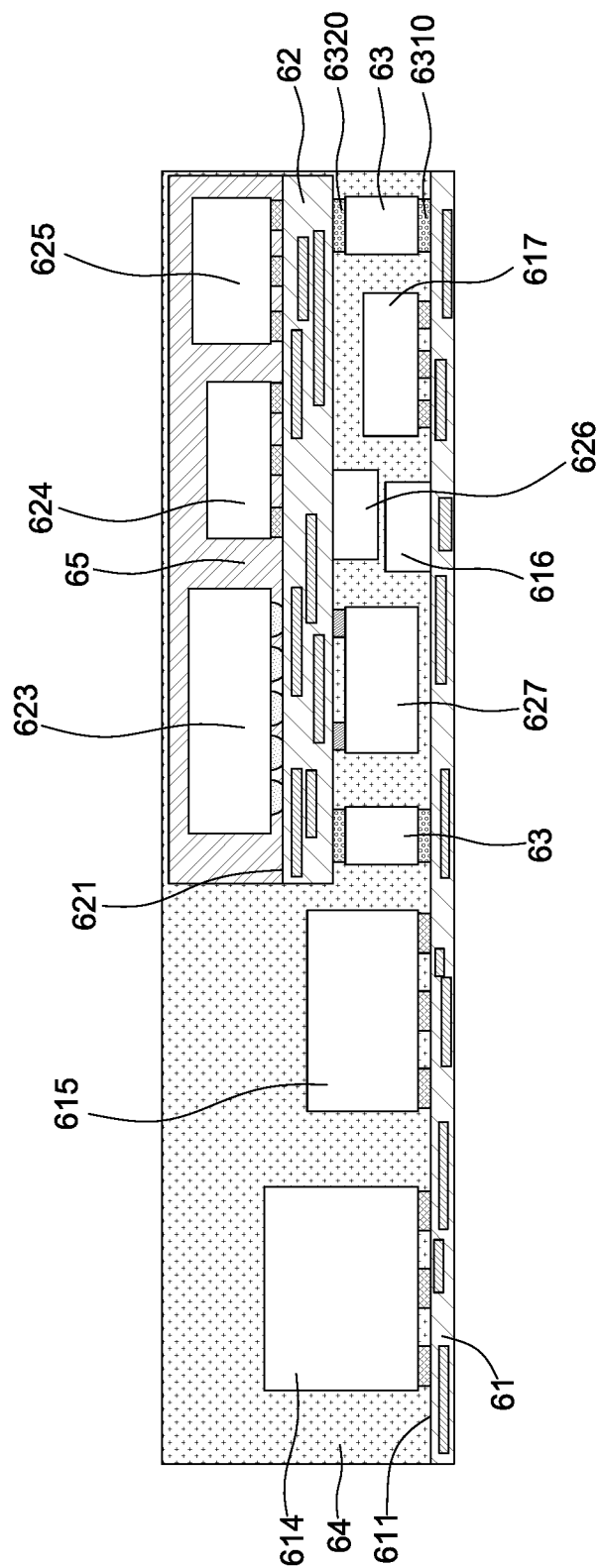

Referring to FIG. 6G, an encapsulant 64 is formed on the surface 611 of the main carrier 61. The encapsulant 64 is configured to cover the surface 611 of the main carrier 61, the electronic devices 614, 615, 616, 617, 626 and 627, the interposers 63, the sub-carrier 62 and the encapsulant 65.

Figure 6H:
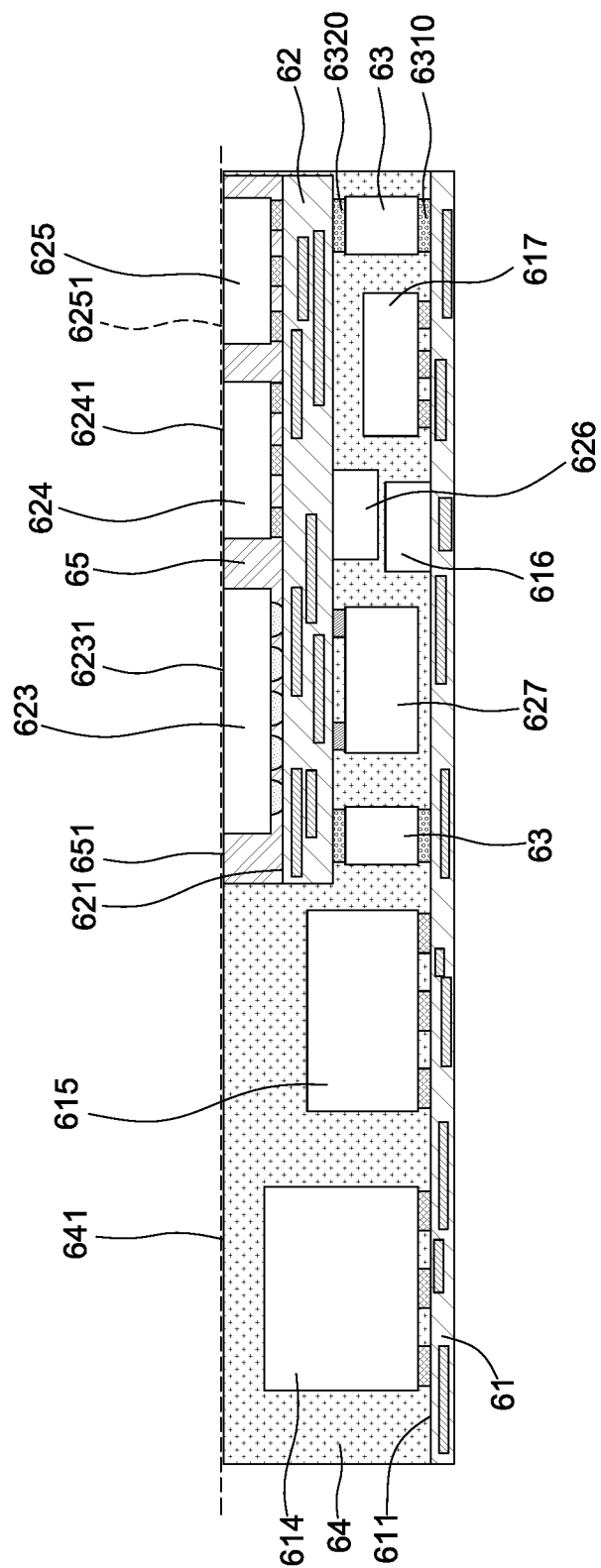

Referring to FIG. 6H, a portion of the encapsulant 64, a portion of the encapsulant 65 and portions of the electrical connections 623, 624, 625 are removed by, for example, a grinding operation. After the grinding operation, the encapsulant 64 may have an upper surface 641, and the encapsulant 65 may have an upper surface 651, and the electronic device 623 may have an upper surface 6231, and the electronic device 624 may have an upper surface 6241, and the electronic device 625 may have an upper surface 6251. The surface 641 of the encapsulant 64 may be coplanar with the surface 651 of the encapsulant 65. The surfaces 6231, 6241 and 6251 of the electronic devices 623, 624 and 625 may be exposed from the surface 651 of the encapsulant 65.

Figure 6I:
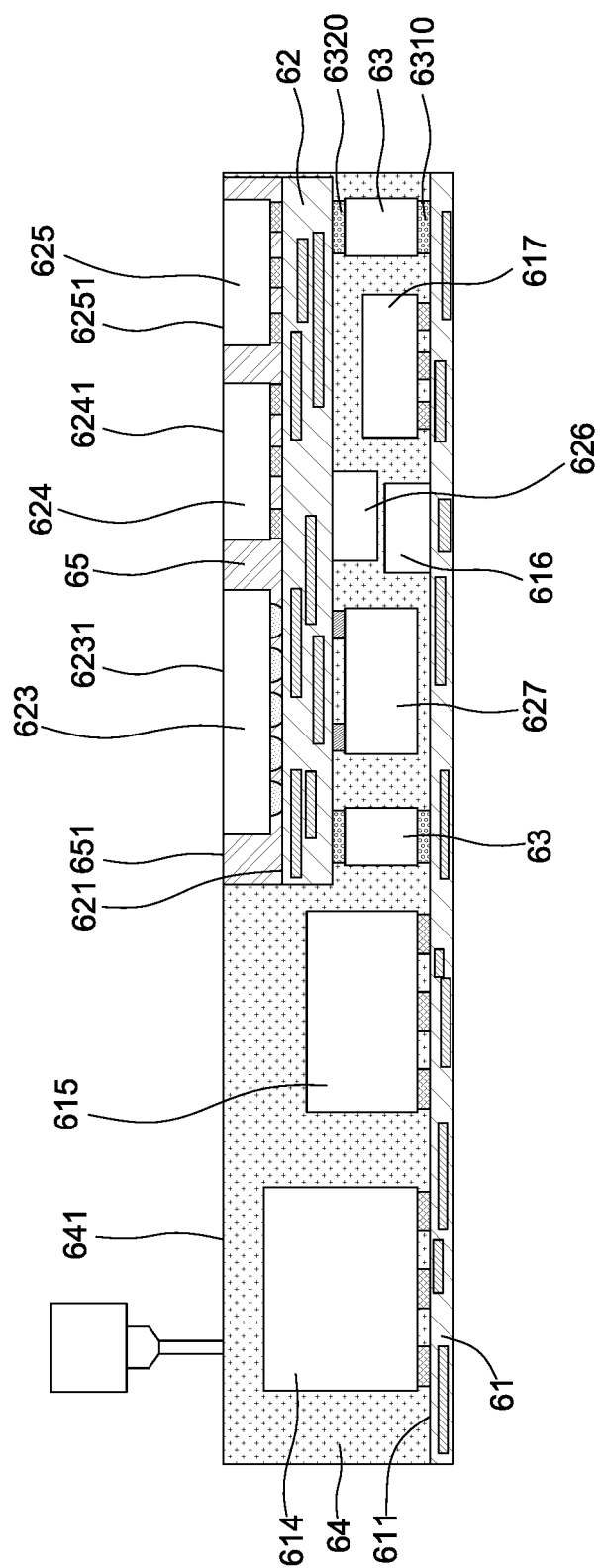

Referring to FIG. 6I, a laser marking process is performed.

Figure 6J:
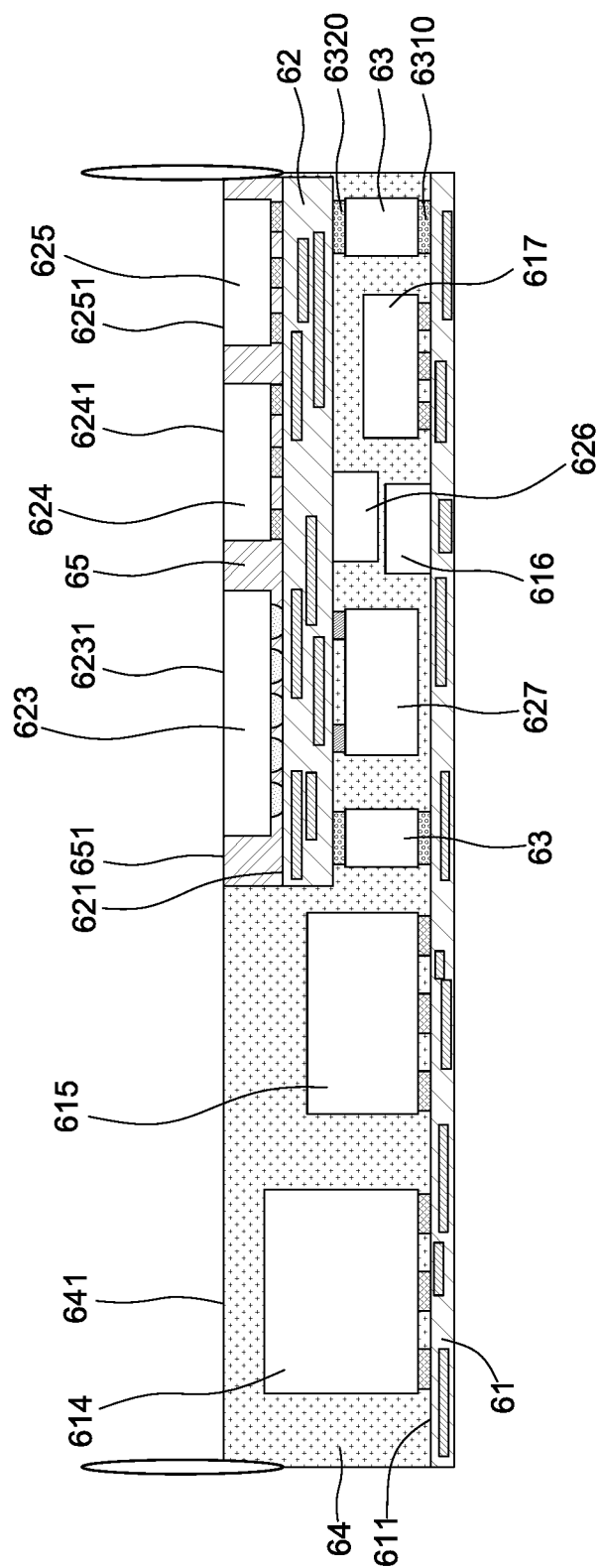

Referring to FIG. 6J, a singulation operation is performed on the encapsulant 64 and the main carrier 61.

Figure 6K:
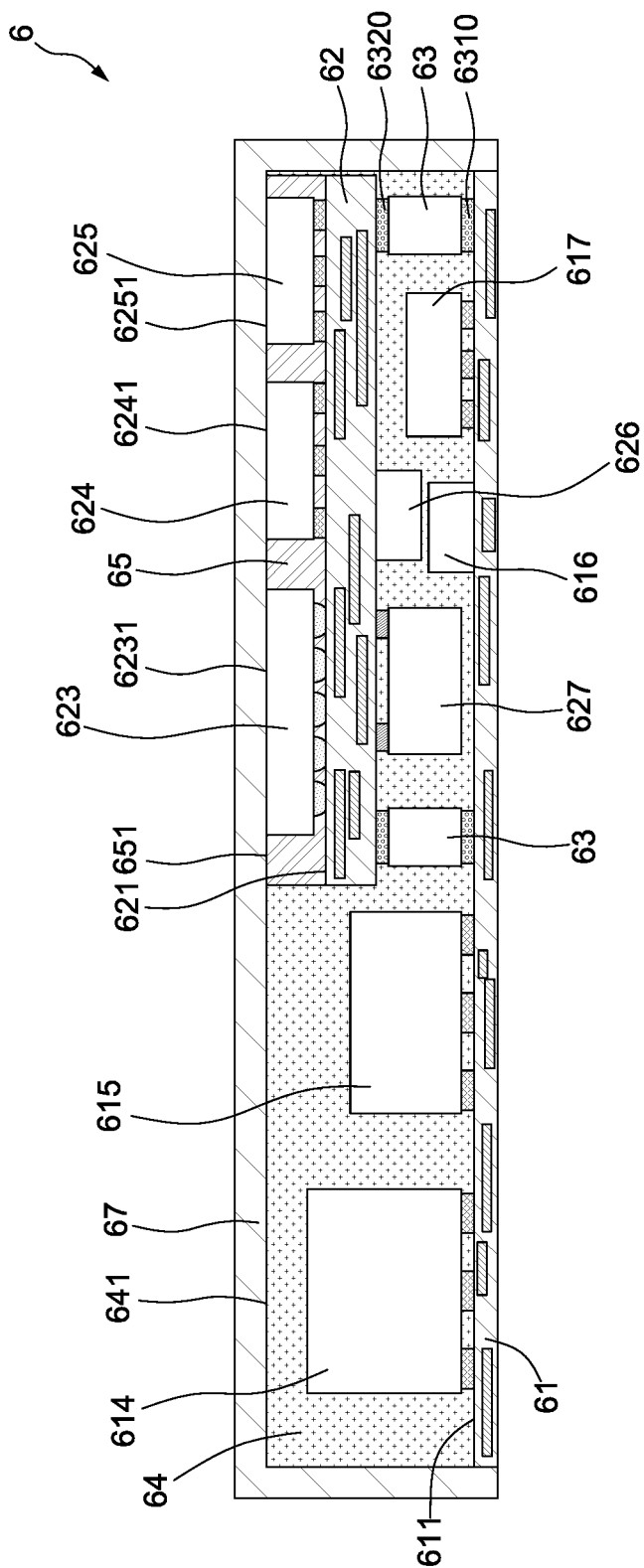

Referring to FIG. 6K, a shielding layer 67 is formed. The shielding layer 67 is configured to cover the encapsulants 64, 65, the main carrier 61 and the sub-carrier 62.

After the manufacturing process as shown in FIG. 6A, FIG. 6B, FIG. 6C, FIG. 6D, FIG. 6E, FIG. 6F, FIG. 6G, FIG. 6H, FIG. 6I, FIG. 6J and FIG. 6K, the semiconductor device package 6 is formed (see FIG. 6K). In some embodiments of the present disclosure, the semiconductor device package 6 is the same as, or similar to, the semiconductor device package 1 shown in FIG. 1A.

FIG. 7A, FIG. 7B, FIG. 7C, FIG. 7D, FIG. 7E, FIG. 7F, FIG. 7G, FIG. 7H, FIG. 7I, FIG. 7J, FIG. 7K and FIG. 7L illustrate a method of manufacturing a semiconductor device package in accordance with another embodiment of the instant disclosure.

Figure 7A:
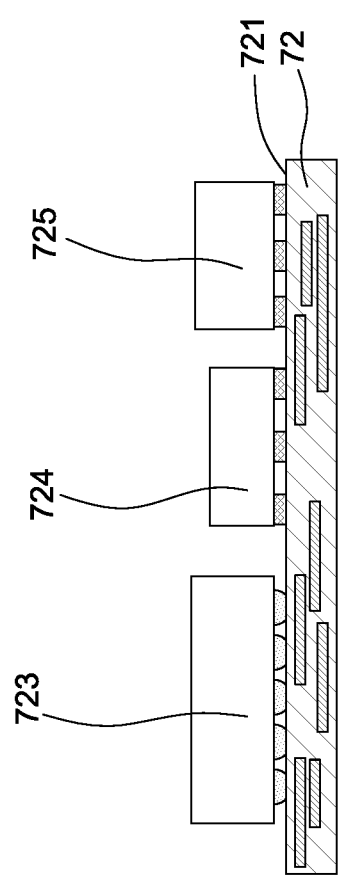

Referring to FIG. 7A, a sub-carrier 72, which may include a redistribution structure, is provided. Electronic devices 723, 724 and 725 may be disposed or mounted on a surface 721 of the sub-carrier 72. In some embodiments of the present disclosure, the electronic component 723, 724, 725 is an active device. In some embodiments of the present disclosure, the electronic component 723, 724, 725 is a silicon-based device. In some embodiments of the present disclosure, a non-active side of the electronic component 723, 724, 725 faces away from the surface 721 of the sub-carrier 72.

Figure 7B:
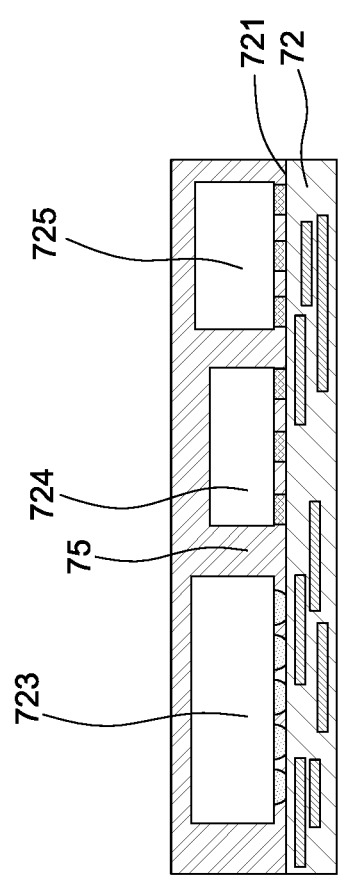

Referring to FIG. 7B, an encapsulant 75 is formed on the surface 721 of the sub-carrier 72. The encapsulant 75 is configured to cover the surface 721 of the sub-carrier and the electronic devices 723, 724 and 725.

Figure 7C:
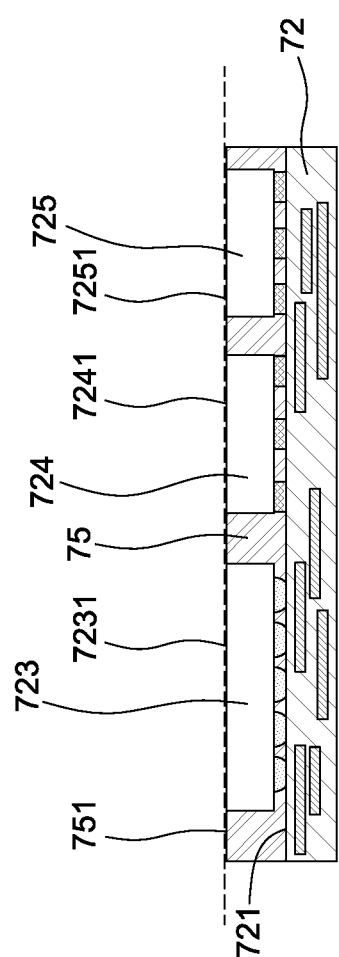

Referring to FIG. 7C, a portion of the encapsulant 75 and portions of the electrical connections 723, 724, 725 are removed by, for example, a grinding operation. After the grinding operation, the encapsulant 75 may have an upper surface 751, and the electronic device 723 may have an upper surface 7231, and the electronic device 724 may have an upper surface 7241, and the electronic device 725 may have an upper surface 7251. The surfaces 7231, 7241 and 7251 of the electronic devices 723, 724 and 725 may be exposed from the surface 751 of the encapsulant 75.

Figure 7D:
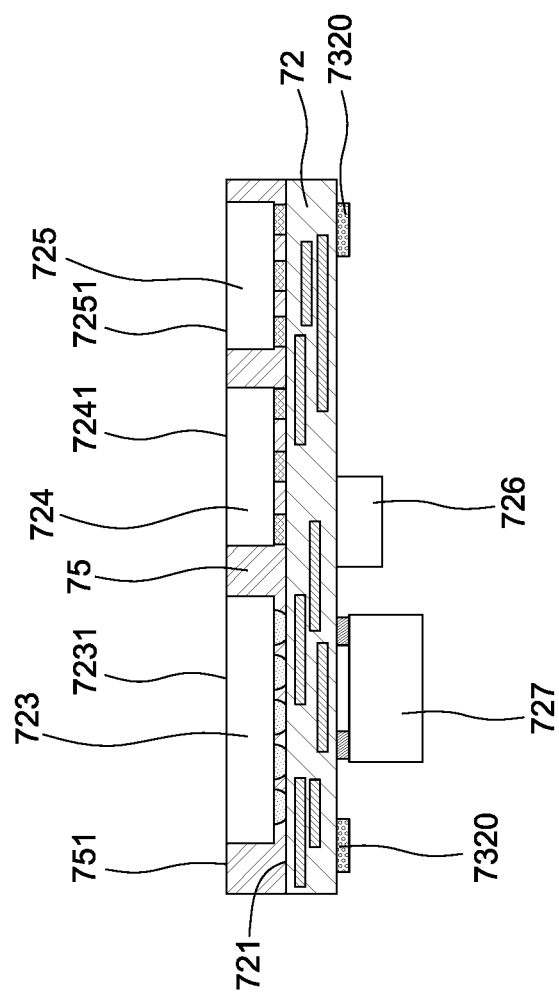

Referring to FIG. 7D, electronic devices 726 and 727 and the electrical connections 7320 may be disposed or mounted on a surface 722 of the sub-carrier 62, which is opposite to the surface 721.

Figure 7E:
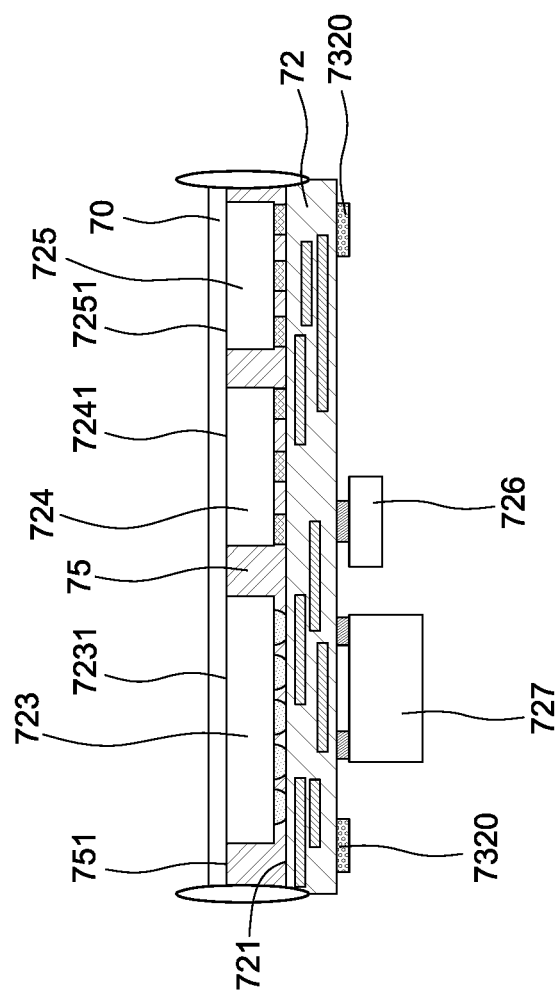

Referring to FIG. 7E, a singulation operation may be performed on the encapsulant 75 and the sub-carrier 72. The singulation operation may be performed by a tape saw and a tape 70 used for the tape saw may be disposed on the encapsulant 75. That is, the encapsulant 75 may be a support member and provides an upper surface such that the tape 70 used for singulation operation is mounted thereon.

Figure 7F:
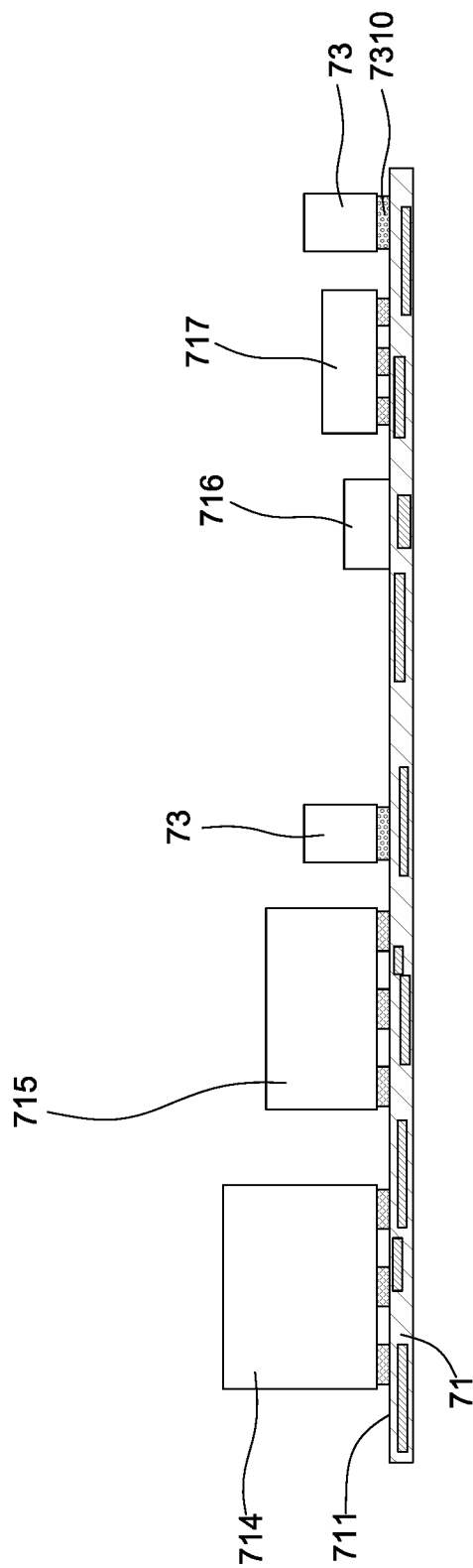

Referring to FIG. 7F, a main carrier 71, which may include a redistribution structure, is provided. Electronic devices 714, 715, 716 and 717 and interposers 73 may be disposed or mounted on a surface 711 of the main carrier 71. The interposer 73 may be electrically connected to the main carrier 71 via electrical connections 7310. In some embodiments of the present disclosure, the electronic component 714, 715, 716, 717 is a passive device. In some embodiments of the present disclosure, the electronic component 714, 715, 716, 717 is a ceramic-based device. In some embodiments of the present disclosure, the electronic component 714, 715 is a Power Management IC (PMIC). In some embodiments of the present disclosure, the electronic component 714, 715, 716, 717 is a capacitor. In some embodiments, a thickness of the electronic device 714, 715 is greater than a thickness of the electronic devices 716 and 717. In some embodiments of the present disclosure, the thickness of the electronic device 714, 715 is greater than a height of the interposer 73.

Figure 7G:
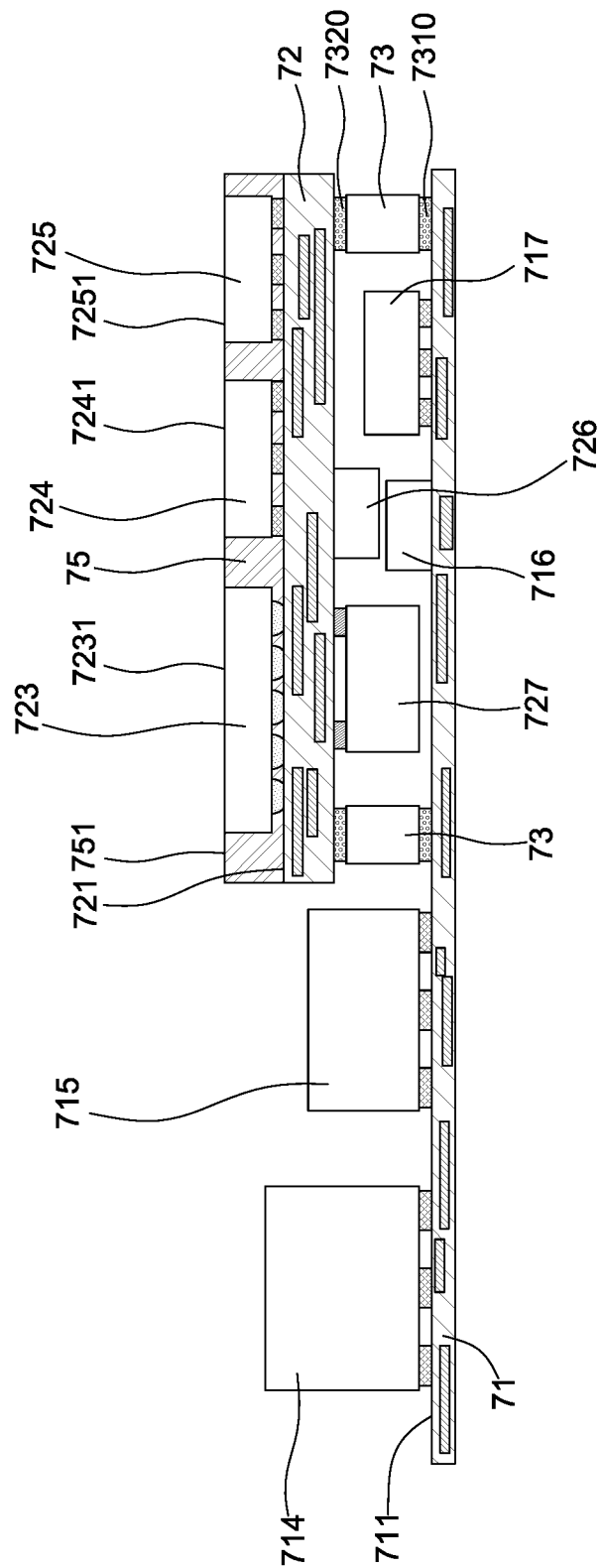

Referring to FIG. 7G, the sub-carrier 72 with the electronic devices 723, 724, 725, 726 and 727 and the encapsulant 75 is stacked on the interposers 73 such that the sub-carrier 72 is disposed over the main carrier 71. The electrical connections 7320 mounted on the surface 722 of the sub-carrier 72 is substantially aligned with the interposers 73 and connected to the interposers 73. As shown in FIG. 7G, a portion of the main carrier 71 may be covered by the sub-carrier 72. The electronic devices 716 and 717 may be disposed on the portion of the main carrier 71, which is covered by the sub-carrier 72, and thus may be disposed underneath the sub-carrier 72, and the electronic devices 714 and 715 may be disposed on another portion of the main carrier 71, which is not covered by the sub-carrier 72.

Figure 7H:
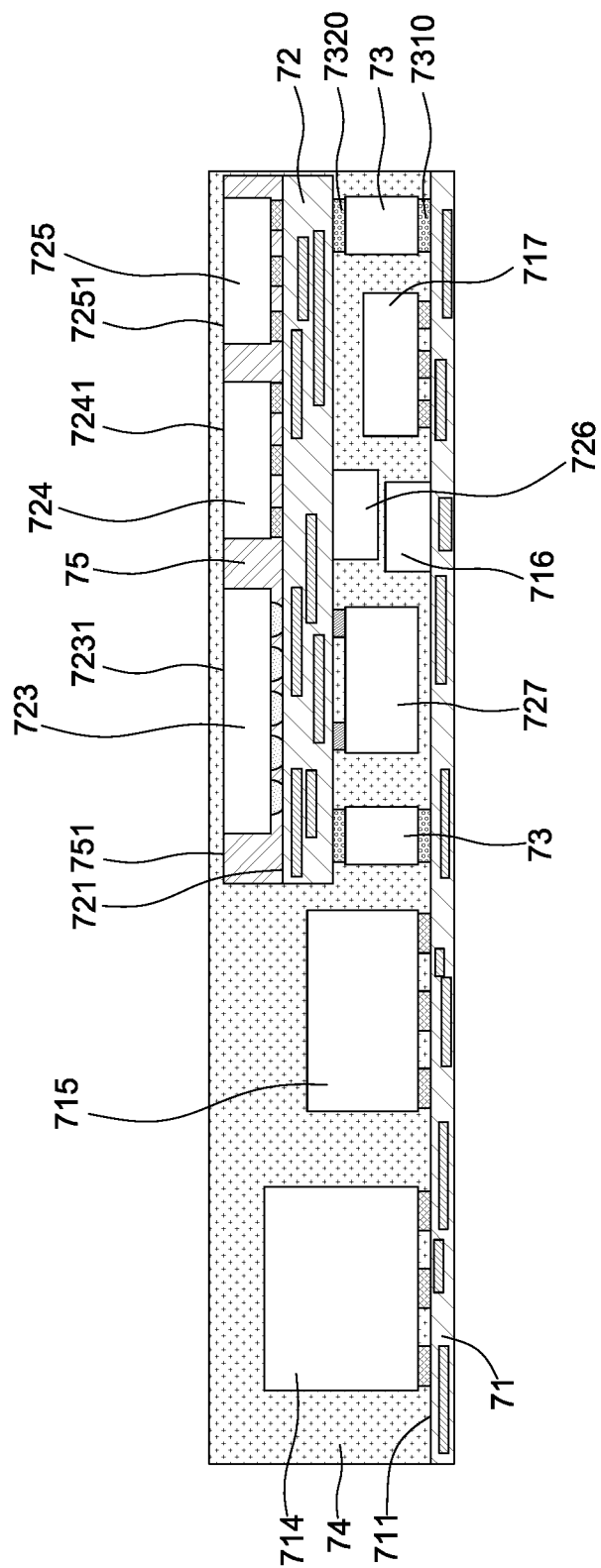
Figure 71:
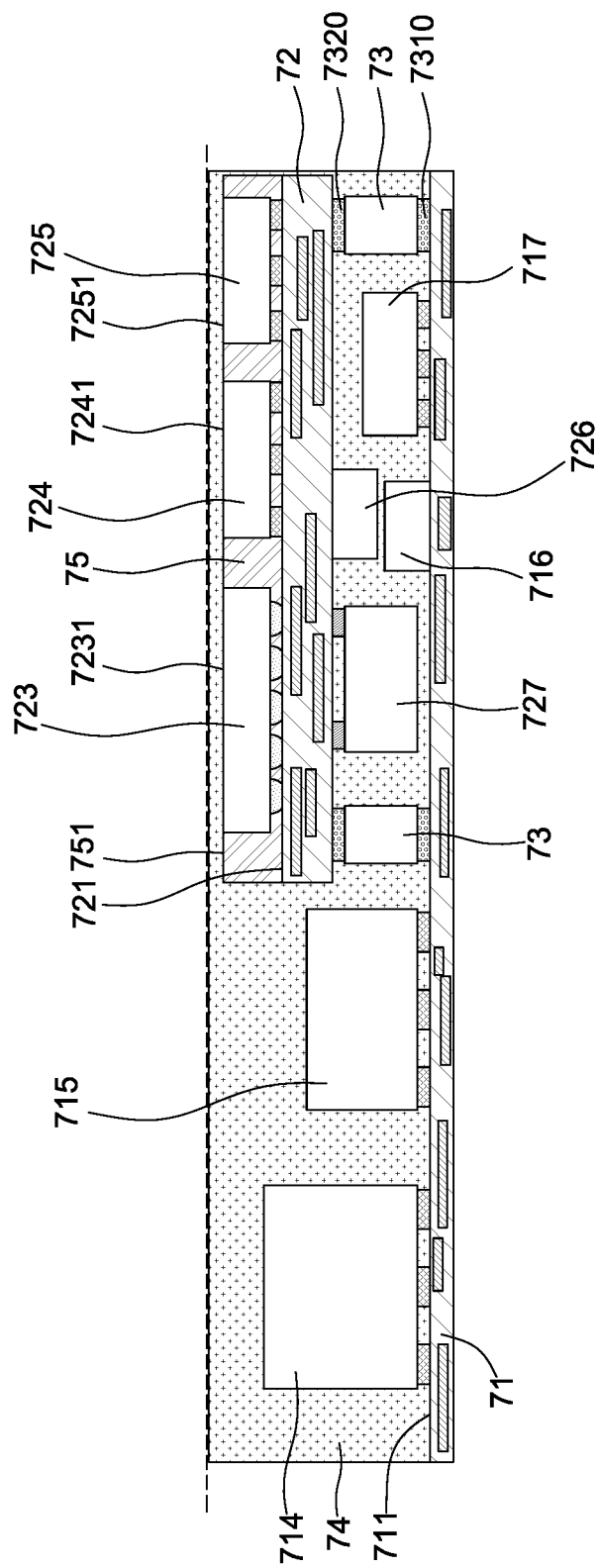

Referring to FIG. 7H, an encapsulant 74 is formed on the surface 711 of the main carrier 71. The encapsulant 74 is configured to cover the surface 711 of the main carrier 71, the electronic devices 714, 715, 716, 717, 726 and 727, the interposers 73, the sub-carrier 72 and the encapsulant 75. As shown in FIG. 7H, the surface 751 of the encapsulant 75 is covered by the encapsulant 74.

Referring to 7I, a portion of the encapsulant 75 is removed by, for example, a grinding operation. After the grinding operation, the encapsulant 75 still covers the surface 751 of the encapsulant 75.

Figure 7J:
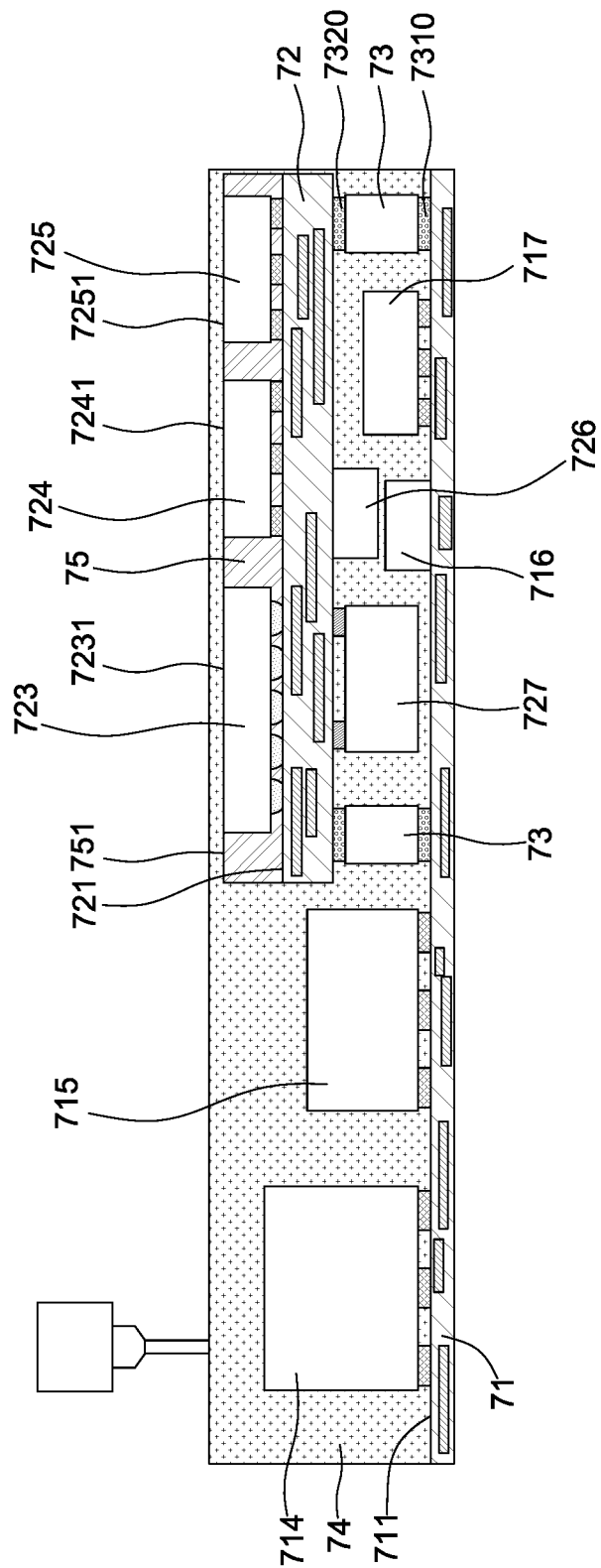

Referring to FIG. 7J, a laser marking process is performed.

Figure 7K:
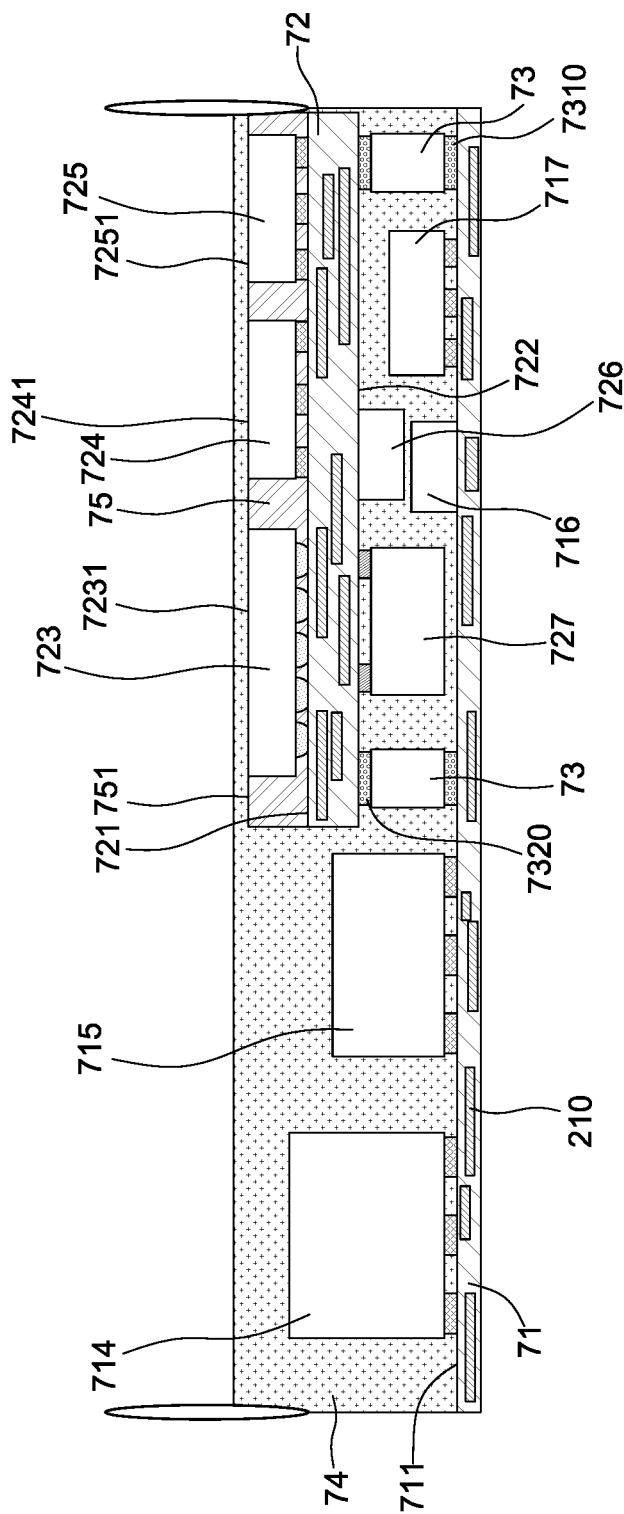
FIG. 7K and FIG. 7L illustrate a method of manufacturing a semiconductor device package in accordance with another embodiment of the instant disclosure.

Referring to FIG. 7K, a singulation operation is performed on the encapsulant 74 and the main carrier 71.

Figure 7L:
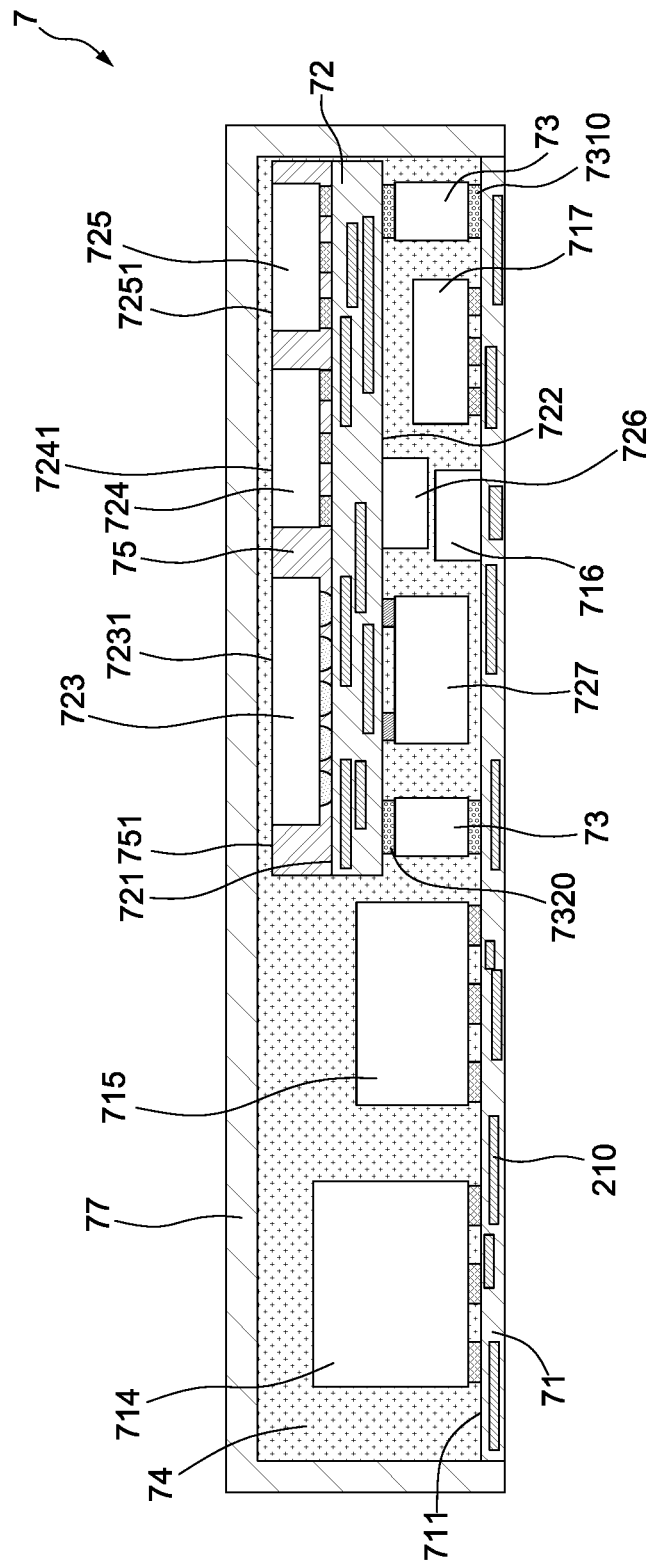

Referring to FIG. 7L, a shielding layer 77 is formed. The shielding layer 77 is configured to cover the encapsulants 74, 75, the main carrier 71 and the sub-carrier 72.

After the manufacturing process as shown in FIG. 7A, FIG. 7B, FIG. 7C, FIG. 7D, FIG. 7E, FIG. 7F, FIG. 7G, FIG. 7H, FIG. 7I, FIG. 7J, FIG. 7K and FIG. 7L, the semiconductor device package 7 is formed (see FIG. 7L). In some embodiments of the present disclosure, the semiconductor device package 7 is the same as, or similar to, the semiconductor device package 2 shown in FIG. 2A.

FIG. 8A, FIG. 8B, FIG. 8C, FIG. 8D, FIG. 8E, FIG. 8F, FIG. 8G, FIG. 8H, FIG. 8I, FIG. 8J and FIG. 8K illustrate a method of manufacturing a semiconductor device package in accordance with another embodiment of the instant disclosure.

Figure 8A:
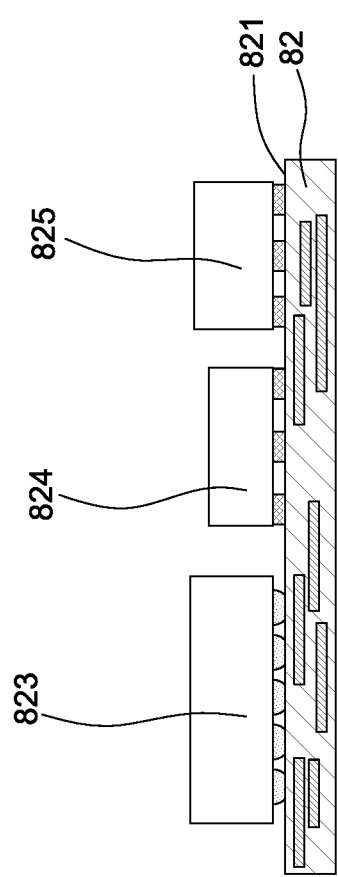
FIG. 8A, FIG. 8B, FIG. 8C, FIG. 8D, FIG. 8E, FIG. 8F, FIG. 8G, FIG. 8H, FIG. 8I, FIG. 8J and FIG. 8K illustrate a method of manufacturing a semiconductor device package in accordance with another embodiment of the instant disclosure.

Referring to FIG. 8A, a sub-carrier 82, which may include a redistribution structure, is provided. Electronic devices 823, 824 and 825 may be disposed or mounted on a surface 821 of the sub-carrier 82. In some embodiments of the present disclosure, the electronic component 823, 824, 825 is an active device. In some embodiments of the present disclosure, the electronic component 823, 824, 825 is a silicon-based device. In some embodiments of the present disclosure, a non-active side of the electronic component 823, 824, 825 faces away from the surface 821 of the sub-carrier 82.

Figure 8B:
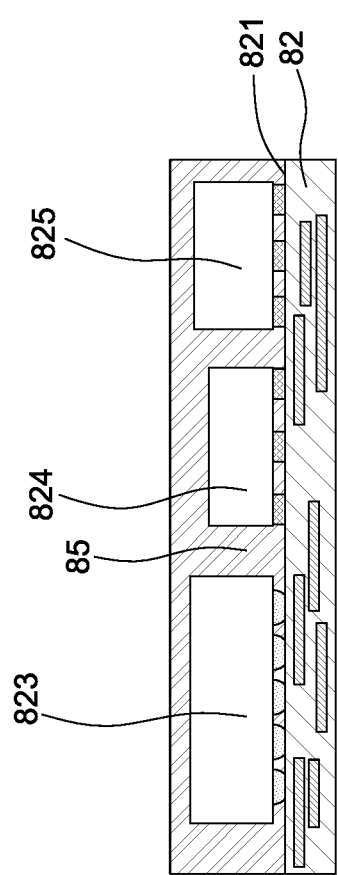

Referring to FIG. 8B, an encapsulant 85 is formed on the surface 821 of the sub-carrier 82. The encapsulant 85 is configured to cover the surface 821 of the sub-carrier and the electronic devices 823, 824 and 825.

Figure 8C:
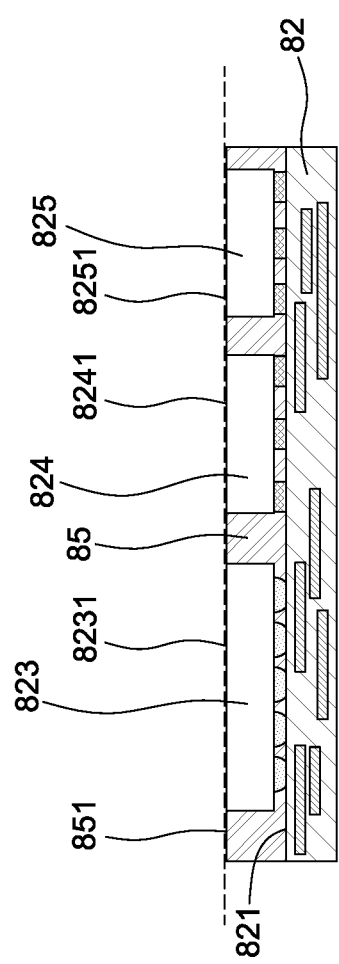

Referring to FIG. 8C, a portion of the encapsulant 85 and portions of the electrical connections 823, 824, 825 are removed by, for example, a grinding operation. After the grinding operation, the encapsulant 85 may have an upper surface 851, and the electronic device 823 may have an upper surface 8231, and the electronic device 824 may have an upper surface 8241, and the electronic device 825 may have an upper surface 8251. The surfaces 8231, 8241 and 8251 of the electronic devices 823, 824 and 825 may be exposed from the surface 851 of the encapsulant 85.

Figure 8D:
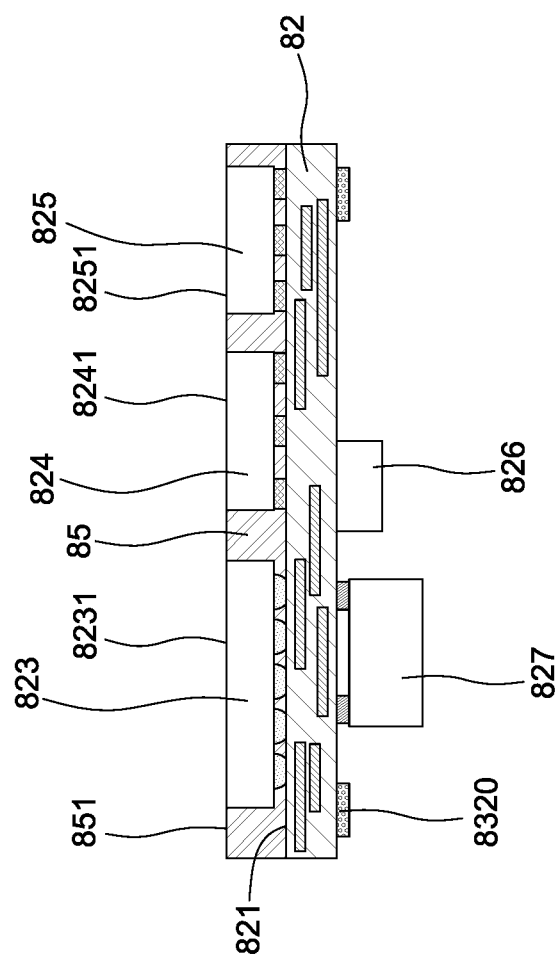

Referring to FIG. 8D, electronic devices 826 and 827 and the electrical connections 8320 may be disposed or mounted on a surface 822 of the sub-carrier 62, which is opposite to the surface 821.

Figure 8E:
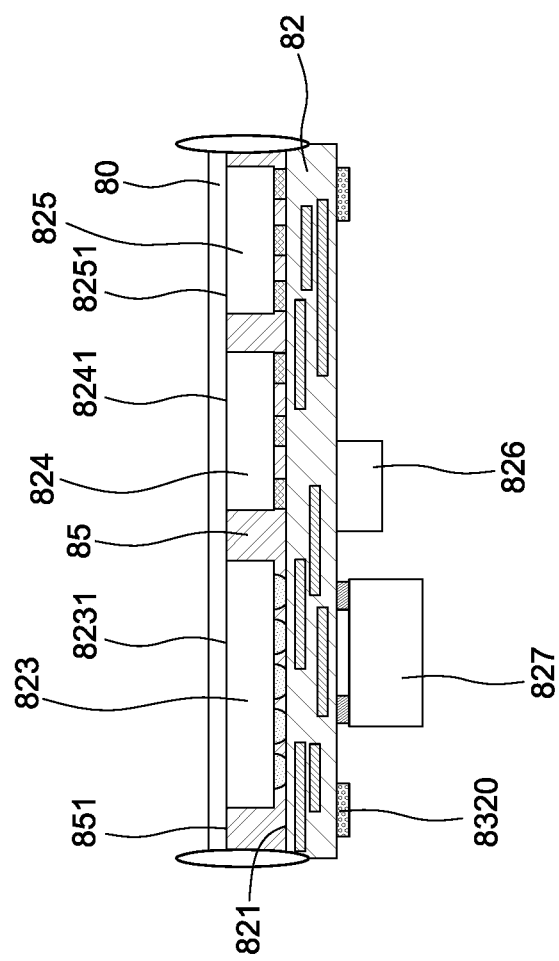

Referring to FIG. 8E, a singulation operation may be performed on the encapsulant 85 and the sub-carrier 82. The singulation operation may be performed by a tape saw and a tape 80 used for the tape saw may be disposed on the encapsulant 85. That is, the encapsulant 85 may be a support member and provides an upper surface such that the tape 80 used for singulation operation is mounted thereon.

Figure 8F:
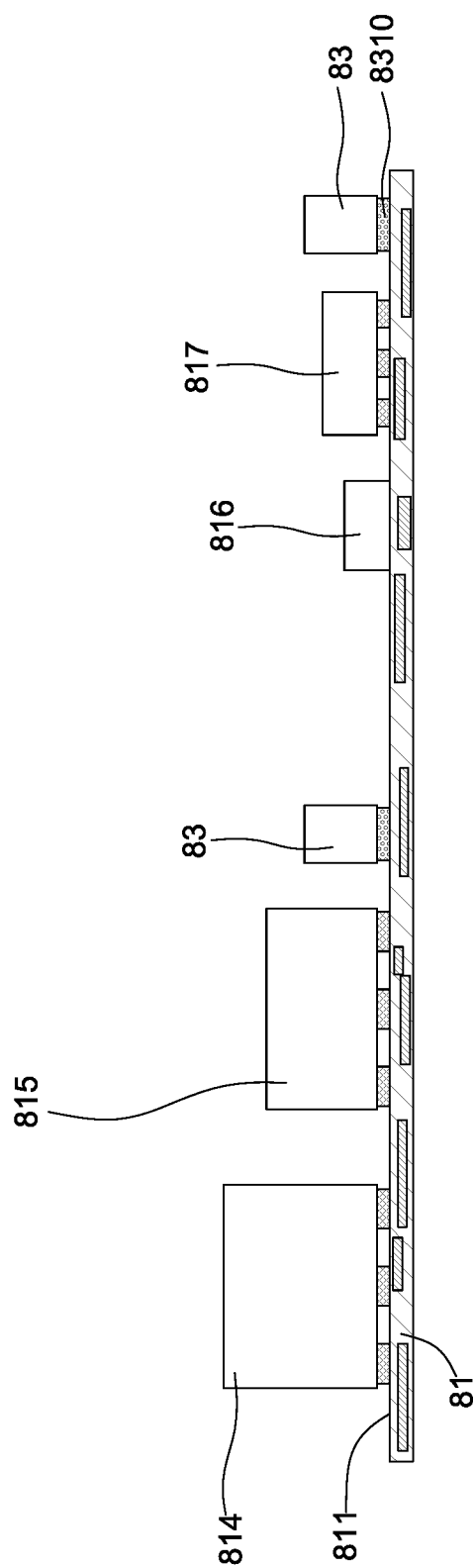

Referring to FIG. 8F, a main carrier 81, which may include a redistribution structure, is provided. Electronic devices 814, 815, 816 and 817 and interposers 83 may be disposed or mounted on a surface 811 of the main carrier 81. The interposer 83 may be electrically connected to the main carrier 81 via electrical connections 8310. In some embodiments of the present disclosure, the electronic component 814, 815, 816, 817 is a passive device. In some embodiments of the present disclosure, the electronic component 814, 815, 816, 817 is a ceramic-based device. In some embodiments of the present disclosure, the electronic component 814, 815 is a Power Management IC (PMIC). In some embodiments of the present disclosure, the electronic component 814, 815, 816, 817 is a capacitor. In some embodiments, a thickness of the electronic device 814, 815 is greater than a thickness of the electronic devices 816 and 817. In some embodiments of the present disclosure, the thickness of the electronic device 814, 815 is greater than a height of the interposer 83.

Figure 8G:
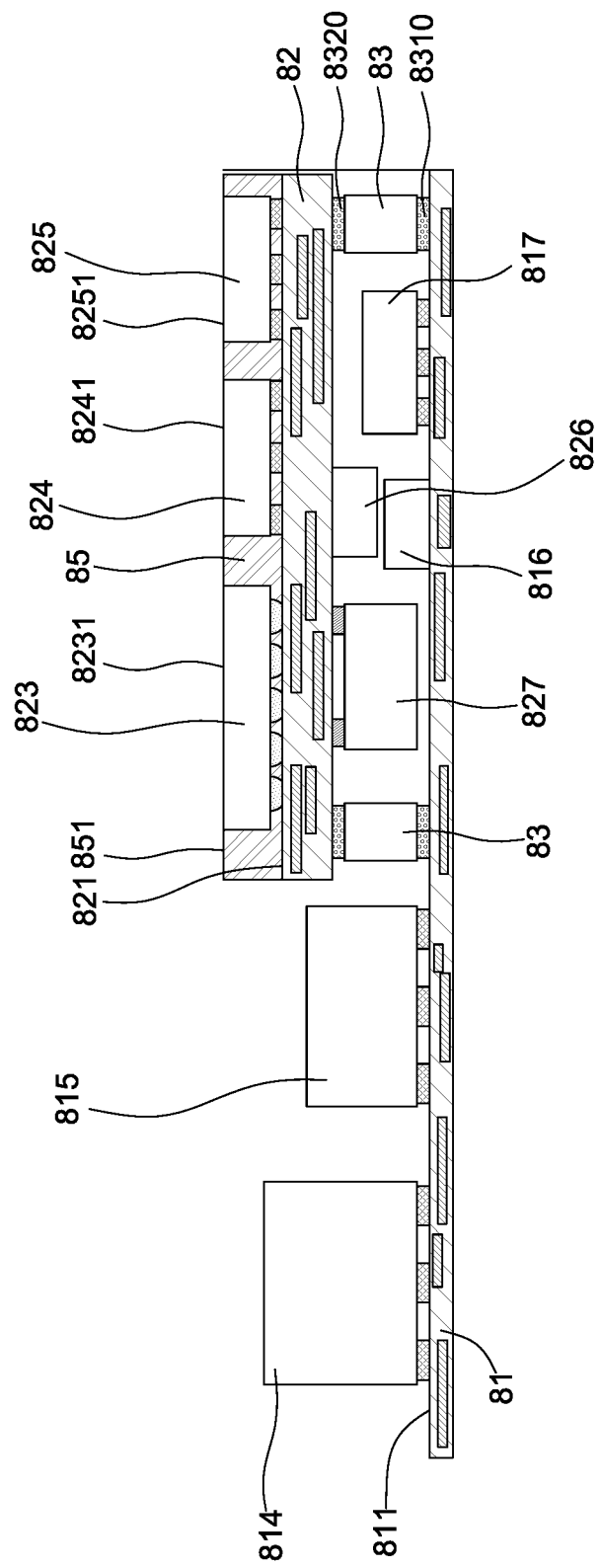

Referring to FIG. 8G, the sub-carrier 82 with the electronic devices 823, 824, 825, 826 and 827 and the encapsulant 85 is stacked on the interposers 83 such that the sub-carrier 82 is disposed over the main carrier 81. The electrical connections 8320 mounted on the surface 822 of the sub-carrier 82 is substantially aligned with the interposers 83 and connected to the interposers 83. As shown in FIG. 8G, a portion of the main carrier 81 may be covered by the sub-carrier 82. The electronic devices 816 and 817 may be disposed on the portion of the main carrier 81, which is covered by the sub-carrier 82, and thus may be disposed underneath the sub-carrier 82, and the electronic devices 814 and 815 may be disposed on another portion of the main carrier 81, which is not covered by the sub-carrier 82.

Figure 8H:
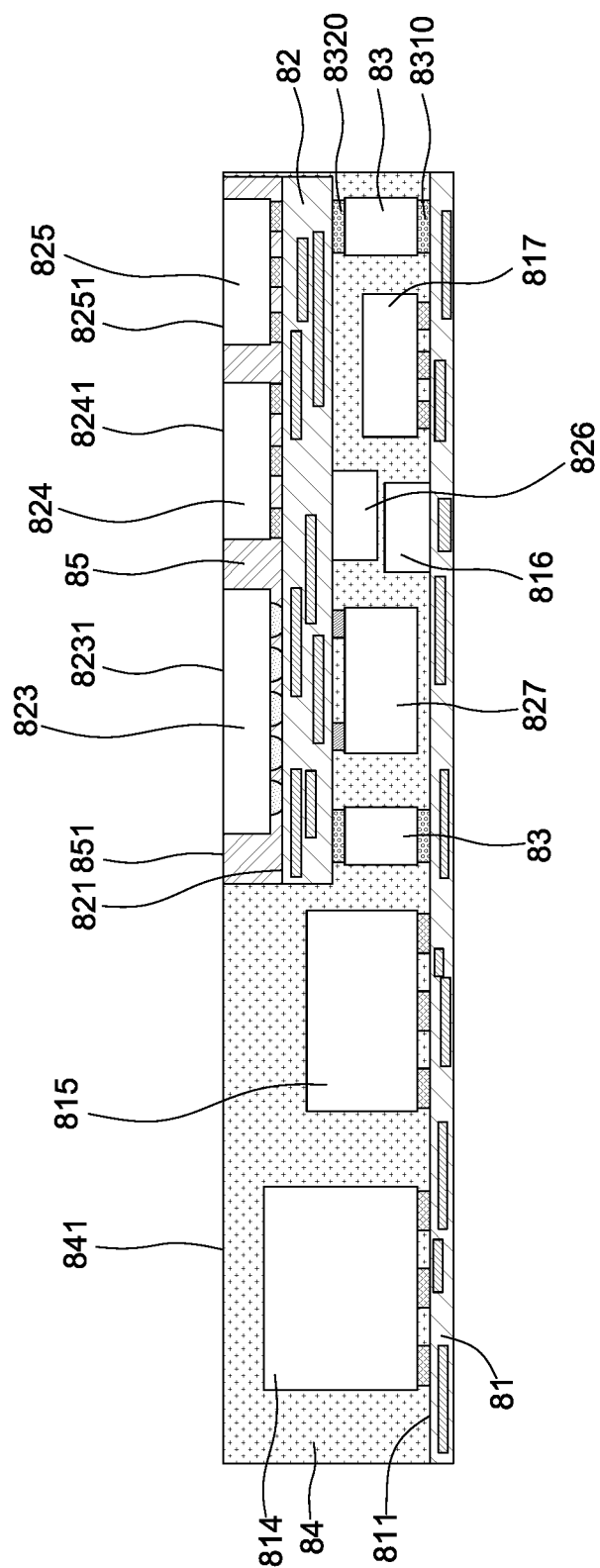

Referring to FIG. 8H, an encapsulant 84 may be formed on the surface 811 of the main carrier 81 by a exposed molding operation. The encapsulant 84 is configured to cover the surface 811 of the main carrier 81, the electronic devices 814, 815, 816, 817, 826 and 827, the interposers 83, the sub-carrier 82 and the encapsulant 85. Since the encapsulant 84 is formed by the exposed molding operation, an upper surface 841 of the encapsulant 84 may be recessed with respect to the surface 851 of the encapsulant 85.

Figure 8I:
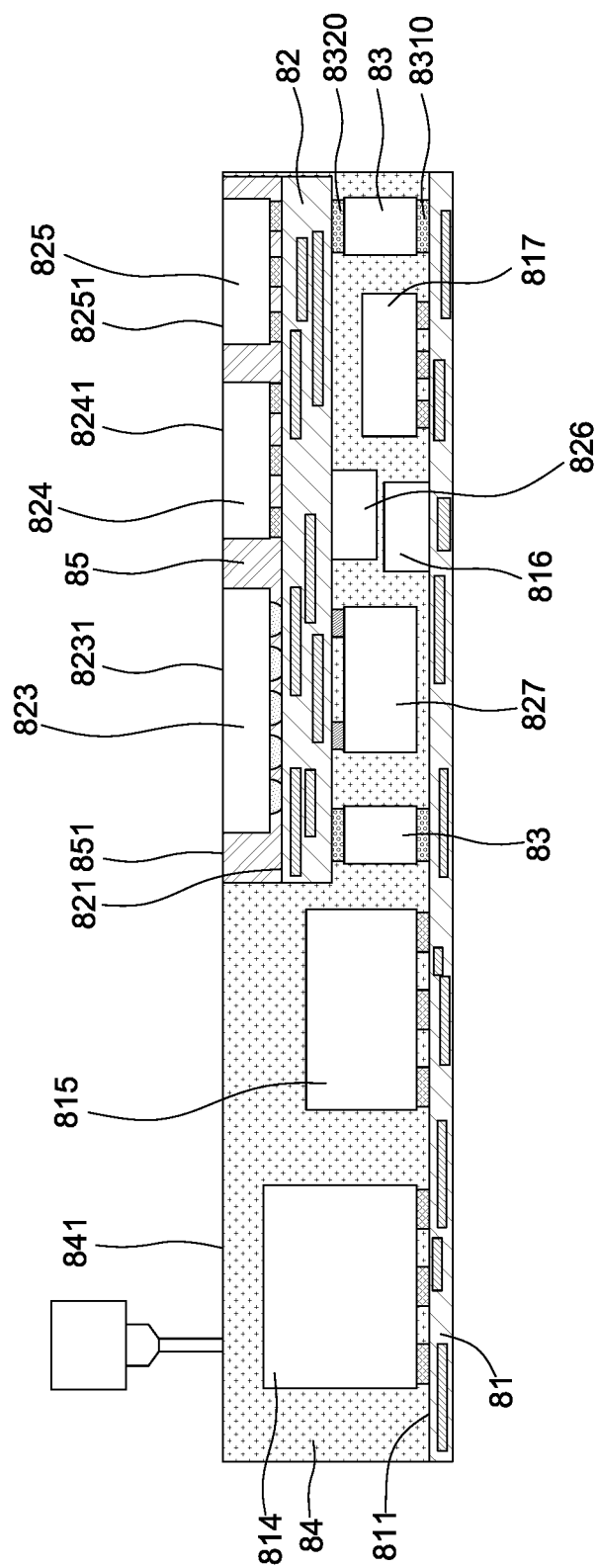

Referring to FIG. 8I, a laser marking process is performed.

Figure 8J:
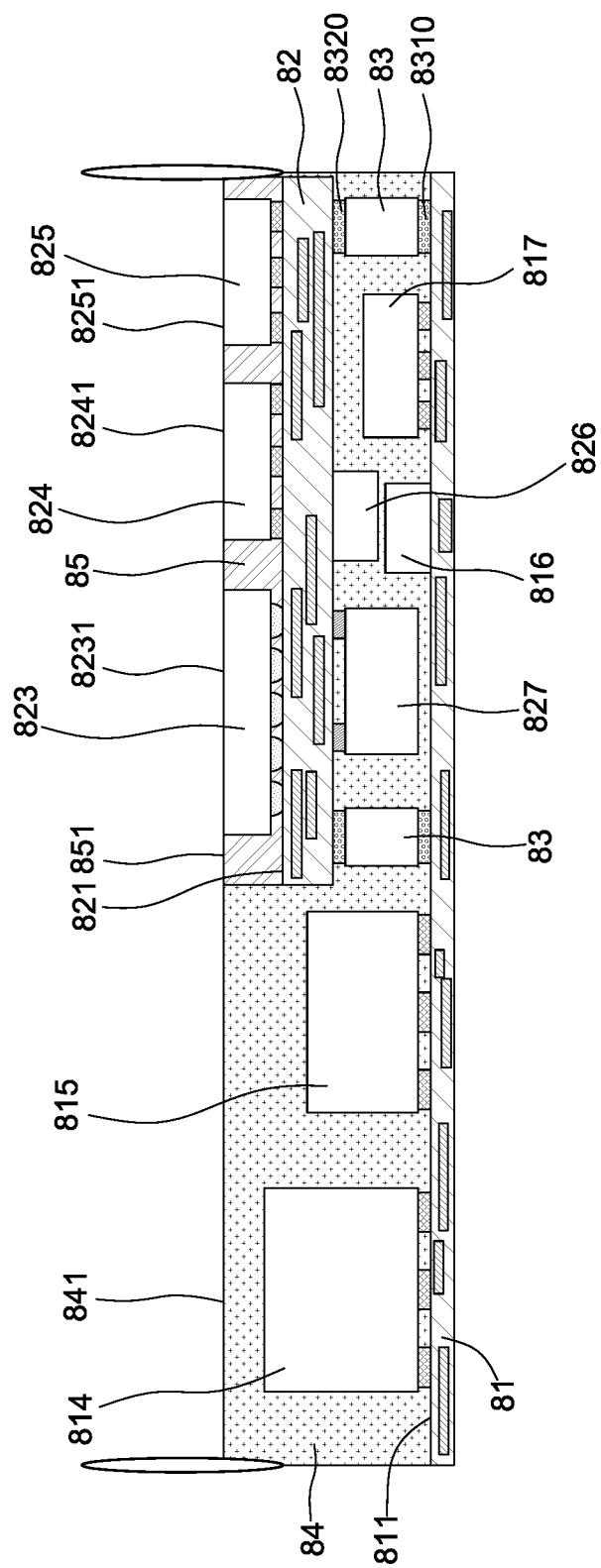

Referring to FIG. 8J, a singulation operation is performed on the encapsulant 84 and the main carrier 81.

Figure 8K:
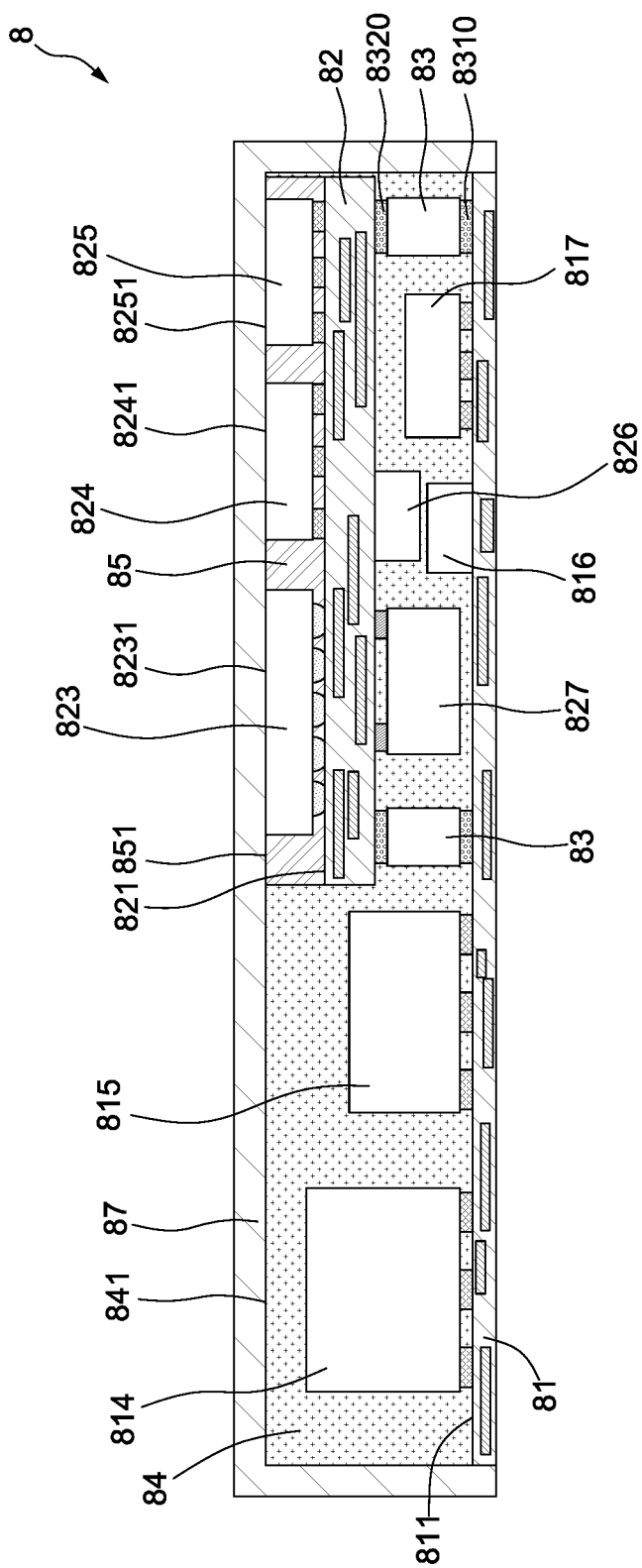

Referring to FIG. 8K, a shielding layer 87 is formed. The shielding layer 87 is configured to cover the encapsulants 84, 85, the main carrier 81 and the sub-carrier 82.

After the manufacturing process as shown in FIG. 8A, FIG. 8B, FIG. 8C, FIG. 8D, FIG. 8E, FIG. 8F, FIG. 8G, FIG. 8H, FIG. 8I, FIG. 8J and FIG. 8K, the semiconductor device package 8 is formed (see FIG. 8K). In some embodiments of the present disclosure, the semiconductor device package 8 is the same as, or similar to, the semiconductor device package 1 shown in FIG. 1A.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device, comprising:
   a first substrate,
   a second substrate disposed over the first substrate and having a first surface facing away from the first substrate and a second surface facing the first substrate,
   a first component disposed on the first surface of the second substrate;
   a second component disposed on the second surface of the second substrate; and
   a support member covering the first component;
   wherein the support member is configured to be attached to a tape so that a divided operation on the second substrate can be performed;
   wherein a third component is disposed on the first substrate and underneath the second substrate;
   wherein a portion of the first substrate is free from being covered by the second substrate;
   wherein a fourth component is disposed on the portion of the first substrate;
   wherein a first package body is disposed on the first substrate and cover the third component and the fourth component.

2. The electronic device of claim 1, further comprising an interposer electrically connecting the first substrate to the second substrate.

3. The electronic device of claim 1, wherein the first package body has a surface facing away from the first substrate, and wherein the support member is exposed from the surface of the first package body.

4. The electronic device of claim 1, wherein the support member has a surface facing away from the second substrate, and wherein the first component is exposed from the surface of the support member.

5. The electronic device of claim 1, wherein the support member has a side surface and the first package body has a side surface, and wherein the side surface of the support member is spaced apart from the side surface of the first package body.

6. The electronic device of claim 1, wherein the first substrate has a first surface facing the second substrate and a second surface opposite to the first surface of the first substrate, and
   wherein a fifth component is disposed on the second surface of the first substrate and a second package body is disposed on the second surface of the first substrate and covers the fifth component.

7. An electronic device, comprising:
   a first substrate,
   a second substrate disposed over the first substrate and having a first surface facing away from the first substrate, a second surface facing the first substrate and a side surface between the first surface and the second surface,
   a first component disposed on the first surface of the second substrate;
   a second component disposed on the second surface of the second substrate
   a third component disposed on the first substrate and under the second substrate; and
   a first package body covering the first component and having a lateral surface substantially coplanar with the side surface of the second substrate;
   wherein a portion of the first substrate is free from being covered by the second substrate
   wherein a fourth component is disposed on the portion of the first substrate;
   wherein a second package body is disposed on the portion of the first substrate and covers the third component and the fourth component.

8. An electronic device, comprising:
   a first substrate,
   a second substrate disposed over the first substrate and having a first surface facing away from the first substrate, a second surface facing the first substrate and a side surface between the first surface and the second surface,
   a first component disposed on the first surface of the second substrate;
   a second component disposed on the second surface of the second substrate
   a third component disposed on the first substrate and under the second substrate;
   a first package body covering the first component and having a lateral surface substantially coplanar with the side surface of the second substrate; wherein a portion of the first substrate is free from being covered by the second substrate;

a third substrate disposed under the first substrate and having a first surface facing away from the first substrate;

a fifth component disposed on the first surface of the third substrate; and a third package body disposed on the first surface of the third substrate and covering the fifth component;

wherein the third package body has a surface facing away from the third substrate and the fifth component is exposed from the surface of the third package body.

* * * * *